United States Patent
Chen et al.

(10) Patent No.: US 11,081,631 B2
(45) Date of Patent: Aug. 3, 2021

(54) ASYMMETRICALLY SHAPED LIGHT-EMITTING DEVICE, BACKLIGHT MODULE USING THE SAME, AND METHOD FOR MANUFACTURING THE SAME

(71) Applicant: Maven Optronics Co., Ltd., Hsinchu County (TW)

(72) Inventors: Chieh Chen, Palo Alto, CA (US); Chia-Hsien Chang, New Taipei (TW)

(73) Assignee: Maven Optronics Co., LTD., Hsinchu County (TW)

( * ) Notice: Subject to any disclaimer, the term of this patent is extended or adjusted under 35 U.S.C. 154(b) by 0 days.

(21) Appl. No.: 16/921,748

(22) Filed: Jul. 6, 2020

(65) Prior Publication Data
US 2020/0335678 A1 Oct. 22, 2020

Related U.S. Application Data

(62) Division of application No. 16/040,492, filed on Jul. 19, 2018, now Pat. No. 10,749,086.

(30) Foreign Application Priority Data

Jul. 21, 2017 (CN) .......................... 201710601827.1
Jul. 21, 2017 (TW) ................................ 10612454.2

(51) Int. Cl.
*H01L 33/60* (2010.01)
*G02F 1/13357* (2006.01)
(Continued)

(52) U.S. Cl.
CPC ........ *H01L 33/60* (2013.01); *G02F 1/133603* (2013.01); *H01L 33/10* (2013.01);
(Continued)

(58) Field of Classification Search
CPC .......... H01L 33/60; H01L 33/10; H01L 33/46; H01L 33/50; H01L 33/505; H01L 33/508; H01L 33/52; H01L 33/54
See application file for complete search history.

(56) References Cited

U.S. PATENT DOCUMENTS 4,125,777 A 11/1978 O'Brien et al.
6,627,922 B1 9/2003 Ishinaga
(Continued)

FOREIGN PATENT DOCUMENTS

JP 2013-140894 A 7/2013
JP 2014-143246 A 8/2014
(Continued)

OTHER PUBLICATIONS

Extended European Search Report for corresponding EP Application No. 18184426.7, dated Feb. 12, 2019, 9 pages.
(Continued)

*Primary Examiner* — Scott B Geyer
(74) *Attorney, Agent, or Firm* — Foley & Lardner LLP

(57) ABSTRACT

An asymmetrically shaped chip-scale packaging (CSP) light-emitting device (LED) includes an LED chip, a photoluminescent structure (or a light-transmitting structure), and a reflective structure. The photoluminescent structure covers the upper surface and/or the edge surface of the LED chip; and the reflective structure at least partially covers the edge surface of the photoluminescent structure. The reflective structure partially reflects the primary light emitted from the edge surface of the LED chip or the converted secondary light radiated from the edge surface of the photoluminescent structure, therefore shaping the radiation pattern asymmetrically.

23 Claims, 60 Drawing Sheets

(51) Int. Cl.
*H01L 33/10* (2010.01)
*H01L 33/36* (2010.01)
*H01L 33/58* (2010.01)
*H01L 33/46* (2010.01)
*H01L 33/50* (2010.01)
*H01L 33/54* (2010.01)

(52) U.S. Cl.
CPC .............. *H01L 33/36* (2013.01); *H01L 33/46* (2013.01); *H01L 33/58* (2013.01); *H01L 33/508* (2013.01); *H01L 33/54* (2013.01); *H01L 2933/0025* (2013.01); *H01L 2933/0058* (2013.01)

(56) References Cited

U.S. PATENT DOCUMENTS

| | | | |
|---|---|---|---|
| 7,441,938 B2 | 10/2008 | Sakai et al. | |
| 8,061,884 B2 | 11/2011 | Harbers et al. | |
| 8,552,444 B2 | 10/2013 | Ide et al. | |
| 9,470,839 B2 | 10/2016 | Ye et al. | |
| 10,211,379 B2 | 2/2019 | Ichikawa | |
| 2002/0123163 A1 | 9/2002 | Fujii | |
| 2005/0167682 A1* | 8/2005 | Fukasawa | H01L 33/60 257/79 |
| 2006/0208269 A1 | 9/2006 | Kim et al. | |
| 2007/0274096 A1 | 11/2007 | Chew et al. | |
| 2010/0258831 A1 | 10/2010 | Jagt et al. | |
| 2011/0069256 A1 | 3/2011 | Ohkubo | |
| 2014/0025607 A1 | 1/2014 | Wang et al. | |
| 2014/0143246 A1 | 5/2014 | Wen et al. | |
| 2014/0160790 A1 | 6/2014 | Park | |
| 2014/0256071 A1 | 9/2014 | Park et al. | |
| 2015/0085527 A1* | 3/2015 | Nam | H01L 33/505 362/612 |
| 2015/0124479 A1 | 5/2015 | Jung et al. | |
| 2015/0303356 A1 | 10/2015 | Sanga et al. | |
| 2015/0311405 A1* | 10/2015 | Oyamada | H01L 33/60 257/98 |
| 2015/0340565 A1 | 11/2015 | Tsutsumi | |
| 2016/0163938 A1 | 6/2016 | Yu et al. | |
| 2016/0306101 A1 | 10/2016 | Lee | |
| 2017/0222107 A1* | 8/2017 | Chen | H01L 33/486 |
| 2017/0309793 A1* | 10/2017 | Seo | H01L 33/504 |
| 2018/0033928 A1* | 2/2018 | Chang | H01L 33/56 |
| 2019/0025650 A1* | 1/2019 | Chen | H01L 33/58 |

FOREIGN PATENT DOCUMENTS

| | | |
|---|---|---|
| JP | 2015-097235 A | 5/2015 |
| JP | 2017-092043 A | 5/2017 |
| KR | 10-2010-0077213 A | 7/2010 |
| KR | 10-2013-0007036 A | 1/2013 |
| KR | 10-2014-0133765 A | 11/2014 |
| KR | 10-2015-0044307 A | 4/2015 |
| KR | 10-2015-0145828 A | 12/2015 |
| KR | 10-2017-0002783 A | 1/2017 |
| KR | 10-2017-0048017 A | 5/2017 |
| TW | 2013-05685 A | 2/2013 |
| TW | 201329577 A | 7/2013 |
| WO | WO-2017/062119 A1 | 4/2017 |

OTHER PUBLICATIONS

Office Action for corresponding JP Application No. 2018-136401, dated Jul. 30, 2019, 6 pages (English Translation).
Office Action for corresponding KR Application No. 10-2018-0084023, dated Aug. 9, 2019, 10 pages (No English Translation).
Office Action with Search Report for corresponding TW Application No. 106124542, dated Aug. 10, 2018, 11 pages (No English Translation).

* cited by examiner

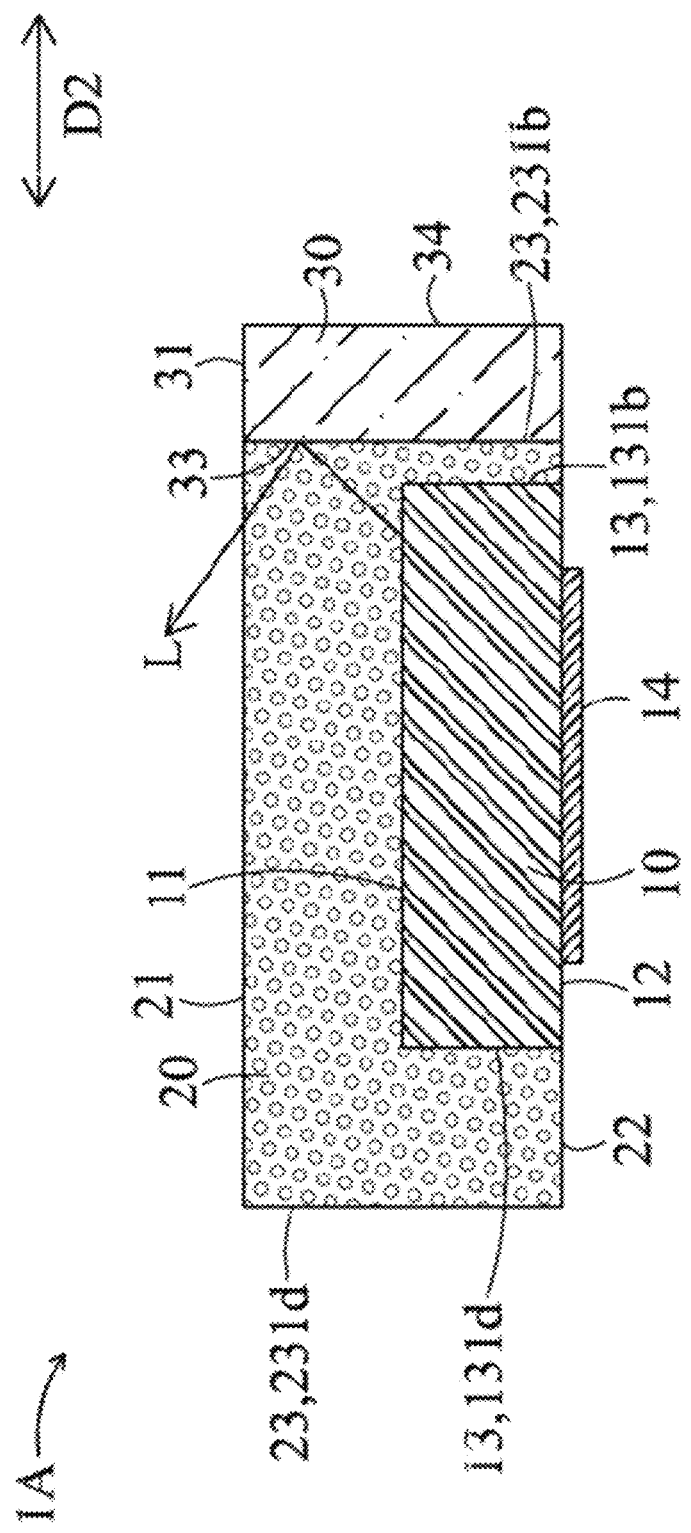

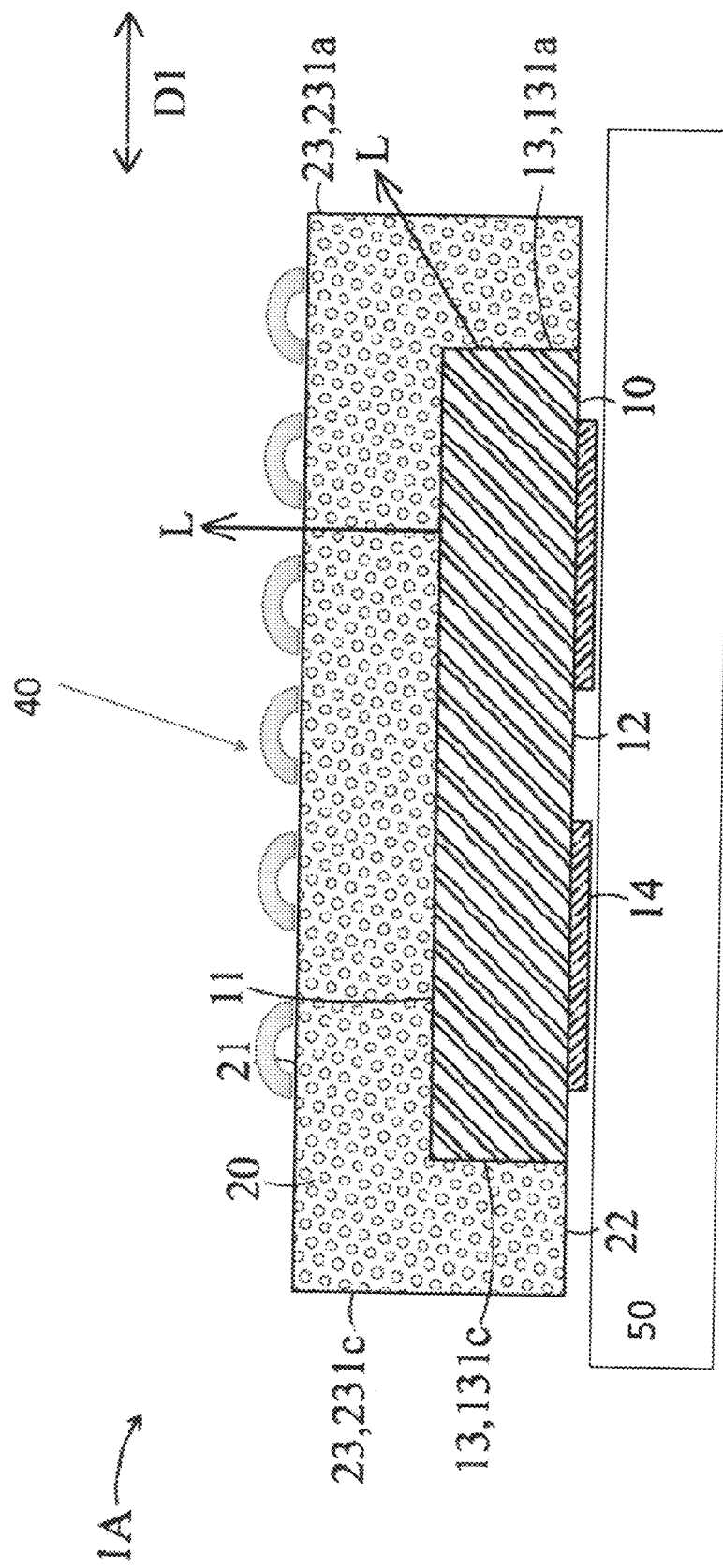

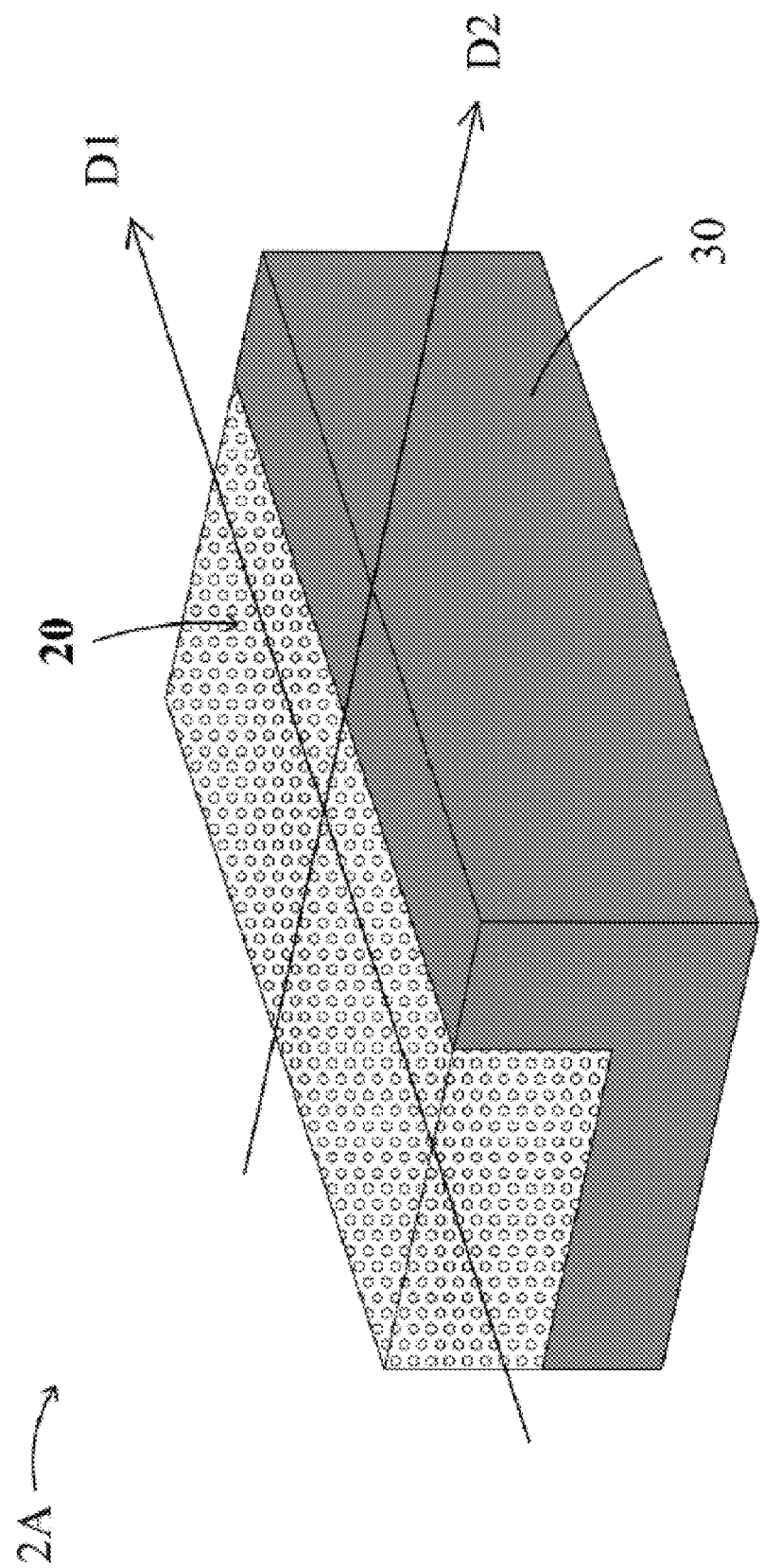

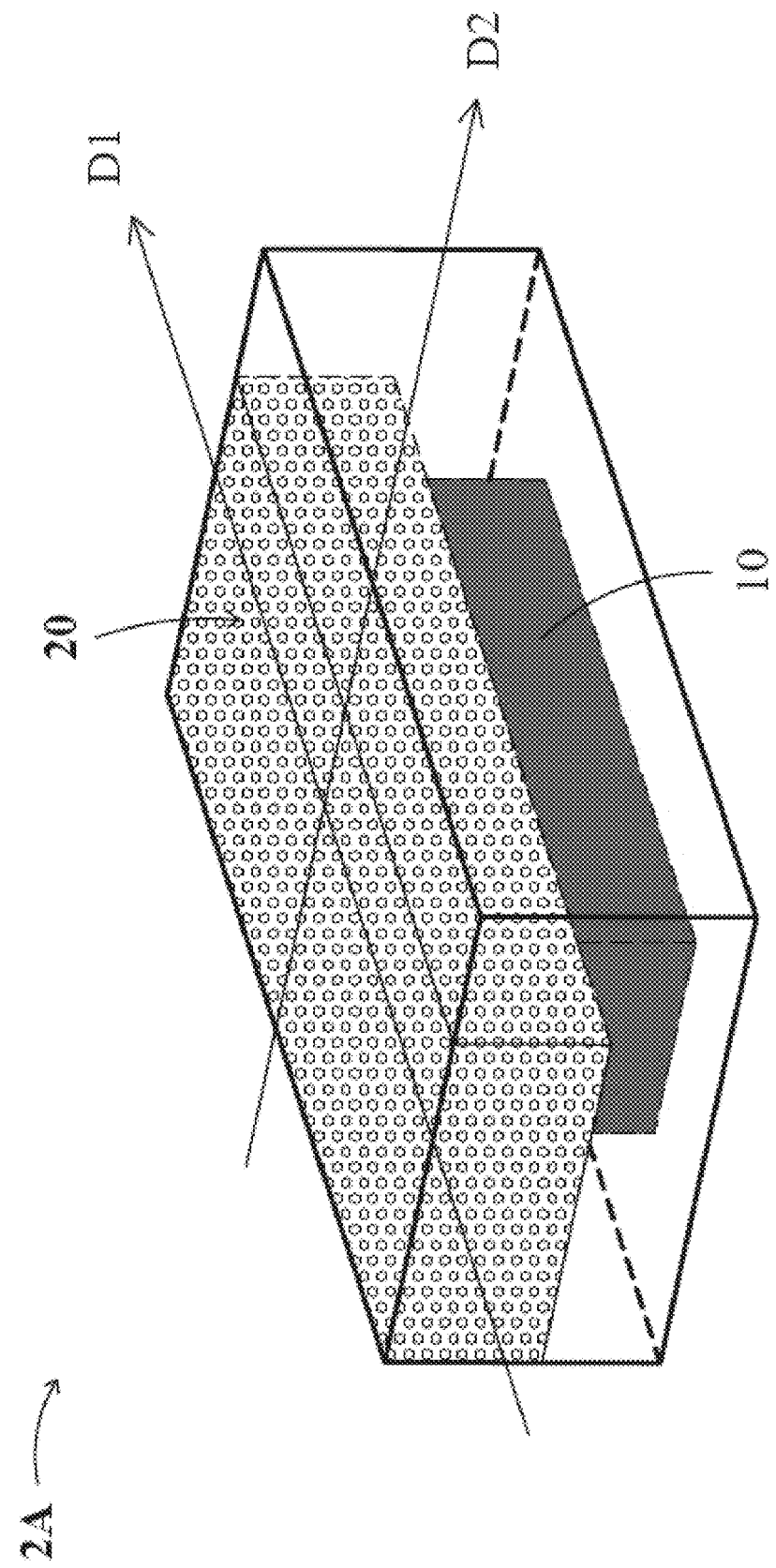

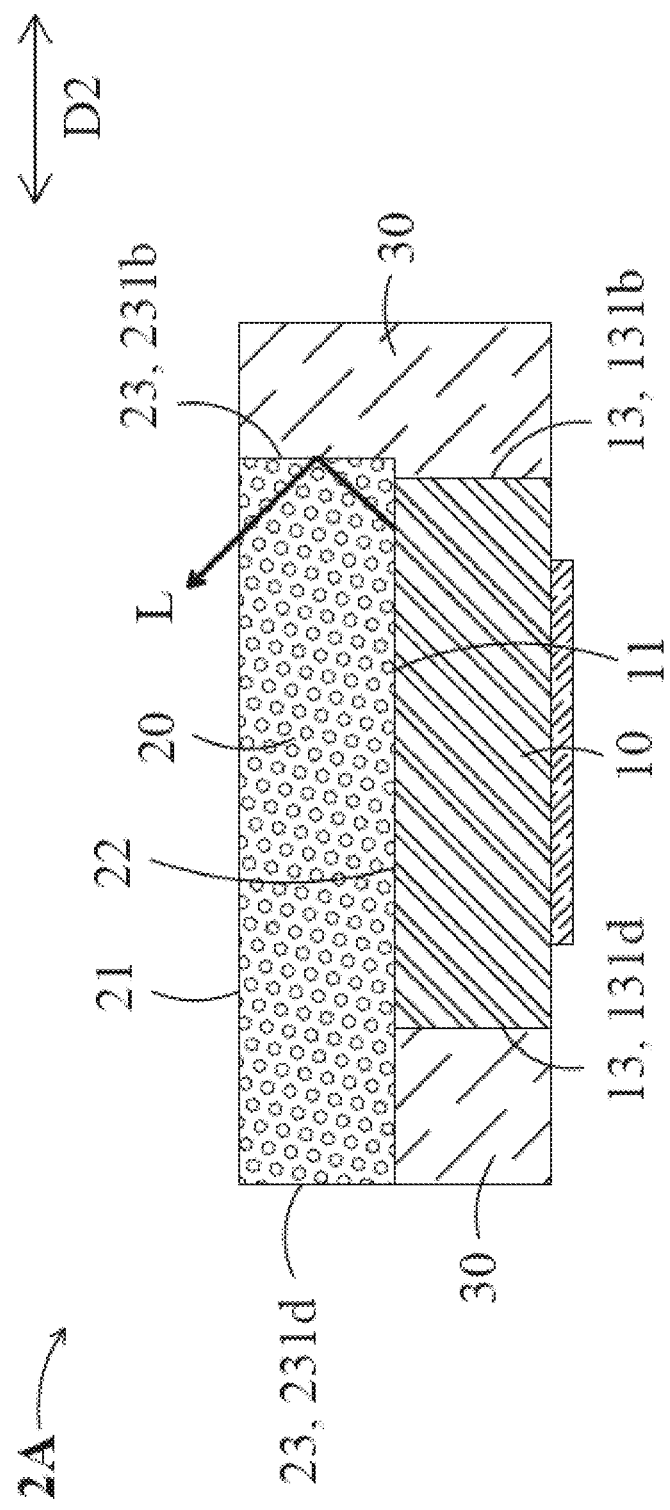

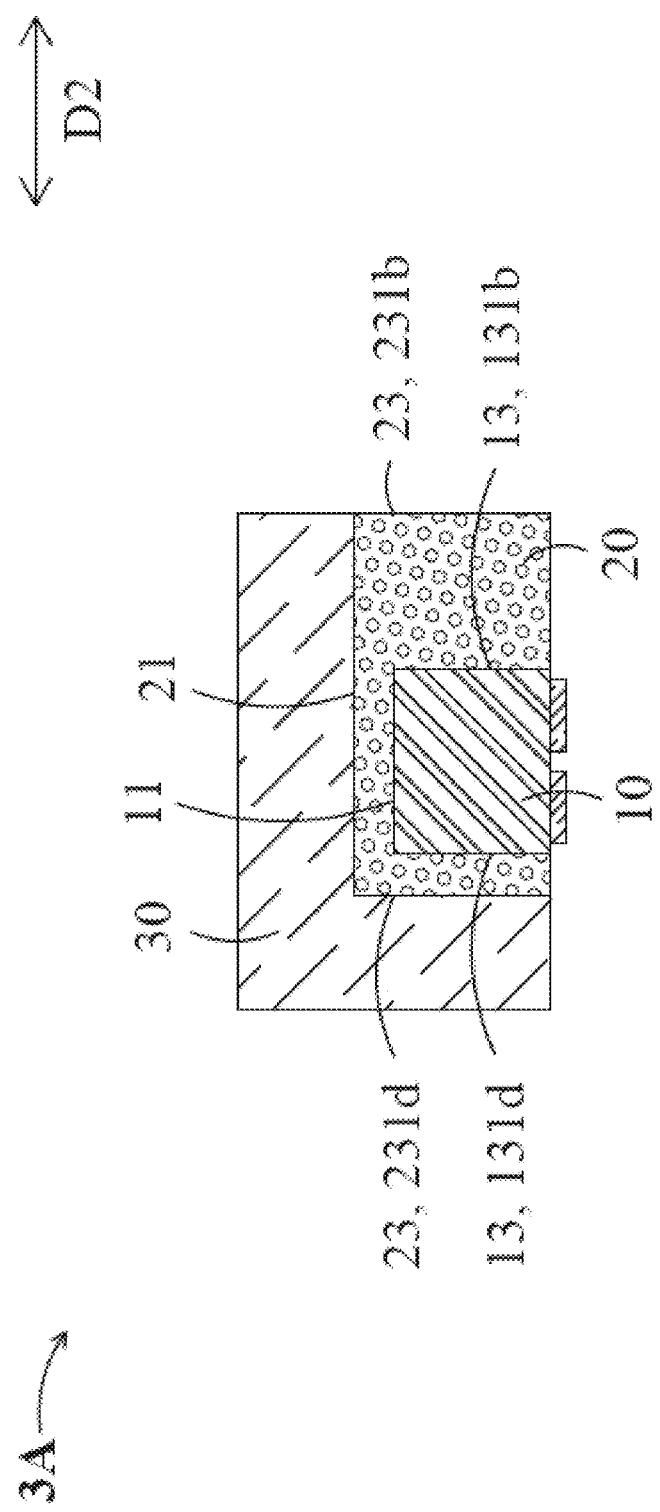

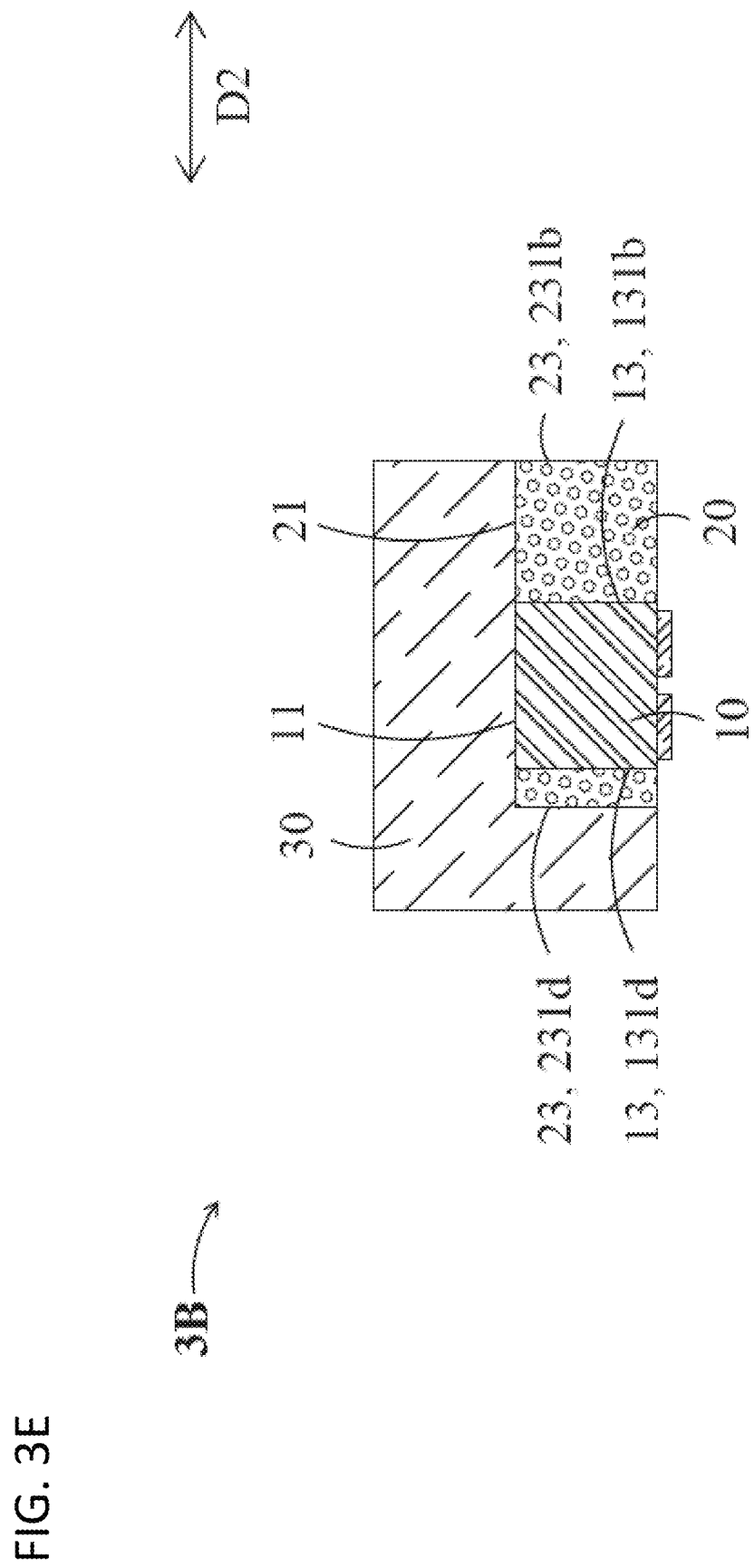

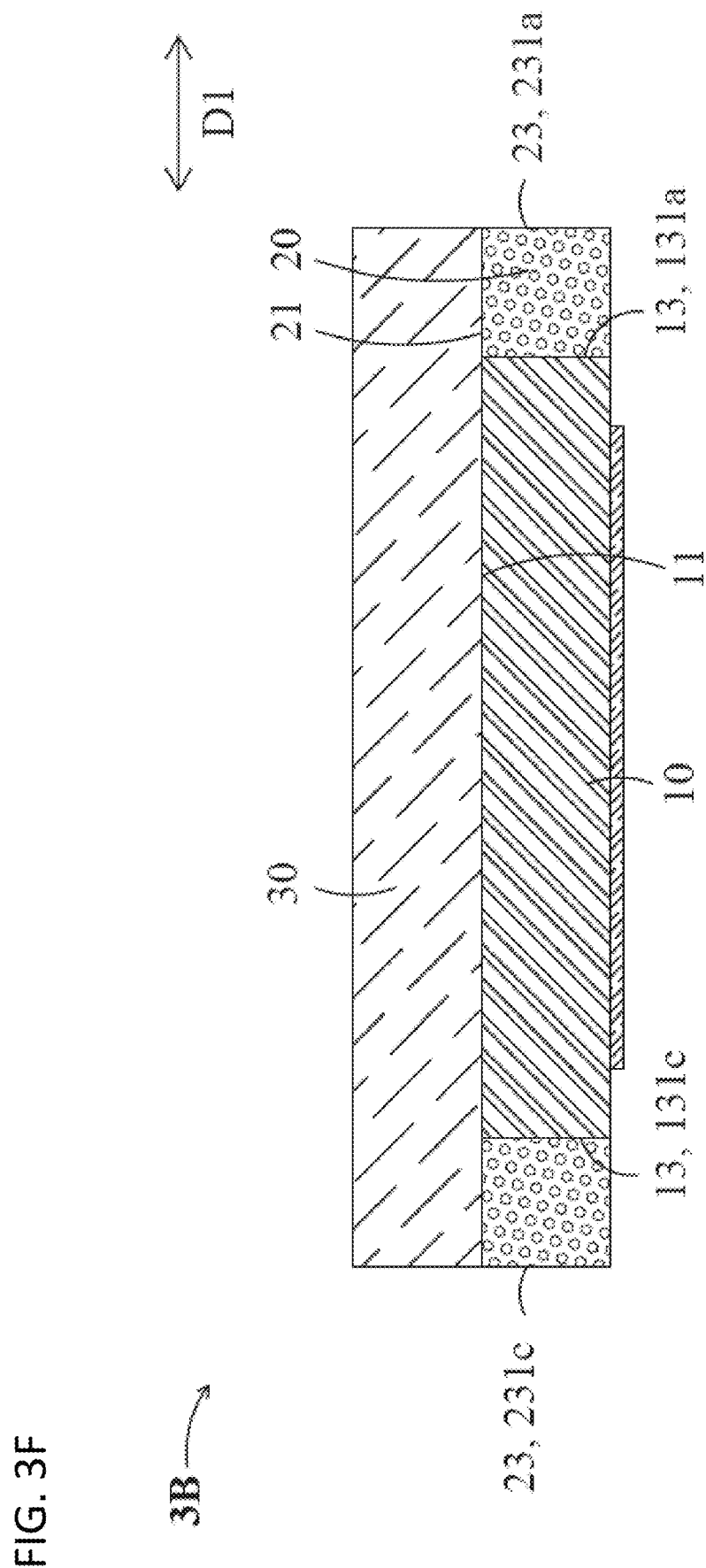

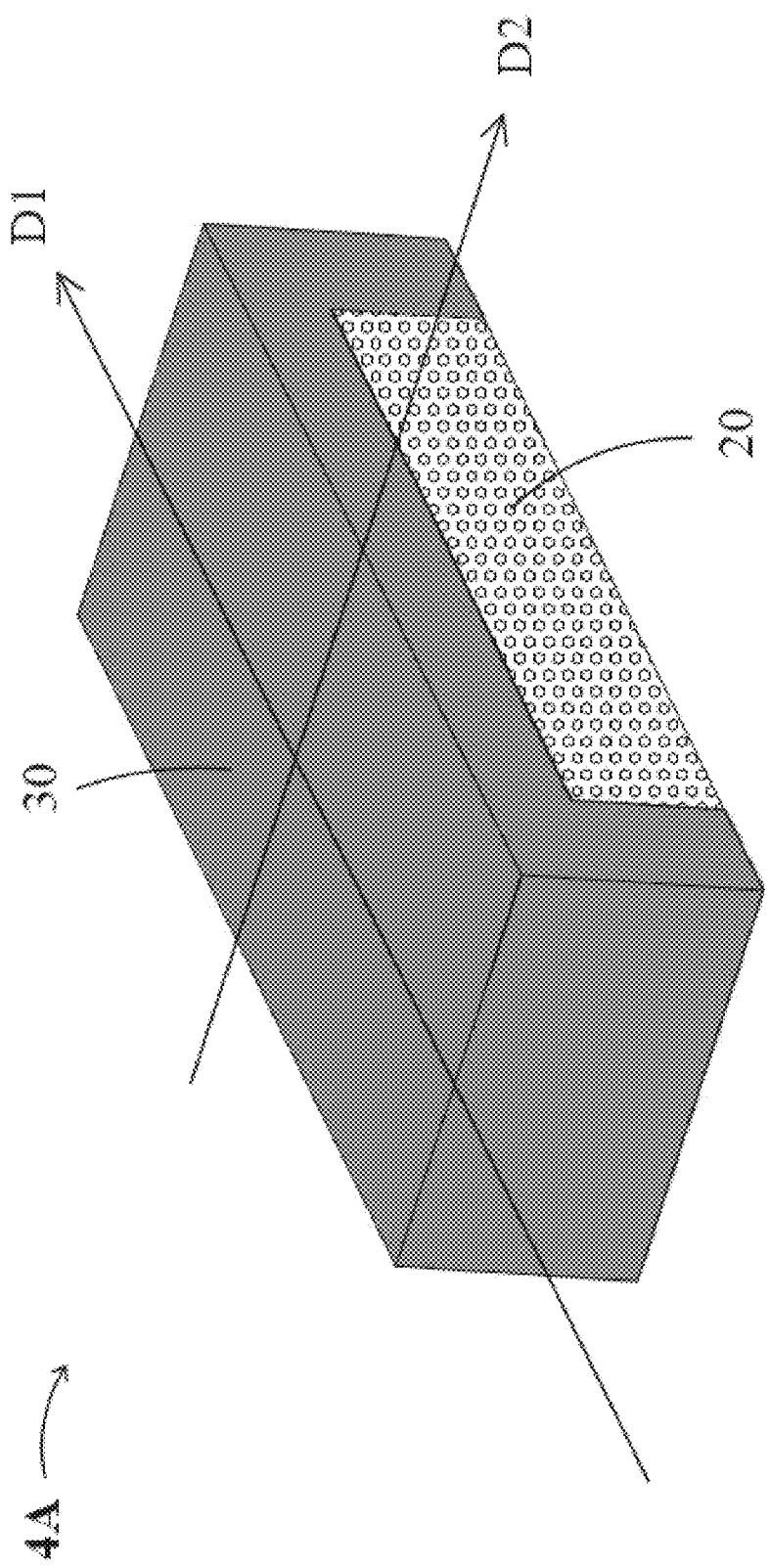

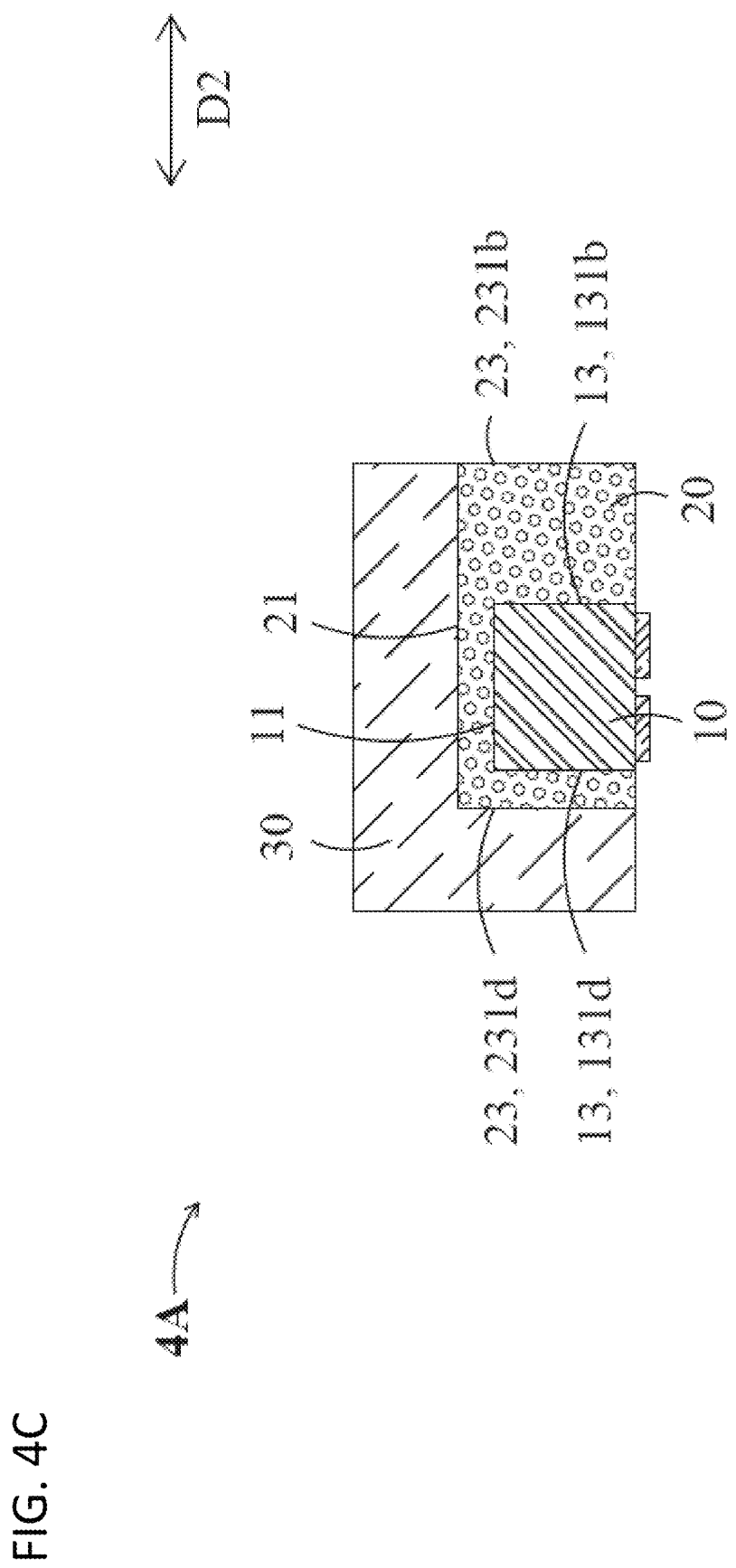

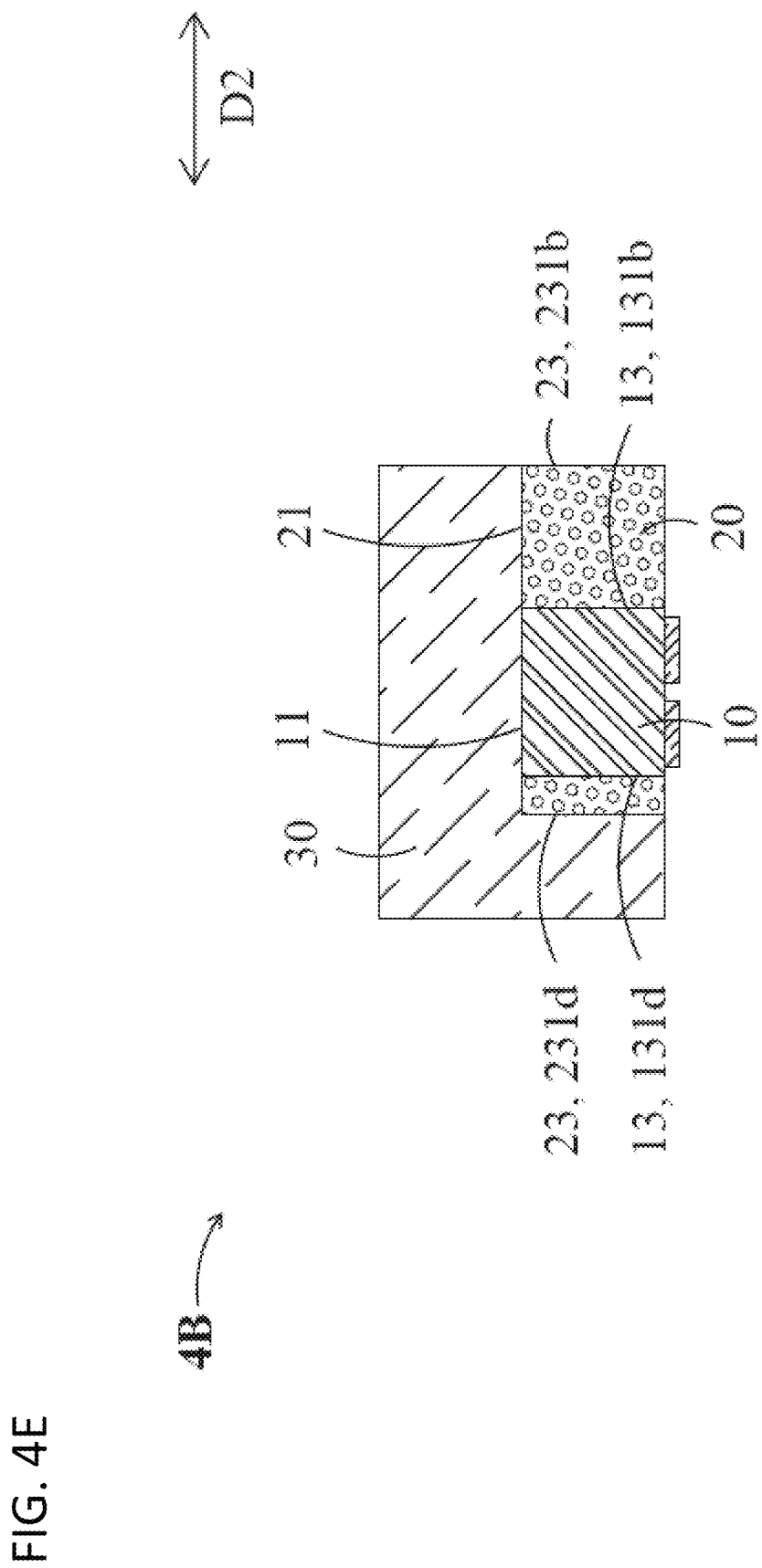

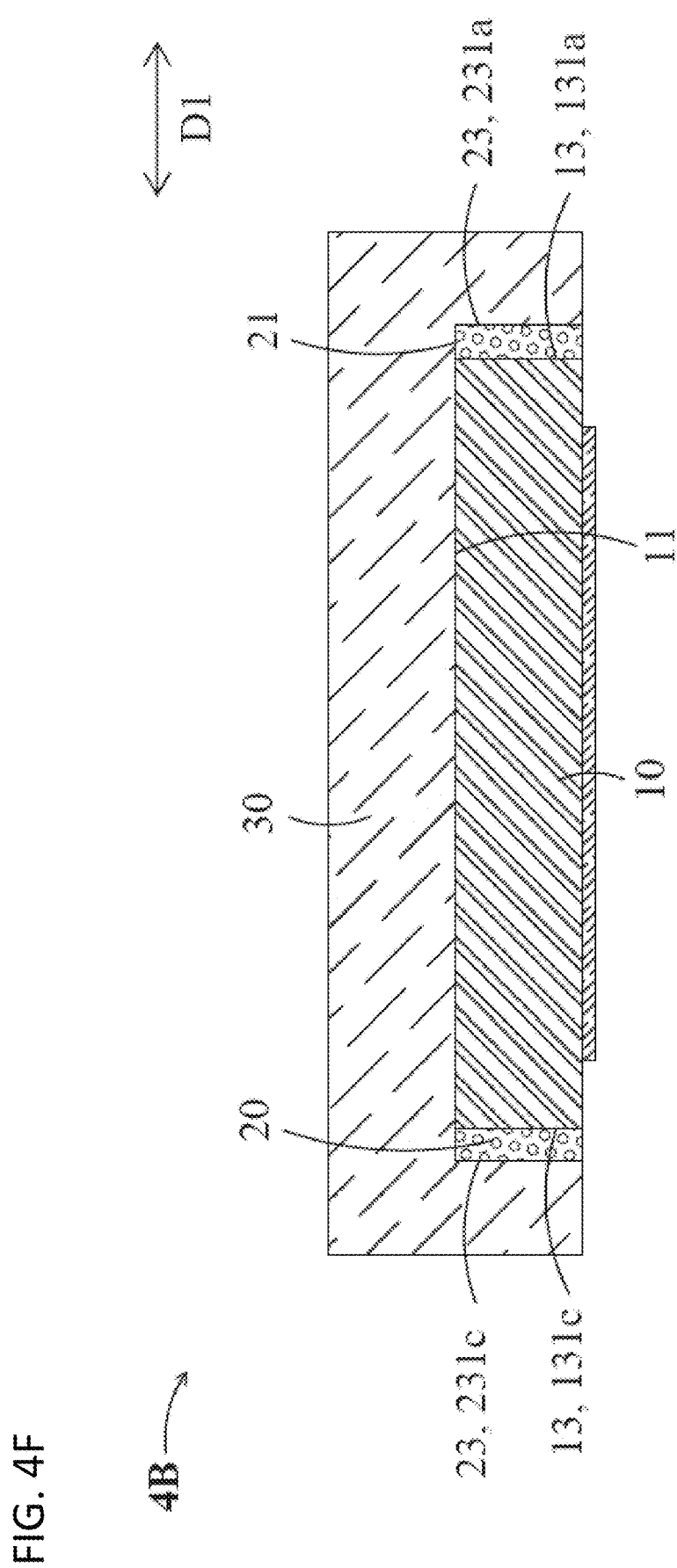

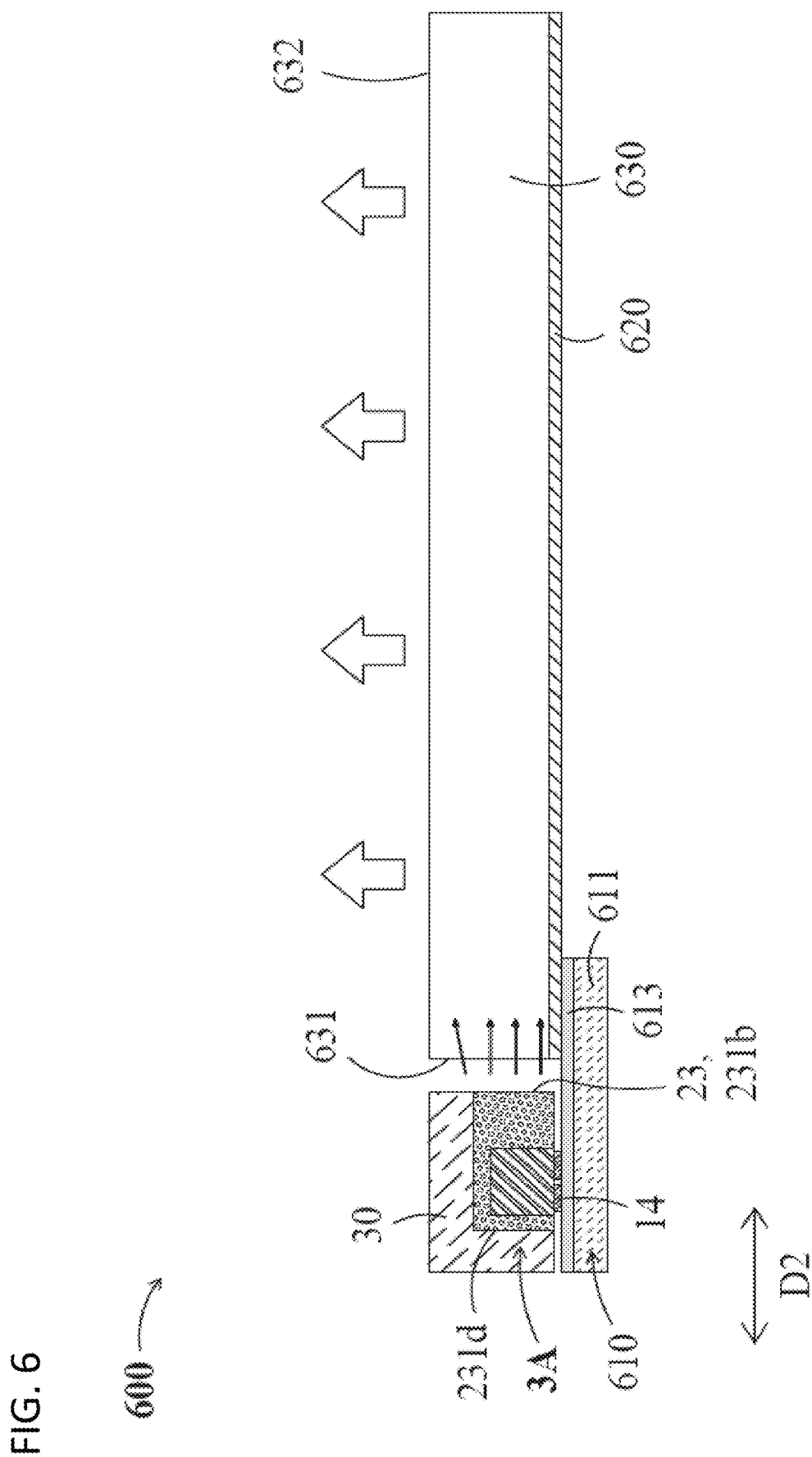

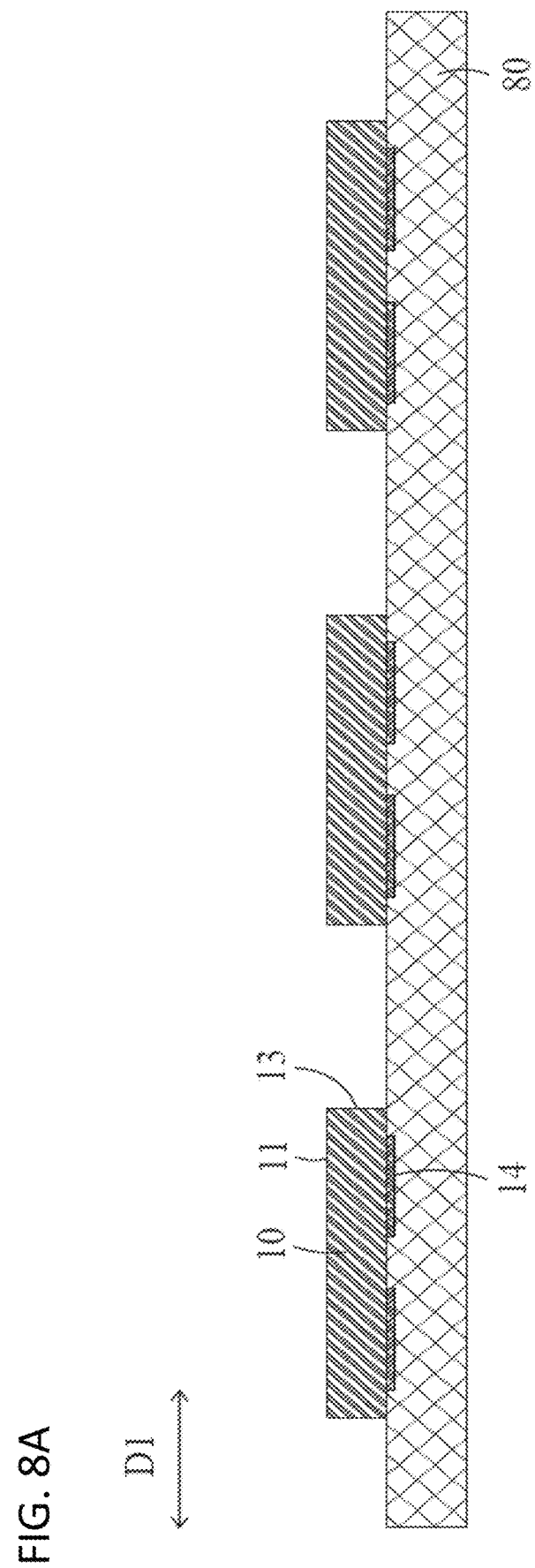

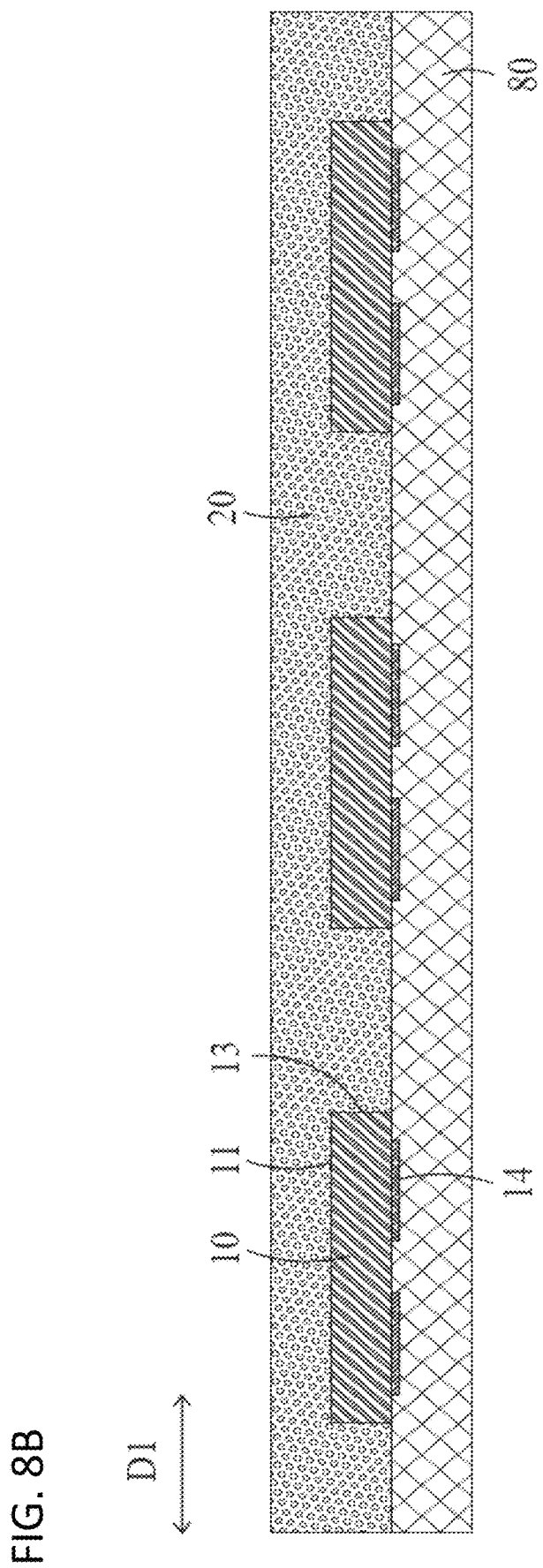

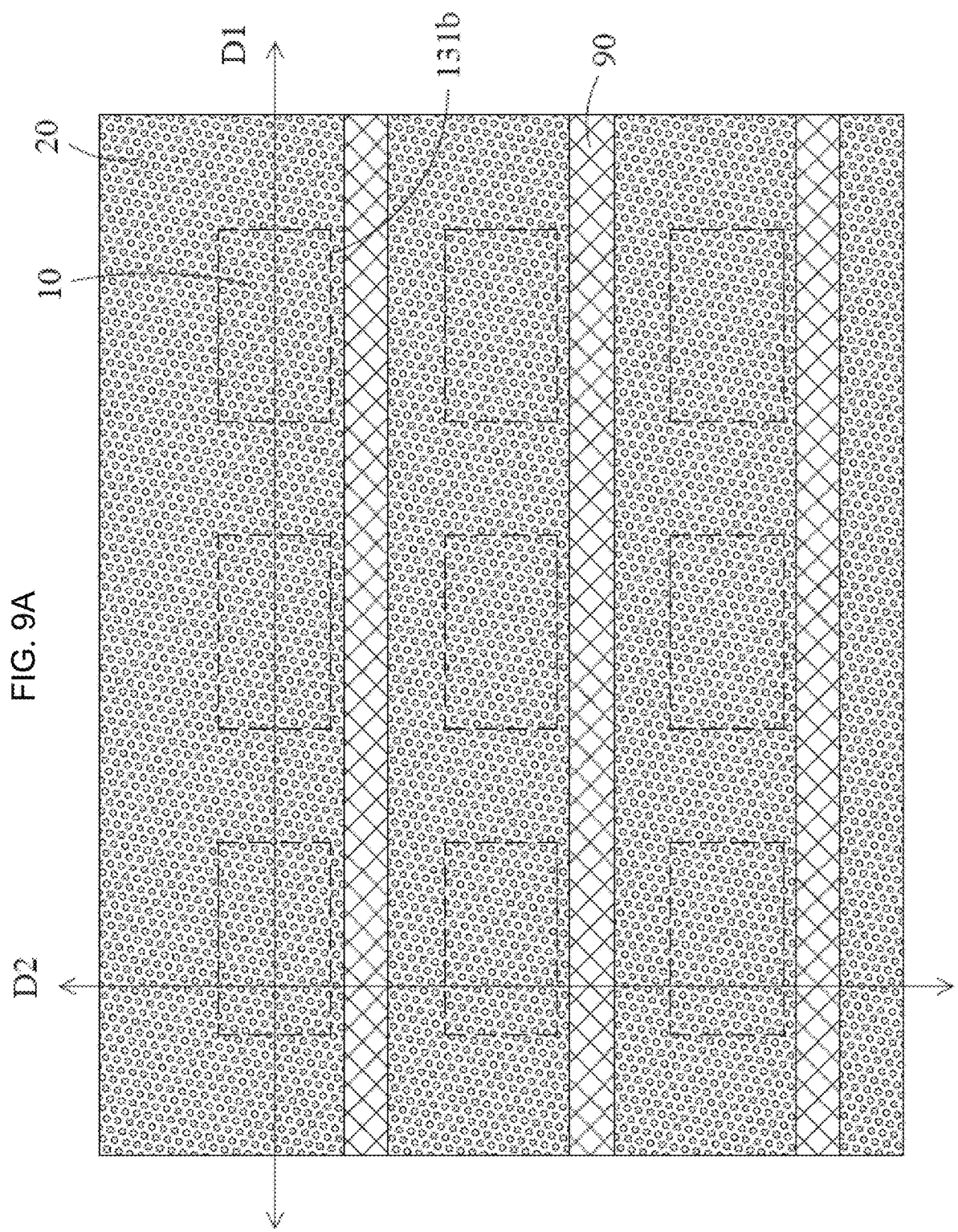

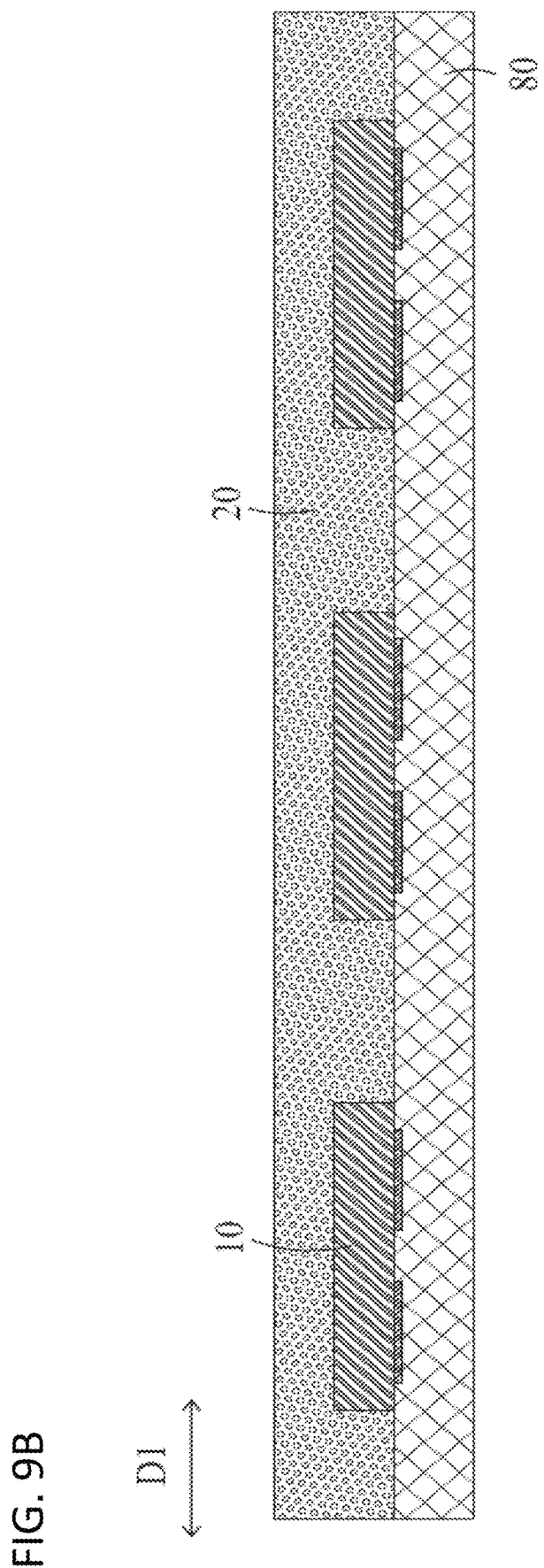

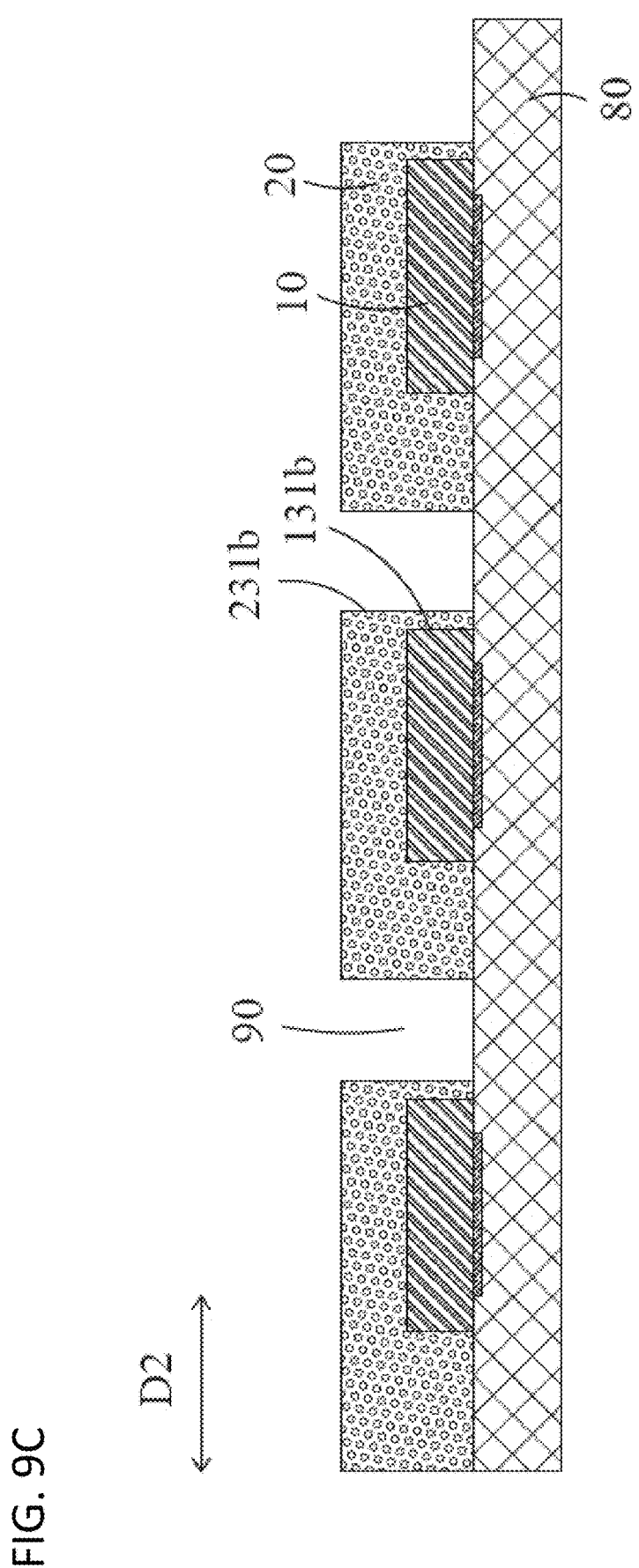

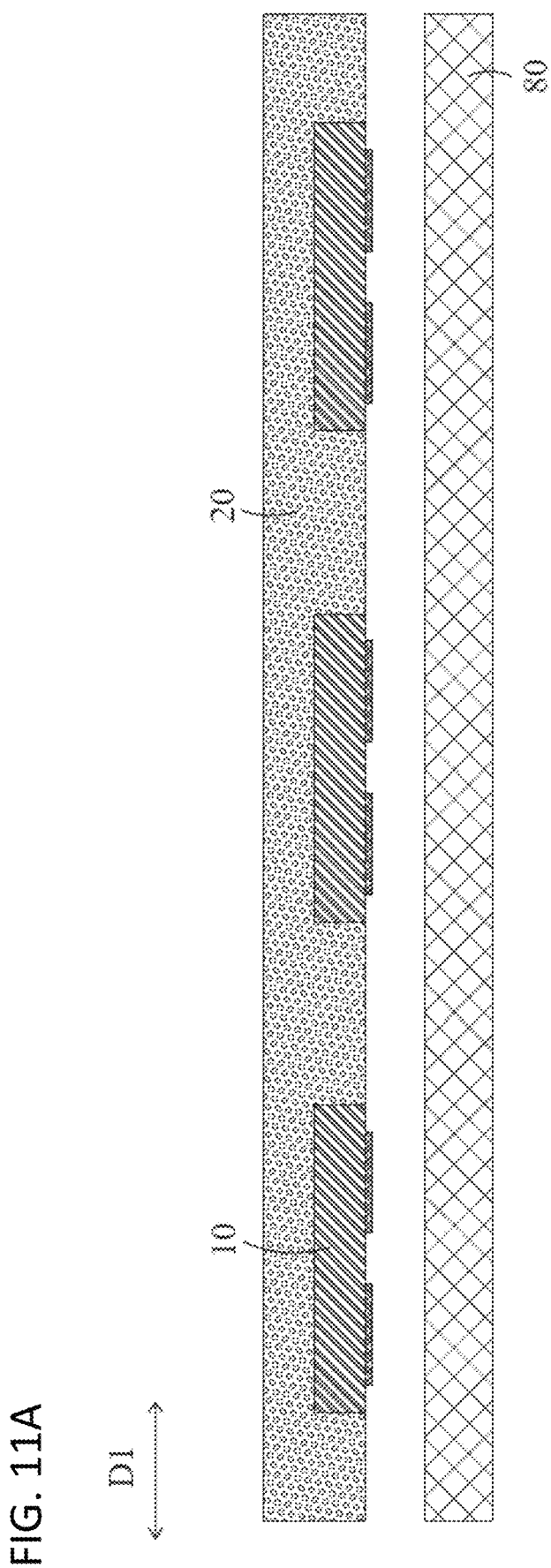

FIG. 12B
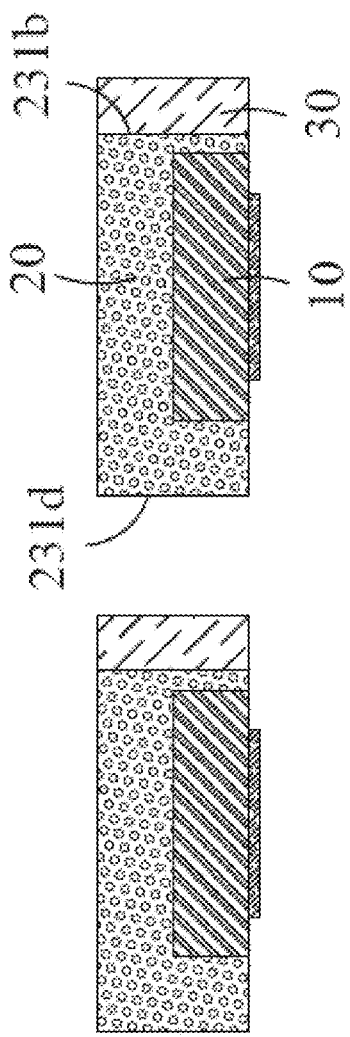
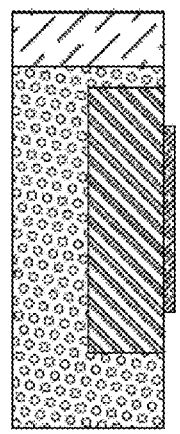

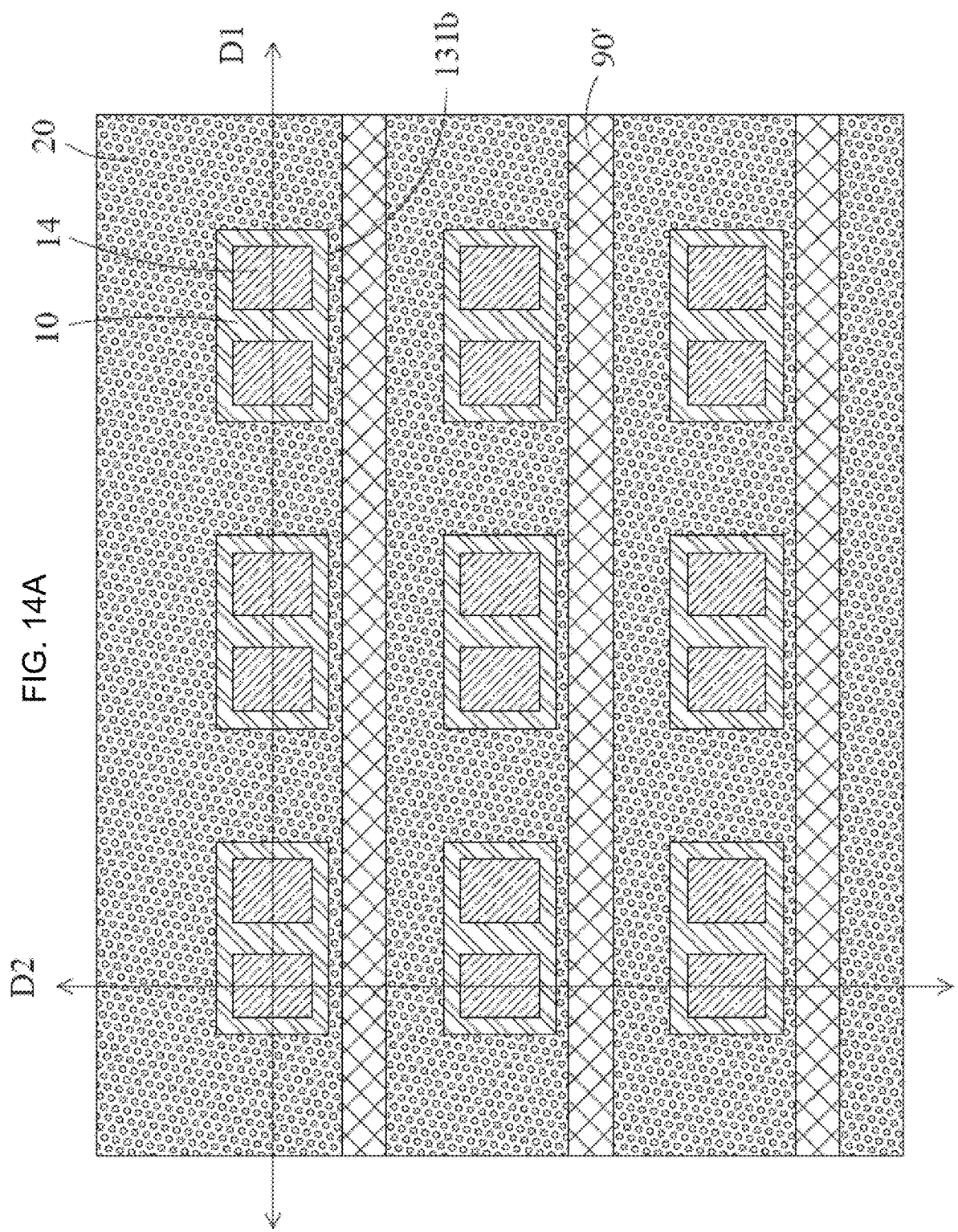

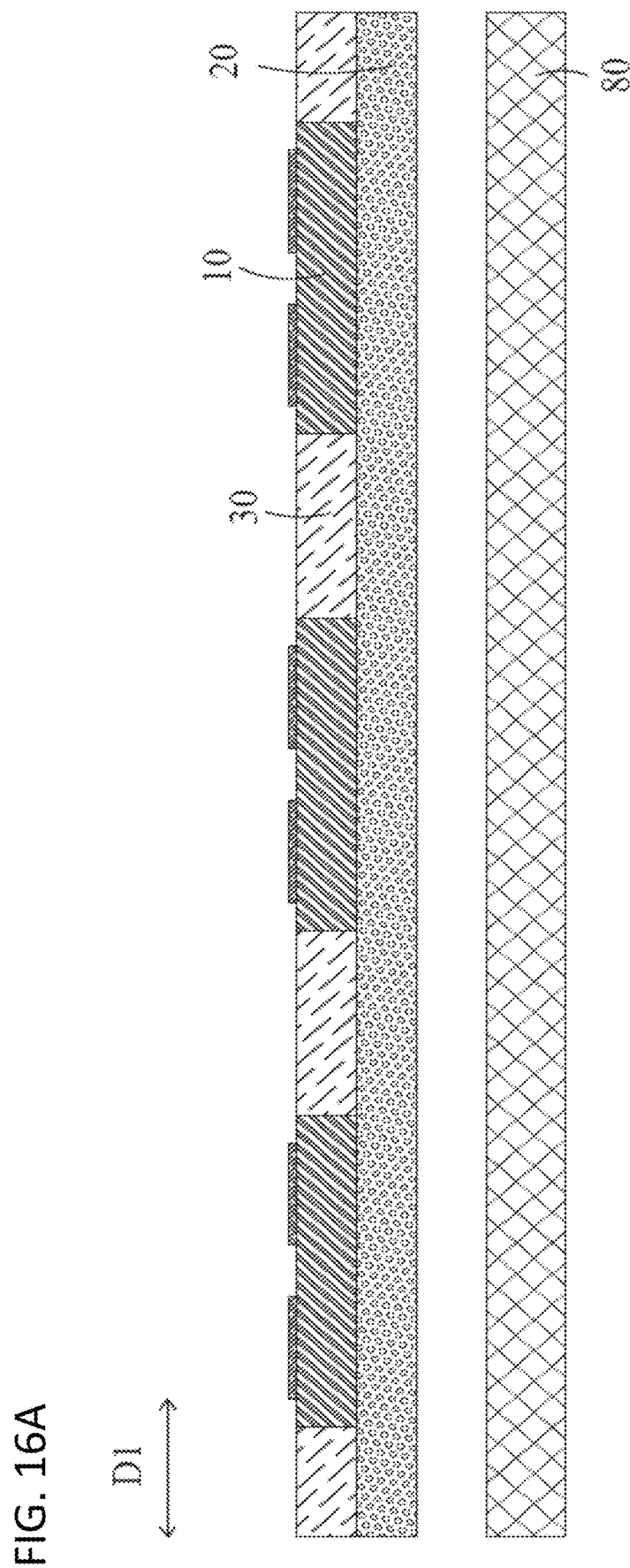

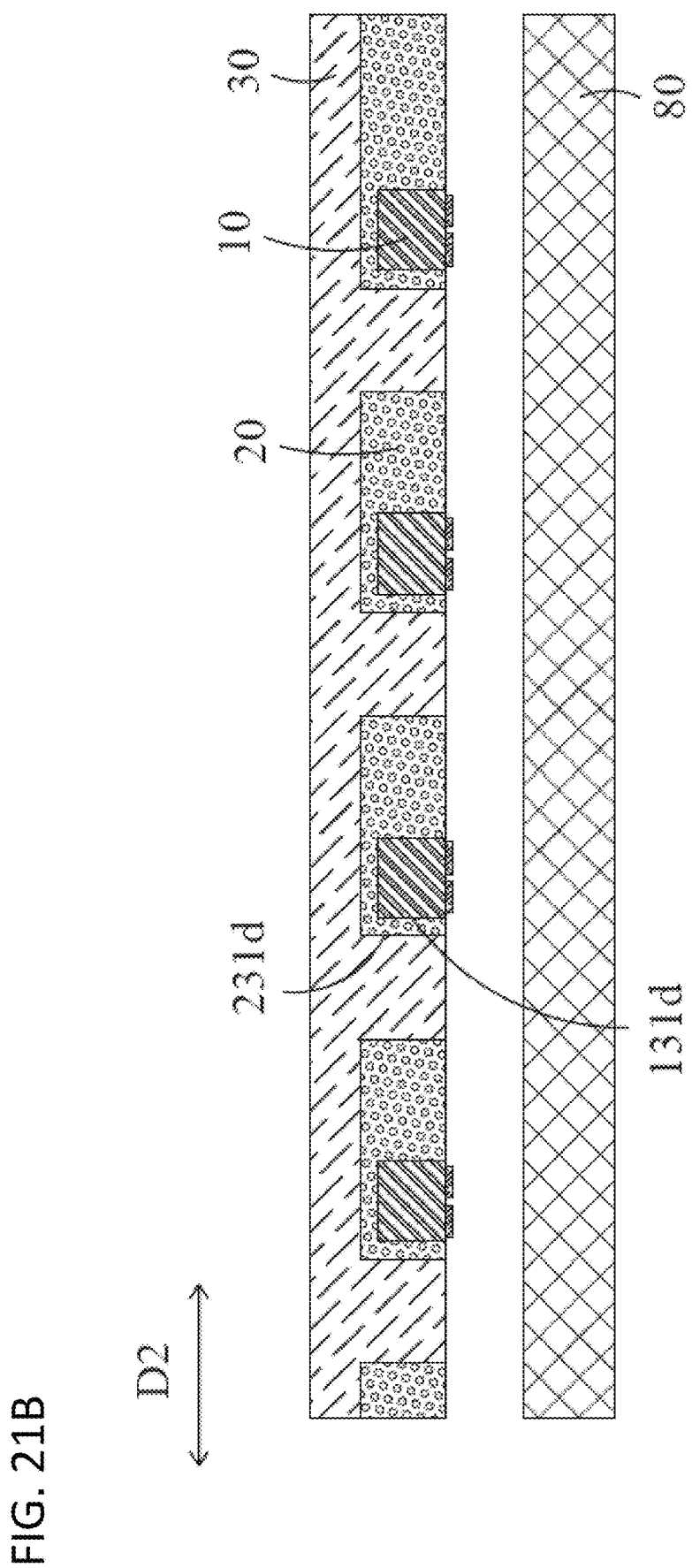

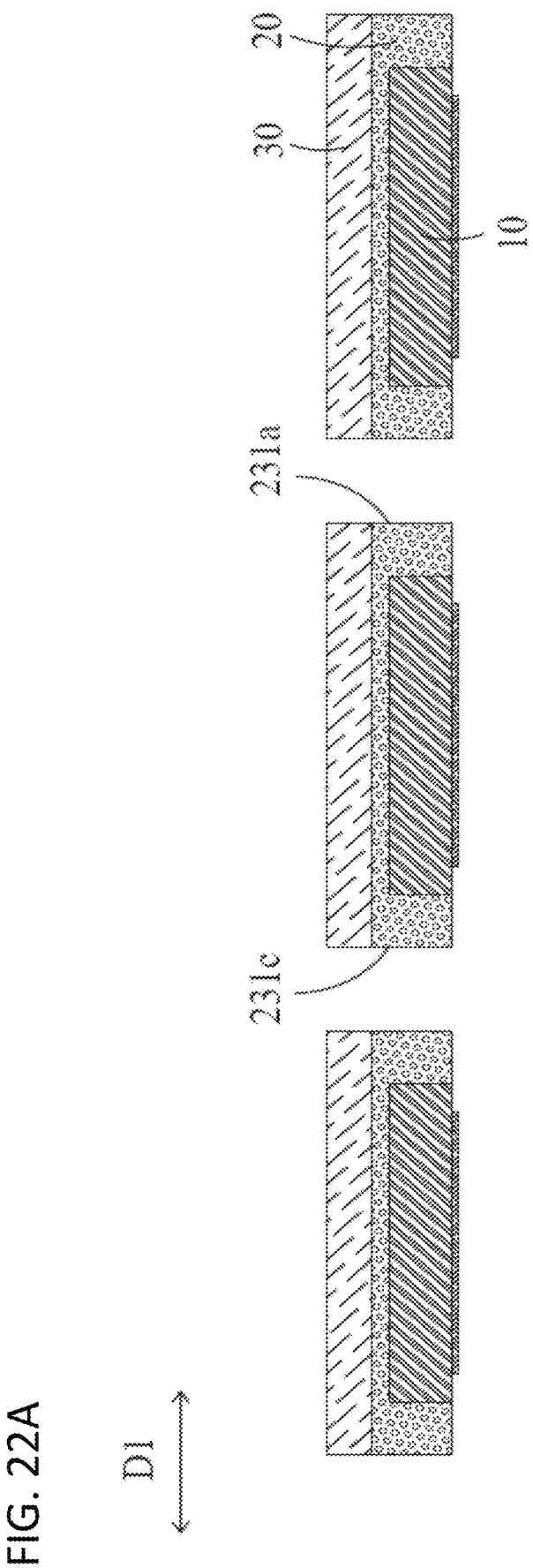

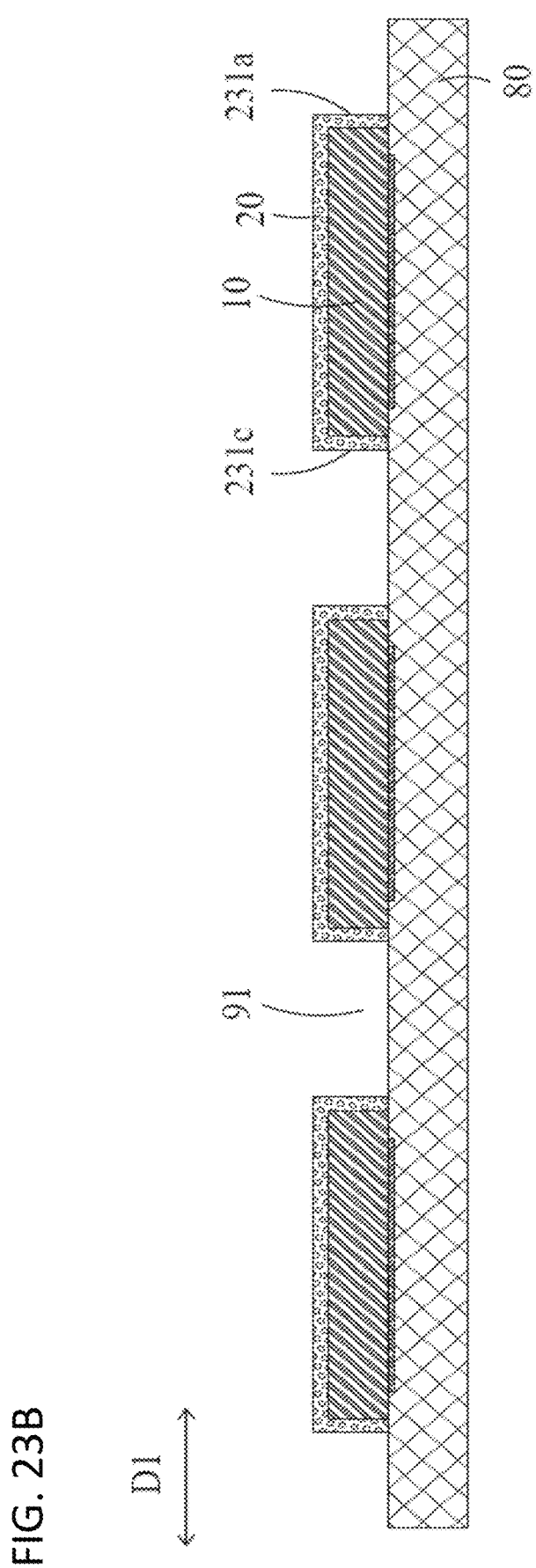

ASYMMETRICALLY SHAPED LIGHT-EMITTING DEVICE, BACKLIGHT MODULE USING THE SAME, AND METHOD FOR MANUFACTURING THE SAME

CROSS-REFERENCE TO RELATED APPLICATIONS

This application is a divisional of U.S. patent application Ser. No. 16/040,492, filed Jul. 19, 2018, which application claims the benefit of and priority to Taiwan Patent Application No. 106124542 filed on Jul. 21, 2017, and Chinese Patent Application No. 201710601827.1 filed on Jul. 21, 2017, the disclosures of which are incorporated herein by reference in their entirety.

BACKGROUND

Technical Field

The present disclosure relates to a light-emitting device and a method of manufacturing the same; and more particularly relates to an asymmetrically shaped chip-scale packaging (CSP) light-emitting device (LED) used in a Liquid Crystal Display (LCD) backlight module, and a method of manufacturing the same.

Description of the Related Art

An LED chip is generally used as a light source for illumination, backlight, or an indicator lamp inside electronic products. Specifically, an LED chip generating a primary light is usually placed inside a package structure to form an LED package, wherein photoluminescent materials are typically dispensed to cover the radiation path of the LED chip so that a portion of the primary light is converted as secondary light by the photoluminescent materials. Reflective materials are also used as a part of the package structure so that desirable light-emitting directions can be achieved.

Among them, a Plastic Leaded Chip Carrier (PLCC) LED package can be categorized as a top-view LED package or a side-view LED package according to their light-emitting direction. A top-view LED package is used as a light source for general lighting or a backlight source for direct-lit LCD displays, whereas a side-view LED package is used as a backlight source for edge-lit LCD displays for televisions or mobile devices. Either a top-view LED package or a side-view LED package has a primary light-emitting surface. An optical axis of an LED package is generally specified by an axis passing through the center of the primary light-emitting surface (for example, a rectangle) and perpendicular to the primary light-emitting surface. For the sake of simplicity, two additional axes are specified to be along the length and the width directions of the primary light-emitting surface, and both are perpendicular to the optical axis, wherein the axis along the length direction and that along the width direction are also perpendicular to each other. When the radiation pattern is measured along the length direction and the width direction of a top-view LED package (or a side-view LED package), the same (or similar) radiation pattern can usually be obtained. Because the top-view LED package or side-view LED package has the same or similar radiation patterns along the length and width directions, the PLCC-type LED package has a symmetrical radiation pattern.

This type of LED packages with a symmetrical radiation pattern cannot satisfy some applications specifying an asymmetrical radiation pattern, such as street lighting. Another application specifies the light source of the backlight module for the edge-lit type LCD for televisions or mobile devices to have an asymmetrical radiation pattern, where a larger angle of radiation pattern along the length direction of the LED packages (or the length direction of the backlight module) is desirable. In this way, a radiation pattern with a large viewing angle along the length direction can provide a more uniform incident light distribution to the light guide plate, thus reducing dark spots or areas along the light guide plate. The number of LED packages used in a light bar along the light guide plate can also be reduced as well if a light source having a large viewing angle is used. An edge-lit light source also should provide a smaller viewing angle of the radiation pattern along the width direction of the LED package (or the thickness direction of the backlight module) so that the incident light can be effectively transmitted from the LED light source to the light guide plate of the backlight module instead of leaking out of the light guide plate, thereby increasing light utilization efficiency.

For a PLCC-type LED package, whether it is top-view or side-view, it uses a lead frame with a reflective cup as its main design structure. Furthermore, it is usually packaged with an LED chip dispensed with a photoluminescent material. Specifically, the PLCC reflective cup is usually fabricated by molding. If a PLCC-type LED package is used in applications specifying an asymmetrical radiation pattern, an extra optical lens or secondary optical lens is incorporated to shape the light to achieve a specified radiation pattern, which inevitably will increase the manufacturing cost. Also, the overall space used to achieve an asymmetrical radiation pattern is greatly increased, which is not favorable to the design of an end product of consumer electronics nowadays. If an optical lens is not used to shape the radiation pattern, an alternative approach is that a portion of the reflective cup structure of the lead frame is fabricated to be light-transmitting. That is, the light can penetrate through this portion of the light-transmitting structure so that the radiation pattern can be changed. However, the reflective cup structure of the lead frame is usually fabricated through molding. Therefore, the LED package having an asymmetrically shaped geometry, such as a reflective cup with a partial light-transmitting structure and a partial reflective structure, is difficult to fabricate using a mass production process. Therefore, a streamlined and cost effective method to achieve an asymmetrical radiation pattern for a PLCC type LED package remains desired.

As the size of LCDs for televisions and mobile devices continue to move toward thinner in form factors and lighter in weight, the PLCC-type LED package used as a backlight source also has to be continuously reduced in size. In this trend, a CSP LED with a small form factor has been developed recently. CSP LEDs have become one of the main development trends in the LED industry. For example, CSP LEDs have been introduced to replace the top-view PLCC LEDs used in direct-lit backlight LCD TVs. The application of CSP LEDs in backlight can further reduce the size of the LED backlight module, and simultaneously obtain higher light intensity. The smaller size of a CSP LED is advantageous in the design of a secondary optical lens, and the higher light intensity is beneficial to the design of a brighter LCD or otherwise to the reduction of the number of the LEDs used.

According to the number of the light emission surfaces, CSP LEDs can be categorized into two types: top-surface emitting and five-surface emitting. As for a top-surface emitting CSP LED, four vertical edge surfaces of the flip-chip LED chip are covered with a reflective material so that the light is radiated solely or primarily from the top surface of the CSP LED. Therefore a top-surface emitting CSP LED has a smaller viewing angle (about 120). The light of a five-surface emitting CSP LED can be transmitted outwardly from the top surface as well as the four vertical edge surfaces of the CSP LED, which therefore has a larger viewing angle (about 140°~160). However, similar to the PLCC-type LED packages, both of the two types of CSP LEDs belong to the category of light-emitting devices having a symmetrical radiation pattern, and therefore both types of CSP LEDs cannot satisfy the application specifying an asymmetrical radiation pattern. In addition, for a CSP LED, if a primary optical lens or a secondary optical lens is used to generate an asymmetrical radiation pattern, not only the production cost is significantly increased, but also the space of the CSP LED together with the lens is greatly increased, which will defeat the advantage of a small form factor of the CSP LED. Therefore, an effective design is still lacking to achieve an asymmetrical radiation pattern while using a CSP LED.

For a side-view PLCC package or other side-view surface mount LED packages, even though the primary light-emitting surface of a side-view package is perpendicular to the bonding pad surface of the package, the primary light-emitting surface is still substantially in parallel with the electrode surface of the LED chip. As for a CSP LED, a lead frame or a submount substrate is usually not included. That is, the electrode surface of a CSP LED is in parallel and in contact with the application mounting board. Therefore, in some embodiments of this disclosure, a top-view CSP will be specified with the technical feature that the primary light-emitting surface and the electrode surface of a CSP LED are substantially in parallel; whereas a side-view CSP will be specified with the technical feature that the primary light-emitting surface and the electrode surface of a CSP LED are substantially perpendicular.

Therefore, although the CSP LED can be greatly reduced in size, the CSP LEDs used in backlight applications are top-view CSP LEDs. That is, the primary light-emitting surface and the lower electrode surface of a CSP LED are substantially parallel to each other. When a top-view CSP LED is used as a backlight source in an edge-lit LCD, a special L-shaped light bar design is included so that the primary light-emitting surface of the CSP LED faces the incident-light side of the light guide plate. The L-shaped light bar will increase production cost and the difficulty of alignment between the light bar and the light guide plate. Also, the increase of thickness of the light bar module in the normal direction of the light-emitting surface causes a larger display frame bezel size. If the primary light-emitting surface and the lower electrode surface of a CSP LED are perpendicular to each other, it is specified as a side-view CSP LED. When a CSP LED with a side-view structure is adopted, an L-shaped light bar may be omitted to turn the top light-emitting surface 90 degrees toward the incident-light side of the light guide plate. Accordingly, the thickness of the light bar module along the direction of the light-emitting surface can be effectively reduced.

Therefore, it remains desired to fabricate a small form-factor CSP LED with an asymmetrical geometric structure to achieve an asymmetrical radiation pattern in a low-cost and efficient manner; and to realize a small form-factor side-view CSP LED with the primary light-emitting surface and the lower electrode surface perpendicular to each other, which can be applied to the edge-lit type backlight module to reduce the thickness of the light bar module along the direction of the light-emitting surface so as to further reduce the display frame bezel size.

SUMMARY

An object of some embodiments of the present disclosure is to provide a top-view CSP LED having asymmetrically shaped reflective surfaces, a backlight module including the top-view LED, and a method for manufacturing the top-view LED, so that the radiation angle of the LED is effectively restricted in certain light-emitting directions to generate an asymmetrical radiation pattern.

Another object of some embodiments of the present disclosure is to provide a side-view CSP LED having a primary light-emitting surface and a lower electrode surface substantially perpendicular to each other, a backlight module including the side-view LED, and a manufacturing method to fabricate the side-view LED In order to achieve the above objects, a top-view LED having an asymmetrically shaped reflective structure according to some embodiments of the present disclosure includes: an LED chip, a photoluminescent structure, and a reflective structure. The LED chip has an upper surface, a lower surface opposite to the upper surface, an edge surface and a set of electrodes. The edge surface is formed and extends between the upper surface and the lower surface, and the set of electrodes is disposed on or adjacent to the lower surface to form a lower electrode surface. Furthermore, a first horizontal direction and a second horizontal direction perpendicular to each other are specified along the length direction and the width direction on the upper surface of the LED chip, respectively. The photoluminescent structure has a top surface, a bottom surface opposite to the top surface, and a side surface. The side surface is formed and extends between the top surface and the bottom surface. The photoluminescent structure covers the upper surface and/or the edge surface of the LED chip. The reflective structure partially covers the side surface of the photoluminescent structure. The side surface of the photoluminescent structure has four vertical side surfaces. Two vertical side surfaces of the four vertical side surfaces are oppositely disposed perpendicular to the second horizontal direction, wherein one of them is covered by the reflective structure to form a side reflective surface, and the other is not covered by the reflective structure to form a side light-emitting surface, and the side light-emitting surface and the lower electrode surface of the LED chip are substantially perpendicular to each other. Another two vertical side surfaces are oppositely disposed perpendicular the first horizontal direction to form two side light-emitting surfaces.

In order to achieve the above object, some embodiments according to the present disclosure are directed to a side-view CSP LED, including: an LED chip, a photoluminescent structure, and a reflective structure. The LED chip has an upper surface, a lower surface opposite to the upper surface, an edge surface and a set of electrodes. The edge surface is formed and extends between the upper surface and the lower surface, and the set of electrodes is disposed on or adjacent to the lower surface. The set of electrodes and the lower surface collectively form a lower electrode surface of the LED chip. Furthermore, a first horizontal direction and a second horizontal direction perpendicular to each other are specified along the length direction and the width direction on the upper surface of the LED chip. The photoluminescent structure covers the edge surface and/or the upper surface of the LED chip. The reflective structure substantially completely covers the top surface of the photoluminescent structure to form an upper reflective surface, and partially covers the side surface of the photoluminescent structure to form at least one side reflective surface.

To achieve the above object, other embodiments of the present disclosure are directed to a top-view monochromatic LED having an asymmetrical reflective structure, including: an LED chip, a light-transmitting structure, and a reflective structure, wherein the LED chip has an upper surface, a lower surface opposite to the upper surface, an edge surface and a set of electrodes. The edge surface is formed and extends between the upper surface and the lower surface, and the set of electrodes is disposed on or adjacent to the lower surface. The set of electrodes and the lower surface collectively form a lower electrode surface. Furthermore, a first horizontal direction and a second horizontal direction perpendicular to each other are specified along the length direction and the width direction on the upper surface of the LED chip, respectively. The light-transmitting structure has a top surface, a bottom surface opposite to the top surface, and a side surface. The side surface is formed and extends between the top surface and the bottom surface. The light-transmitting structure covers the upper surface of the LED chip and/or the edge surface. The reflective structure partially covers the side surface of the light-transmitting structure. The side surface of the light-transmitting structure has four vertical side surfaces. Two vertical side surfaces of the four vertical side surfaces are oppositely disposed perpendicular to the second horizontal direction; one of them is covered by the reflective structure to form one side reflective surface; the other is not covered by the reflective structure to form a side light-emitting surface; and the side light-emitting surface and the lower electrode surface of the LED chip are substantially perpendicular to each other. Another two vertical side surfaces are oppositely disposed perpendicular to the first horizontal direction and are not covered by the reflective structure to form two side light-emitting surfaces.

In order to achieve the above object, other embodiments according to the present disclosure are directed to a monochromatic side-view CSP LED, including: an LED chip, a light-transmitting structure, and a reflective structure. The LED chip has an upper surface, a lower surface opposite to the upper surface, an edge surface and a set of electrodes. The edge surface is formed and extends between the upper surface and the lower surface, and the set of electrodes is disposed on or adjacent to the lower surface to form a lower electrode surface. Furthermore, a first horizontal direction and a second horizontal direction perpendicular to each other are specified along the length direction and the width direction on the upper surface of the LED chip, respectively. The light-transmitting structure covers the upper surface and/or the edge surface of the LED chip. The reflective structure substantially completely covers the top surface of the light-transmitting structure to form an upper reflective surface, and partially covers the side surface of the light-transmitting structure to form at least one side reflective surface.

To achieve the above object, a backlight module according to some embodiments of the present disclosure includes an application mounting board, a plurality of the top-view or side-view LEDs according to embodiments of the present disclosure, a reflective layer, and a light guide plate. The application mounting board includes a horizontal surface and/or a vertical surface. A plurality of the LEDs is disposed on the application mounting board to form a light bar. The reflective layer is disposed above the horizontal surface of the application mounting board. The light guide plate is disposed above the reflective layer, including an incident-light side surface and an exiting-light surface that is connected to the incident-light side surface and faces away from the reflective layer.

To achieve the above object, a method of manufacturing a top-view or a side-view LED disclosed according to some embodiments of the present disclosure includes: disposing a photoluminescent structure or a light-transmitting structure to cover an upper surface and/or an edge surface of an LED chip; and forming a reflective structure to partially cover one vertical side surface of the photoluminescent structure or the light-transmitting structure. A first horizontal direction and a second horizontal direction perpendicular to each other are specified along the length direction and the width direction on the upper surface of the LED chip, respectively. The side surface of the photoluminescent structure or the light-transmitting structure has four vertical side surfaces. Two vertical side surfaces of the four vertical side surfaces are disposed oppositely to each other perpendicular to the second horizontal direction, wherein one of them is covered by the reflective structure to form a side reflective surface, while the other is not covered by the reflective structure to form a side light-emitting surface. Another two vertical side surfaces of the four vertical side surfaces are oppositely disposed perpendicular to the first horizontal direction.

In this arrangement, the photoluminescent structure covers the upper surface and/or the edge surface of the LED chip, and the reflective structure partially covers the side surface of the photoluminescent structure to partially reflect the light emitted from the edge surface of the LED chip and/or the light emitted from the side surface of the photoluminescent structure. Therefore, an asymmetrical radiation pattern with respect to the normal direction of the light-emitting surface along the first horizontal direction and/or along the second horizontal direction can be formed. Furthermore, the reflective structure can substantially completely cover the upper surface, and partially cover the edge surface of the LED chip to form a side-view CSP LED with a technical feature that a primary light-emitting surface and a lower electrode surface are substantially perpendicular to each other. Therefore, the LED can provide properly specified asymmetrical radiation patterns in different applications without the aid of an additional optical lens, thereby effectively reducing the manufacturing cost of the LED, while retaining the advantage of its small size to facilitate a compact design of the end product.

Furthermore, the top-view or side-view LED can provide a larger viewing angle along the length direction of the light guide plate, so that dark areas can be minimized or the distance between two adjacent LEDs can be increased (the number of LEDs used in a light bar can be reduced). Meanwhile, the LED can provide a smaller viewing angle along the thickness direction of the light guide plate, so that the light emitted by the LED can be more effectively transmitted to the light guide plate, thereby reducing the loss of light energy. Moreover, the primary light-emitting surface of the LED may further be specified to be substantially perpendicular to the lower electrode surface of the LED to form a side-view CSP LED. When the side-view LED is applied to an edge-lit backlight module, an L-shape application mounting board of the light bar designed for using a top-view LED may be omitted. Instead, a horizontal application mounting board of the light bar for using a side-view LED is sufficient. Elimination of the vertical portion of the L-shape application mounting board reduces the overall thickness of the light bar and the difficulty of alignment and manufacturing. Therefore, the display using this side-view LED backlight module can have a narrower frame bezel.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 1A, FIG. 1B, FIG. 1C, FIG. 1D, and FIG. 1E are two perspective views and three cross-sectional views of a top-view LED according to one embodiment of the present disclosure.

FIG. 2A, FIG. 2B, FIG. 2C, and FIG. 2D are two perspective views and two cross-sectional views of a top-view LED according to another embodiment of the present disclosure.

FIG. 3A, FIG. 3B, FIG. 3C, and FIG. 3D are two perspective views and two cross-sectional views of a side-view LED according to another embodiment of the present disclosure.

FIG. 3E and FIG. 3F are two cross-sectional views of a side-view LED according to another embodiment of the present disclosure.

FIG. 4A, FIG. 4B, FIG. 4C, and FIG. 4D are two perspective views and two cross-sectional views of a side-view LED according to another embodiment of the present disclosure.

FIG. 4E and FIG. 4F are cross-sectional views of a side-view LED according to another embodiment of the present disclosure.

FIG. 6 is a schematic view of a backlight module including a side-view LED according to an embodiment of the present disclosure.

FIG. 8A, FIG. 8B, FIG. 9A, FIG. 9B, FIG. 9C, FIG. 10A, FIG. 10B, FIG. 11A, FIG. 11B, FIG. 12A, and FIG. 12B are schematic diagrams of process stages of a manufacturing method to fabricate a top-view LED according to one embodiment of the present disclosure.

FIG. 13A, FIG. 13B, FIG. 14A, FIG. 14B, FIG. 14C, FIG. 15A, FIG. 15B, FIG. 16A, FIG. 16B, FIG. 17A, and FIG. 17B are schematic diagrams of process stages of a manufacturing method to fabricate a top-view LED according to another embodiment of the present disclosure.

FIG. 18A, FIG. 18B, FIG. 19A, FIG. 19B, FIG. 19C, FIG. 20A, FIG. 20B, FIG. 21A, FIG. 21B, FIG. 22A, and FIG. 22B are schematic diagrams of process stages of a manufacturing method to fabricate a side-view LED according to another embodiment of the present disclosure.

FIG. 23A, FIG. 23B, and FIG. 23C are schematic diagrams of process stages of a partial manufacturing method to fabricate a top-view or a side-view LED according to another embodiment of the present disclosure.

DETAILED DESCRIPTION

Definitions

Figure 1A:
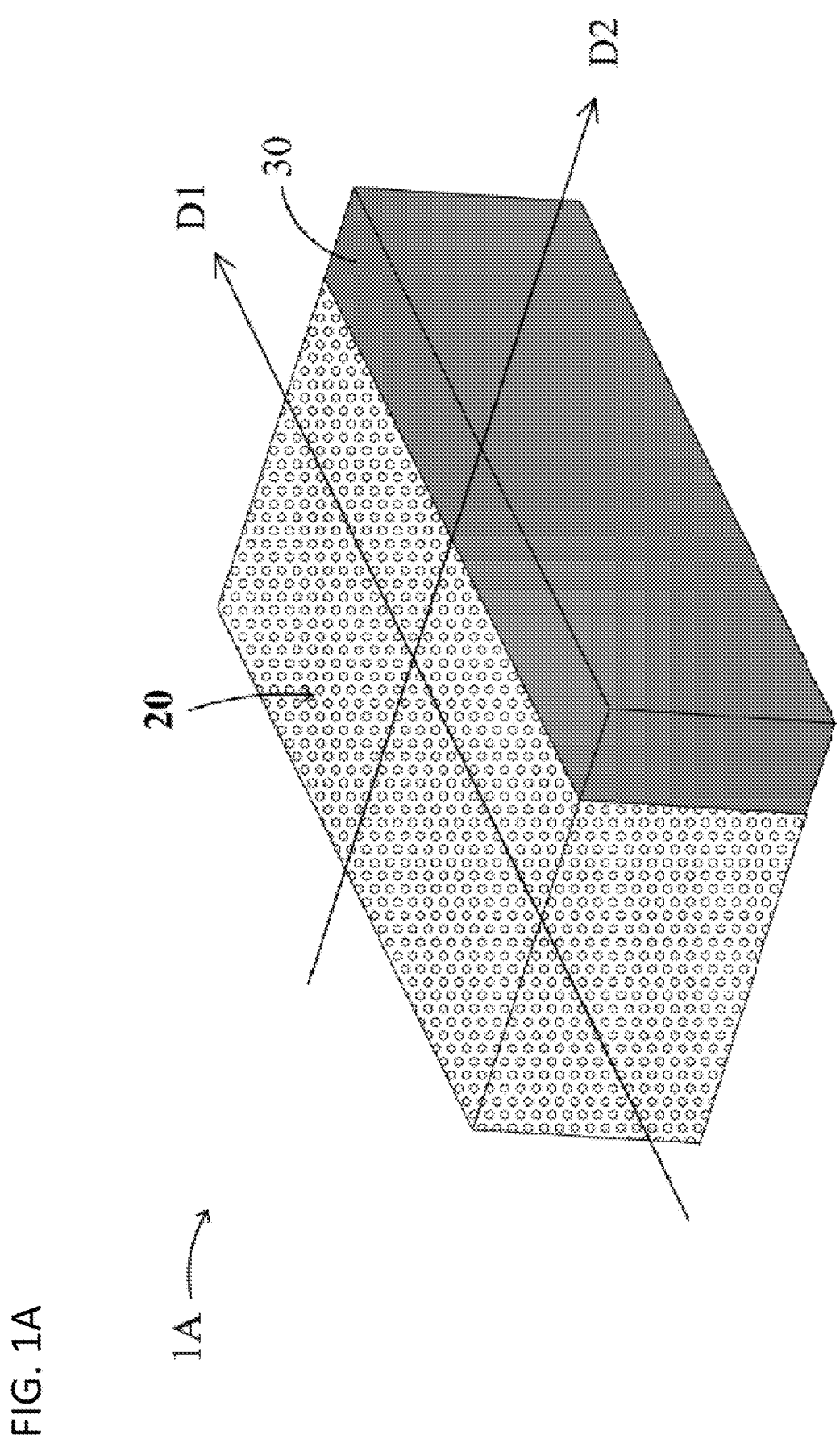

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometer of lying along the same plane, or within 5 micrometer of lying along the same plane. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 1B:
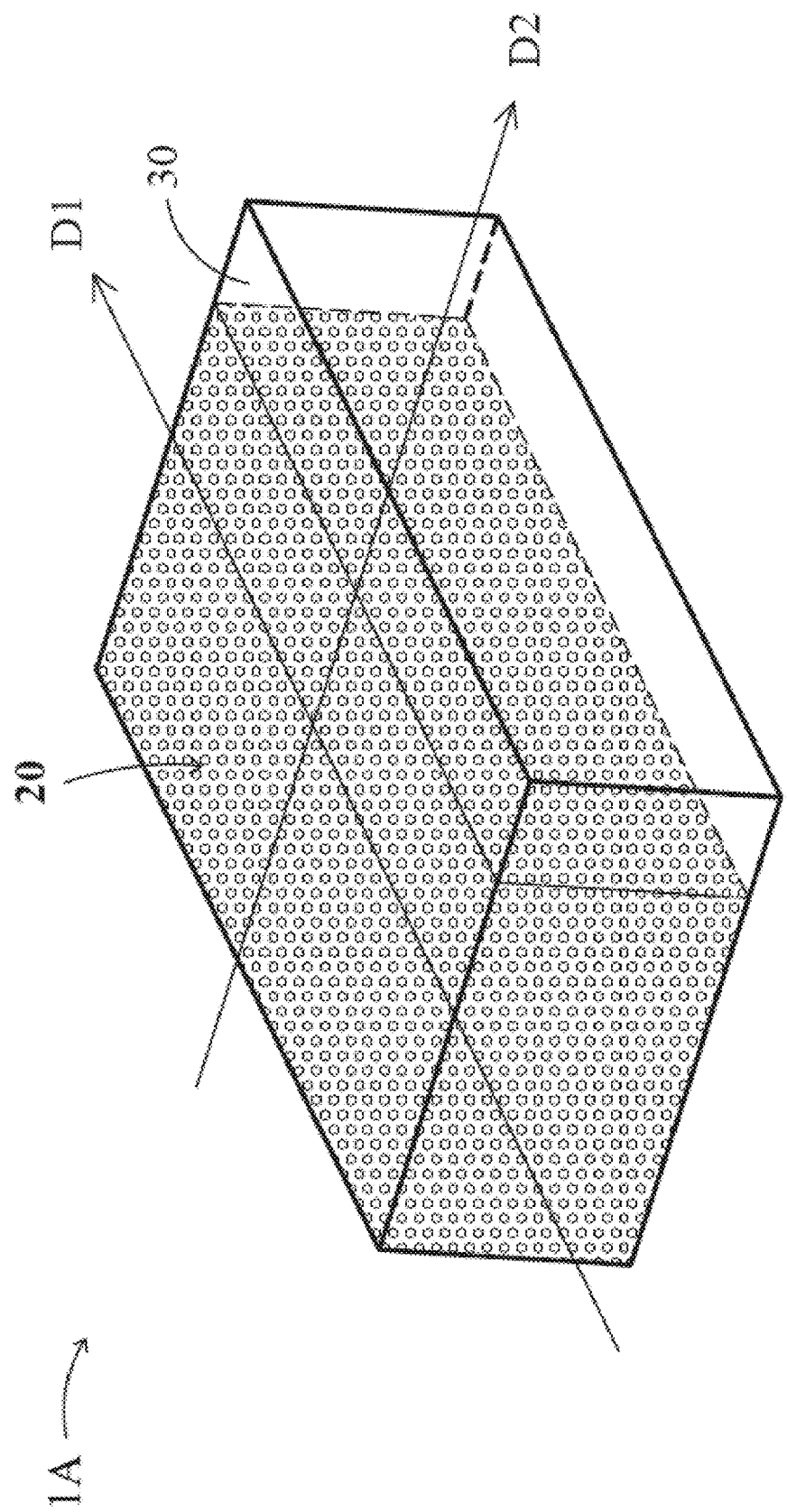
Figure 1D:
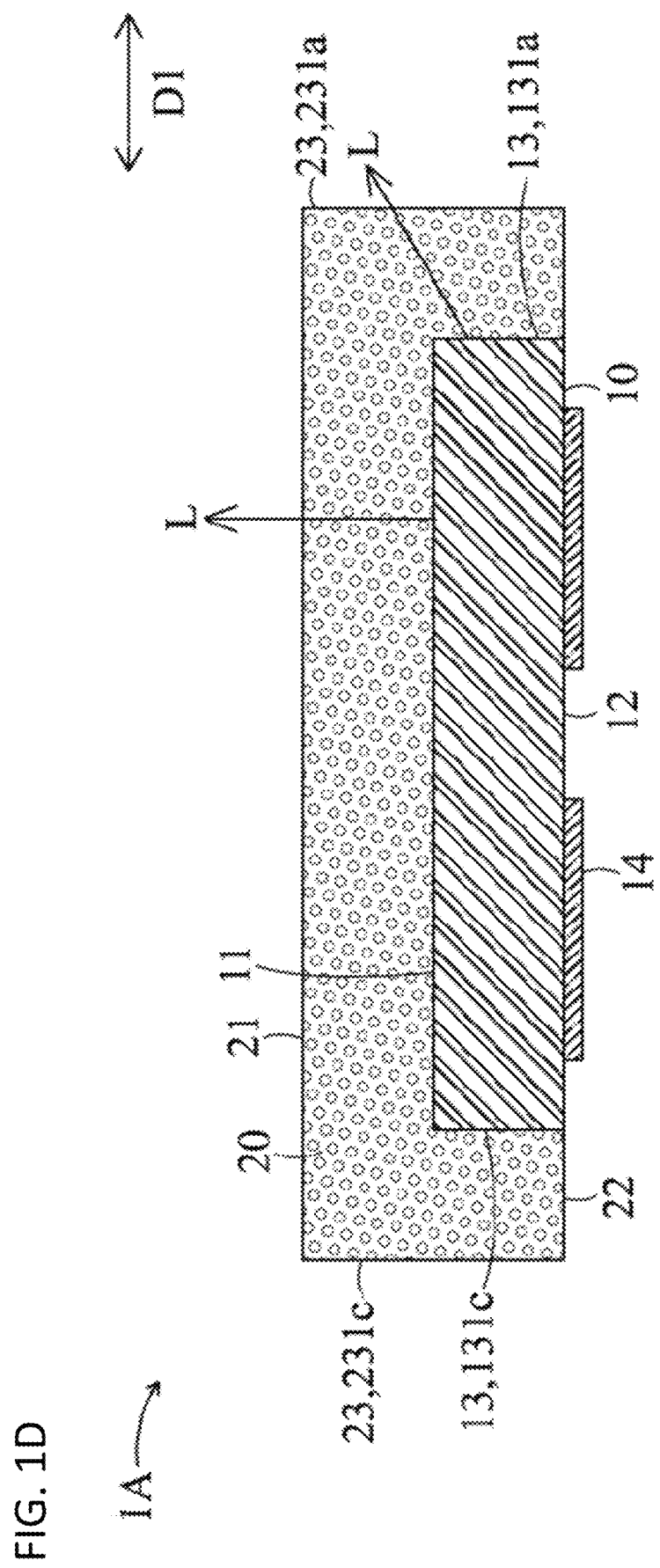

FIGS. 1A and 1B show two perspective views, and FIGS. 1C and 1D show two cross-sectional views of a top-view LED 1A according to an embodiment of the present disclosure. The LED 1A includes an LED chip 10, an optical structure 20, and a reflective structure 30. The technical details of the components will be described below in sequence.

The LED chip 10 is a flip-chip light-emitting semiconductor chip, and has an upper surface 11, a lower surface 12, an edge surface 13, and a set of electrodes 14, as illustrated in FIGS. 1C and 1D. The upper surface 11 is disposed oppositely relative to the lower surface 12, and the upper surface 11 and the lower surface 12 may be rectangular, and two side edges or lines of the rectangular upper surfaces 11 (and the corresponding lower surface 12) are substantially in parallel with a first horizontal direction D1 and the other two side edges or lines are substantially in parallel with a second horizontal direction D2. In other words, the first horizontal direction D1 and the second horizontal direction D2 are specified perpendicular to each other along the length direction and the width direction on the upper surface 11 of the LED chip 10, respectively. A thickness direction (direction perpendicular to the upper surface 11, not shown) is specified to be along the vertical direction perpendicular to both of the first horizontal direction D1 and the second horizontal direction D2

The edge surface 13 is formed between the upper surface 11 and the lower surface 12, and extends and connects the periphery of upper surface 11 and that of the lower surface 12. In other words, the edge surface 13 is formed along the periphery edge of the upper surface 11 and the periphery edge of the lower surface 12, so that the edge surface 13 is annular (for example, a rectangular ring) with respect to the upper surface 11 and the lower surface 12. The edge surface 13 further includes four vertical edge surfaces 131a to 131d (the edge surface 13 is divided into the four vertical edge surfaces 131a to 131d), wherein the two vertical edge surfaces 131a and 131c are oppositely disposed and are perpendicular to the first horizontal direction D1, and the other two vertical edge surfaces 131b and 131d are oppositely disposed and are perpendicular to the second horizontal direction D2.

The set of electrodes 14, having two or more electrodes, is disposed on or adjacent to the lower surface 12. The set of electrodes 14 and the lower surface 12 are collectively referred to as a lower electrode surface hereinafter. The light-emitting active layer of the LED chip 10 is located near the lower surface 12 of the LED chip 10 and above the set of electrodes 14 (not shown). The space defined between the active layer, the upper surface 11, and four vertical edge surfaces 131a to 131d is formed of a transparent substrate material (e.g., Sapphire). Electrical energy (not shown) can be supplied to the LED chip 10 through the set of electrodes 14 to energize the active layer so that a primary light is radiated through electroluminescence (converting the electrical energy to optical energy) of the active layer. Since the LED chip 10 is of a flip-chip type, no electrode is disposed on the upper surface 11, and a light radiated by the active layer of the LED chip 10 can be transmitted out of the LED chip 10 from the upper surface 11 as well as the four vertical edge surfaces 131a to 131d of the edge surface 13.

An example embodiment of the optical structure 20 is a photoluminescent structure 20 to form a white LED. Another example embodiment of the optical structure 20 is a substantially transparent light-transmitting structure 20 to form a monochromatic LED. Hereinafter, a photoluminescent structure 20 will firstly be used as an embodiment to illustrate the technical features of the LED 1A. The photoluminescent structure 20, which can be used to convert portions of the primary light emitted by the LED chip 10 to a secondary light with different wavelengths to form a light beam L, includes a light-transmitting resin material and a photoluminescent material, wherein the photoluminescent material can be uniformly dispersed in the light-transmitting resin material so that the photoluminescent structure 20 does not have a distinct layered structure. The photoluminescent structure 20 may also include a photoluminescent layer and a substantially transparent light-transmitting layer (or light-transmitting structure) stacked on each other. For specific technical details, reference may be made to the U.S. patent application Ser. No. 15/416,921 (published as US 2017/0222107) for a photoluminescent structure with a light-transmitting layer stacked on a photoluminescent layer.

As illustrated in FIGS. 1A to 1D, the photoluminescent structure 20 has a top surface 21, a bottom surface 22, and a side surface 23, wherein the top surface 21 and the bottom surface 22 are disposed oppositely to each other, and the top surface 21 and the bottom surface 22 may be rectangular. The two side edges or lines of the top surface 21 are substantially in parallel with the first horizontal direction D1, and the other two side edges or lines are substantially in parallel with the second horizontal direction D2. The bottom surface 22 of the photoluminescent structure 20 and the lower surface 12 of the LED chip 10 together form a lower surface of the LED 1A. The top surface 21 and the bottom surface 22 are horizontal surfaces and may also be substantially parallel to each other.

The side surface 23 is formed between the top surface 21 and the bottom surface 22, and connects the periphery of top surface 21 and that of the bottom surface 22. In other words, the side surface 23 is formed along the periphery edge of the top surface 21 and the bottom surface 22, so that the side surface 23 is annular (e.g., a rectangular ring) along the top surface 21 and bottom surface 22. The side surface 23 further includes four vertical side surfaces 231a to 231d (the side surface 23 is divided into the four vertical side surfaces 231a to 231d), wherein the two vertical side surfaces 231a and 231c are oppositely disposed and are perpendicular to the first horizontal direction D1, and the other two vertical side surfaces 231b and 231d are oppositely disposed and are perpendicular to the second horizontal direction D2.

In terms of the relative position, the photoluminescent structure 20 is disposed on the LED chip 10 and substantially completely covers (e.g., covers at least 90%, at least 95%, at least 98%, or at least 99% or more of a total surface area) the upper surface 11 and the edge surface 13 of the LED chip 10, so that the top surface 21 of the photoluminescent structure 20 is located above the upper surface 11 of the LED chip 10.

As shown in FIG. 1C, the reflective structure 30 can block and reflect the light beam L so that the radiation angle of the light beam L is constrained. In this embodiment, the reflective structure 30 partially covers the side surface 23 and solely covers one side of the side surface 23 of the photoluminescent structure 20 (also indirectly covers and shields one side of the edge surface 13 of the LED chip 10). Specifically, among the four vertical side surfaces 231a to 231d of the side surface 23, one of the vertical side surfaces 231a to 231d perpendicular to the second horizontal direction D2, for example the vertical side surface 231b, is directly shielded by the reflective structure 30 to form a side reflector. The vertical edge surface 131b of the LED chip 10 together with the vertical side surface 231b of the photoluminescent structure 20 are directly or indirectly covered by the reflective structure 30. In other words, the other vertical side surface 231d of the photoluminescent structure 20, the vertical side surfaces 231a and 231c oppositely disposed perpendicular to the first horizontal direction D1, and the top surface 21 are not covered by the reflective structure 30. That is, the vertical side surfaces 231a, 231c, and 231d not covered by the reflective structure 30 form three side light-emitting surfaces, and the top surface 21 that is not shielded by the reflective structure 30 forms a top light-emitting surface. Therefore, the light partially emitted by the LED chip 10 and partially converted by the photoluminescent structure 20 traveling toward the vertical side surface 231b will be reflected back (or absorbed) by the reflective structure 30, and mix together to form the light beam L, which can radiate out of the photoluminescent structure 20 from the light-emitting surfaces, namely the vertical side surfaces 231a, 231c, and 231d and the top surface 21.

Desirably, the side light-emitting surfaces and the lower electrode surface are substantially perpendicular to each other. That is, the side light-emitting surfaces and the lower electrode surface are designed to be fabricated to be perpendicular to each other. Due to tolerances or variations of a manufacturing process or other factors, the side light-emitting surface could be slightly inclined with respect to the lower electrode surface as a result. Under a slight inclination angle, the side light-emitting surface and the lower electrode surface are still considered to be substantially perpendicular to each other. Desirably, the top light-emitting surface and the lower electrode surface are substantially parallel to each other. That is, the top light-emitting surface and the lower electrode surface are designed to be fabricated to be parallel to each other. However, the top light-emitting surface relative to the lower electrode may be slightly inclined because of tolerance and variations of a manufacturing process. Even under slight inclination, the top light-emitting surface and the lower electrode surface are still considered to be substantially parallel to each other.

Desirably, when the reflective structure 30 covers the side surface 23, it adjoins the side surface 23 so that there is substantially no gap between the reflective structure 30 and the side surface 23. Therefore, the reflective structure 30 has an inner side surface 33 adjoining and contacting the side surface 23 of the photoluminescent structure 20. The reflective structure 30 also has an outer side surface 34 opposite to the inner side surface 33, which functions as a side reflective surface, and the outer side surface 34 may be a vertical surface. Also, the top surface 31 of the reflective structure 30 can be substantially flush with the top surface 21 of the photoluminescent structure 20, and a bottom surface of the reflective structure 30 can be substantially flush with the bottom surface 22 of the photoluminescent structure 20.

As for the manufacturing material, the reflective structure 30 may be formed of a material including a light-transmitting resin material and optical scattering particles dispersed inside the light-transmitting resin material. The light-transmitting resin material may be, for example, polyphthalamide (PPA), polycyclohexylene-dimethylene terephthalate (PCT), epoxy molding compound (EMC), or silicone; and the optical scattering particles can be, for example, titanium dioxide particles, boron nitride particles, silicon dioxide particles, aluminum oxide particles, or other ceramic particles.

In addition, the LED 1A may also include a submount substrate 50 (see FIG. 1E). The submount substrate 50 may be a ceramic substrate, a glass substrate, a silicon substrate, a printed circuit board (PCB), a metal-core PCB, or the like. The submount substrate 50 has wires (not shown) that can conduct electric energy. When the LED 1A is electrically connected with the submount substrate 50, electric power can be transmitted to the LED 1A through the submount substrate 50 to make it emit light. The LED 1A with a submount substrate 50 may facilitate the attachment process; such as a surface mount process for module-level applications. The submount substrate 50 may also be included in other embodiments disclosed in the present disclosure.

The above is the technical content of each component of the LED 1A, which has at least the following technical features.

As shown in FIG. 1C and FIG. 1D, after the primary light generated from the LED chip 10 enters the photoluminescent structure 20, the light beam L radiating toward the vertical side surface 231b is reflected back by the reflective structure 30 and mixed with another portion of the light together. Eventually, the light beam L passes through the photoluminescent structures 20 and escapes either from the side light-emitting surfaces (the vertical side surfaces 231a, 231c, and 231d) or the top light-emitting surface (the top surface 21). Therefore, the light beam L traveling along the first horizontal direction D1 is not significantly affected and constrained by the reflective structure 30, and therefore has a larger viewing angle. On the other hand, the light beam L traveling toward the vertical side surface 231b along the second horizontal direction D2 will be reflected back by the reflective structure 30. Because the light beam L is shielded by the reflective structure 30 along the second horizontal direction D2, the viewing angle is smaller than the former and is re-directed toward certain specific directions (toward the vertical side surface 231d that is not shielded by the reflective structure 30). Therefore, an asymmetrical radiation pattern is formed along the normal direction of the upper surface 11 of the LED chip 10 (for example, the optical axis of the upper surface 11). In general, the viewing angle of the light beam L emitted by the LED 1A along the first horizontal direction D1 is larger, and the viewing angle along the second horizontal direction D2 is smaller and the radiation pattern is asymmetrical.

Desirably, the length of the top surface 21 along the first horizontal direction D1 may be larger than the width of the top surface 21 along the second horizontal direction D2, which is beneficial to make the light beam L along the first horizontal direction D1 having a larger viewing angle than the viewing angle along the second horizontal direction D2.

In summary, the LED 1A may provide different viewing angles along different horizontal directions D1 and D2, and form an asymmetrical radiation pattern with respect to the normal direction of the light-emitting surface along a specific horizontal direction so as to provide non-symmetrical radiation patterns.

Another embodiment of the optical structure 20 of the LED 1A is a substantially transparent light-transmitting structure 20 to form a monochromatic LED 1A. That is, the LED 1A will include the LED chip 10, a light-transmitting structure 20 (or a light-transmitting layer), and the reflective structure 30. Thereby, the wavelength of the light emitted by the LED chip 10 is not converted when passing through the light-transmitting structure 20. The LED 1A with the light-transmitting structure 20 can be used to generate monochromatic light such as red light, green light, blue light, infrared light, or ultraviolet light with an asymmetrical radiation pattern. The technical feature of this embodiment of the monochromatic light CSP LED can also be applied to other embodiments disclosed below.

In addition, the LED 1A may further include a microstructured lens layer 40 (see FIG. 1E). Desirably, the microstructured lens layer 40 can be simultaneously formed during the manufacture of the optical structure 20 through molding or other fabrication methods to integrally form the optical structure 20 and the micro-structured lens layer 40 together. The micro-structured lens layer 40 may be composed of a plurality of microstructures regularly arranged or randomly formed, and the microstructures may be hemispherical, pyramidal, columnar, conical or the like or may be rough surfaces. Thereby, the micro-structured lens layer 40 can prevent the light transmitted out of the LED 1A from being reflected back to the optical structure 20 due to total internal reflection, thereby increasing the light extraction efficiency and improving the luminous efficacy of the LED 1A. This technical feature of an optical structure 20 having a micro-structured lens layer can also be applied to other embodiments disclosed in the present disclosure.

The above is a description of the technical features of the LED 1A. Next, the technical features of LEDs according to other embodiments of the present disclosure will be described, and the technical features of other embodiments of the LEDs should be cross-referenced to each other, so that the same or similar technical features will be omitted or simplified for the sake of brevity.

Figure 2D:
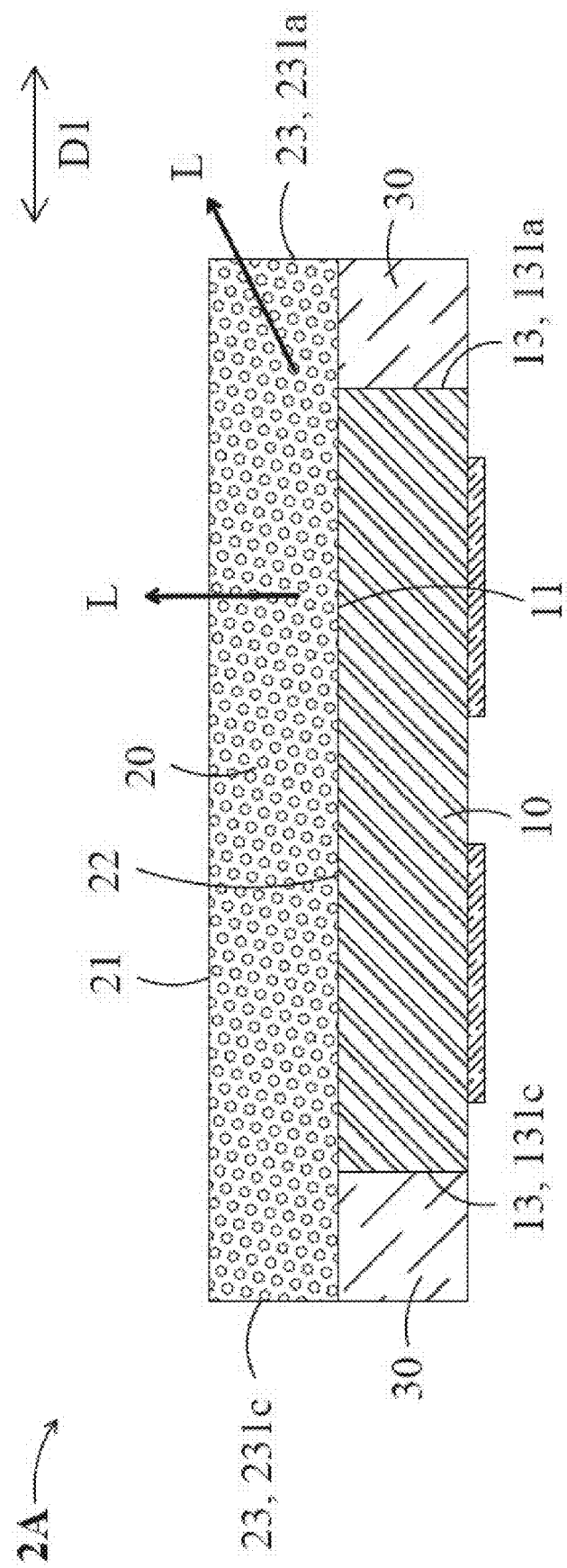
Figure 3A:
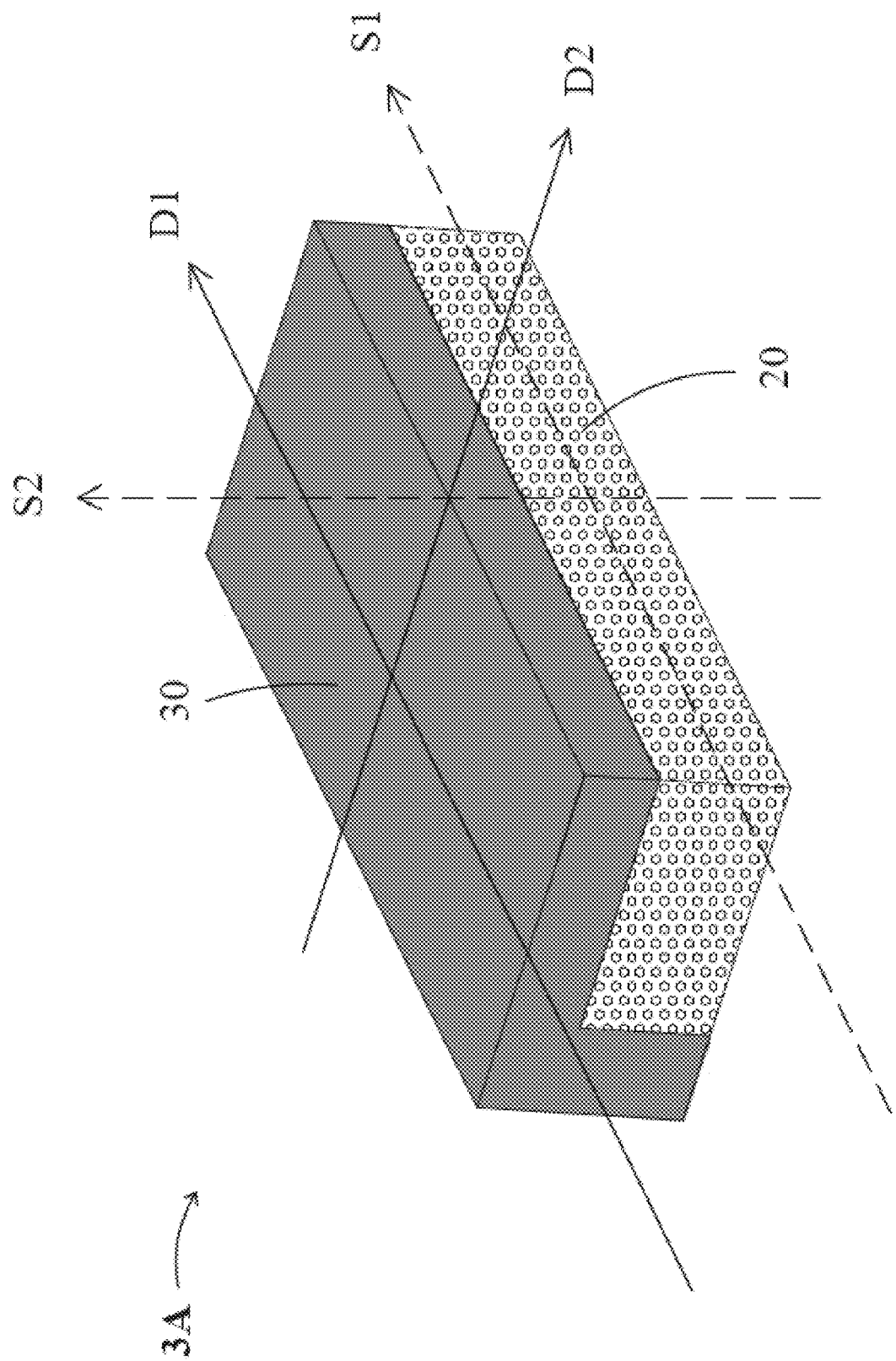
Figure 3B:
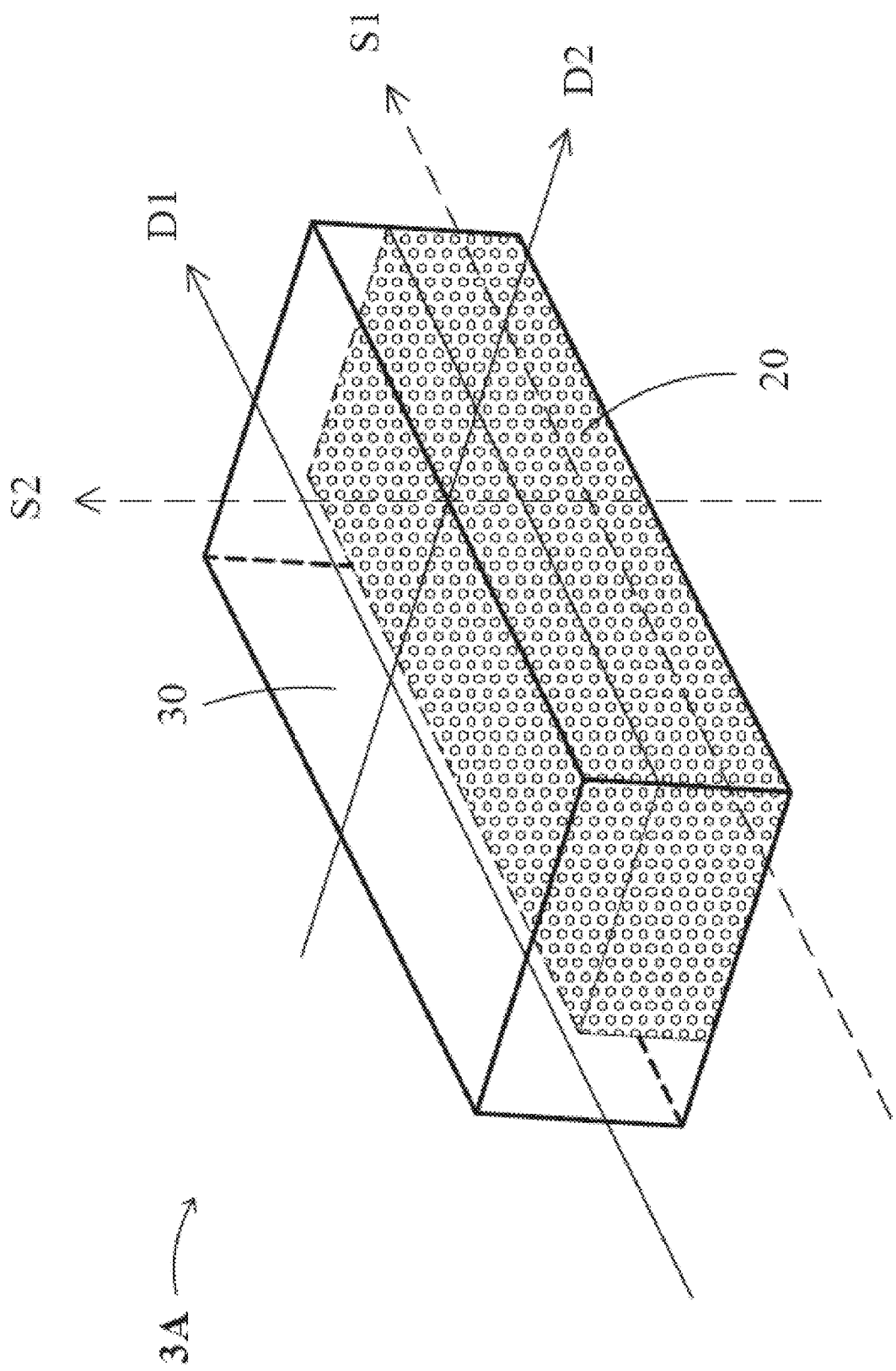
Figure 3D:
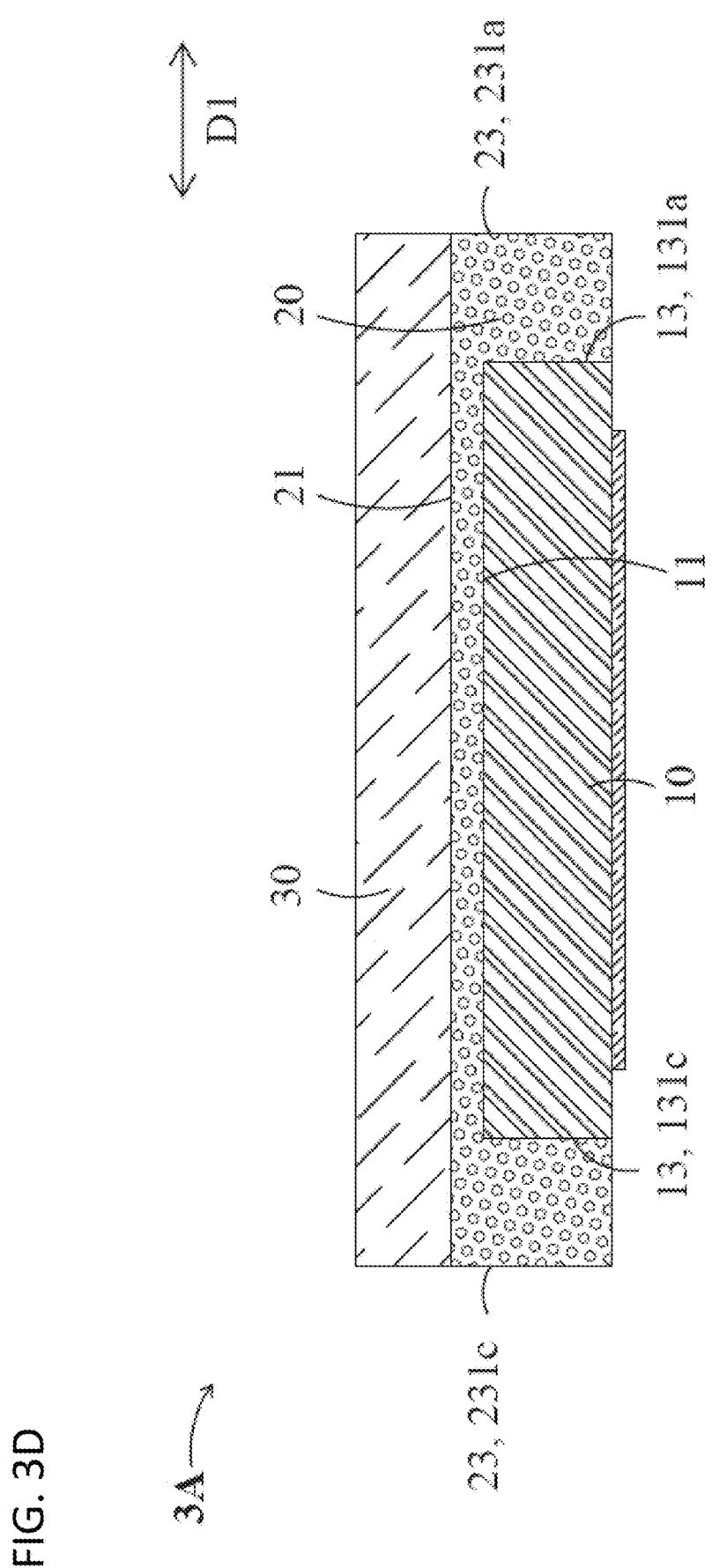
Figure 4B:
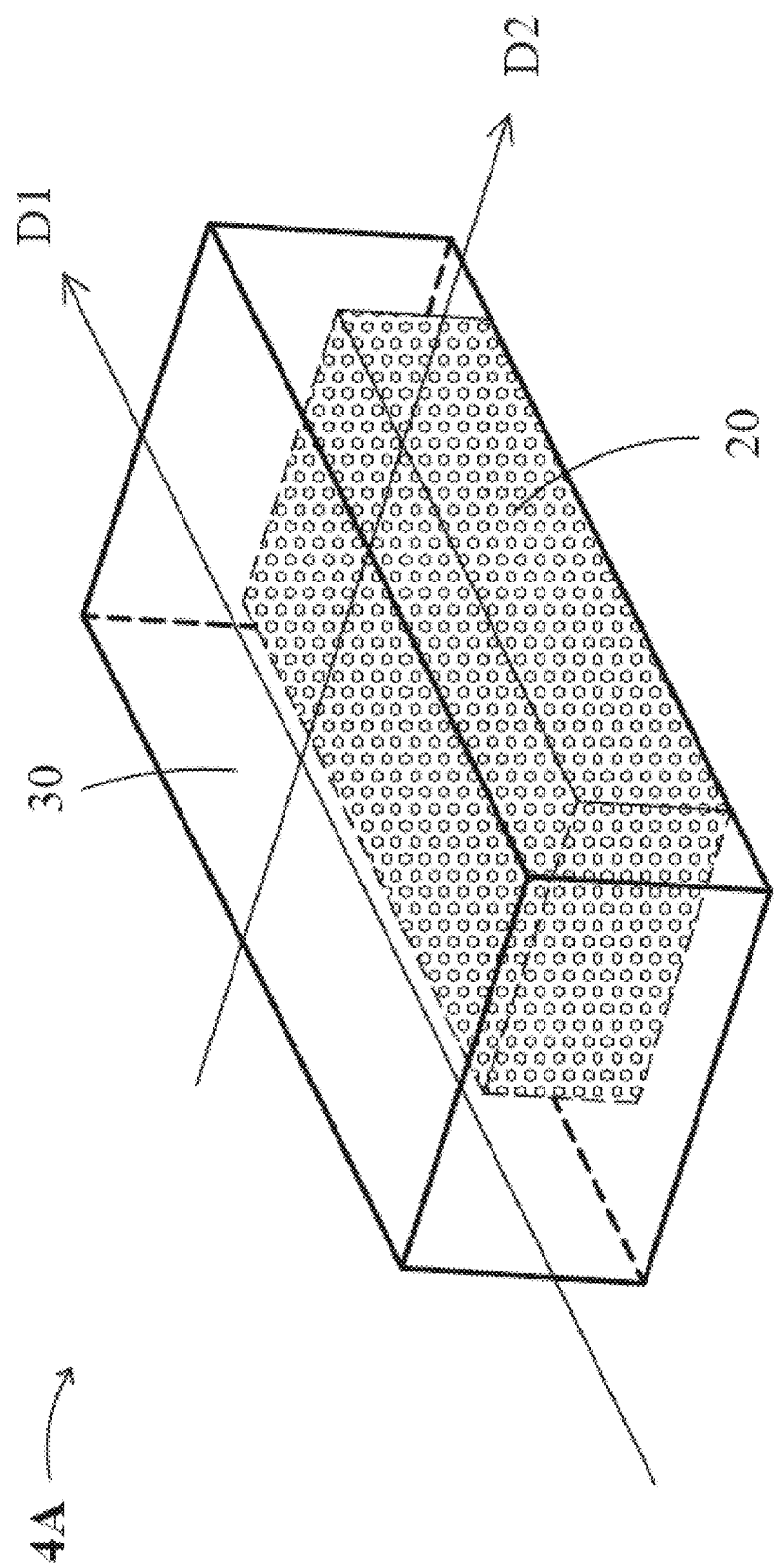
Figure 4D:
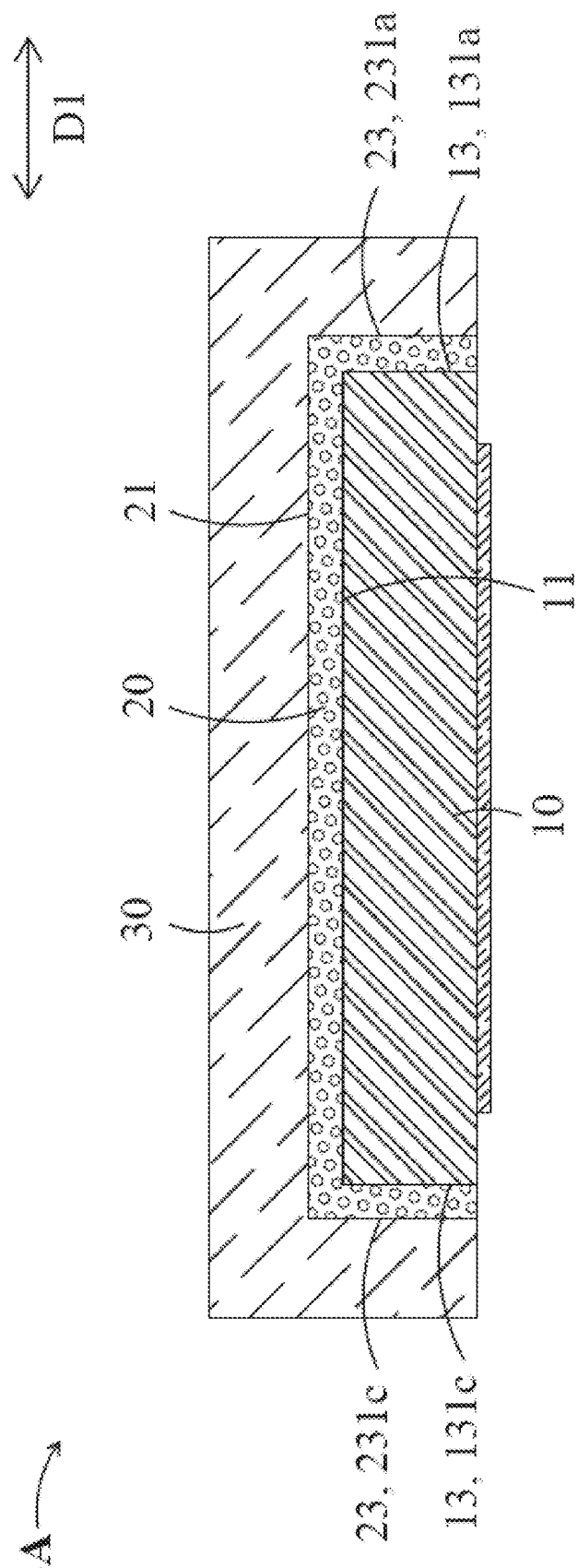

FIGS. 2A to 2B show two perspective views of an LED 2A, and FIGS. 2C to 2D show two cross-sectional views of the LED 2A according to another embodiment of the present disclosure, wherein, for the purpose of illustration, a photoluminescent structure 20 is used as an example embodiment of the optical structure 20. The LED 2A differs from the LED 1A at least in that the area of the bottom surface 22 of the photoluminescent structure 20 is larger than the area of the upper surface 11 of the LED chip 10 so that the upper surface 11 of the LED chip 10 is completely covered by the photoluminescent structure 20. Furthermore, the edge surface 13 of the LED chip 10 is covered and surrounded by the reflective structure 30. More specific details are as follows.

The area of the upper surface 11 of the LED chip 10 is smaller than the area of the bottom surface 22 of the photoluminescent structure 20 and is completely covered by the photoluminescent structure 20. Also, the four vertical edge surfaces 131a to 131d of the edge surface 13 of the LED chip 10 are not covered by the photoluminescent structure 20 but are covered by the reflective structure 30. The primary light radiated from the LED chip 10 can be emitted solely or primarily from the upper surface 11 thereof so as to penetrate the photoluminescent structure 20. One of the vertical side surfaces 231b or 231d of the photoluminescent structure 20 is covered by the reflective structure 30 to form a side reflective surface, for example the vertical side surface 231b as illustrated in FIG. 2C in this embodiment. The vertical side surfaces 231a and 231c and the top surface 21 are not covered by the reflective structure 30. That is, they are exposed outside the reflective structure 30, wherein the vertical side surfaces 231a, 231c, and 231d that are not covered by the reflective structure 30 form three side light-emitting surfaces, and the top surface 21 that is not covered by the reflective structure 30 forms a top light-emitting surface.

Thus, after the light beam L is emitted from the upper surface 11 of the LED chip 10 to enter the photoluminescent structure 20, partial light beam L that travels toward the vertical side surface 231b will be reflected (or absorbed) by the reflective structure 30 so as to be mixed with another portion of the light beam L, which will be emitted out of the photoluminescent structure 20 from the vertical side surfaces 231a, 231c, and 231d and the top surface 21. Therefore, the viewing angle of the light beam L is less affected by the reflective structure 30 along the first horizontal direction D1. Along the second horizontal direction D2, because the vertical side surface 231b is shielded by the reflective structure 30, the viewing angle is constrained and radiation is biased toward the vertical side surface 231d that is not covered by the reflective structure 30. That is, with respect to the normal direction of the upper surface 11 of the LED chip 10 (for example, the optical axis of the upper surface 11) and along with the second horizontal direction D2, the radiation pattern is asymmetrical.

Therefore, the LED 2A may also provide different viewing angles in different horizontal directions D1 and D2 so as to achieve the purpose of providing an asymmetrical radiation pattern. The LED 2A also has an asymmetrical radiation pattern with respect to the optical axis of the upper surface 11 of the LED chip 10 along the second horizontal direction D2.

As illustrated in FIGS. 3A to 3D, two perspective views and two cross-sectional views of an LED 3A are shown according to another embodiment of the present disclosure, wherein, for the purpose of illustration, a photoluminescent structure 20 is used as an example to illustrate the optical structure 20. The LED 3A is different from the light-emitting device 2A at least in that the upper surface 11 of the LED chip 10 of the LED 3A and the four vertical edge surfaces 131a to 131d of the edge surface 13 are covered by the photoluminescent structure 20. The top surface 21 of the photoluminescent structure 20 is substantially completely covered (e.g., covers at least 90%, at least 95%, at least 98%, or at least 99% or more of a total surface area) by a reflective structure 30 to form an upper reflective surface, and its side surface 23 is partially covered by the reflective structure 30.

More specifically, one of the vertical side surfaces 231b or 231d of the photoluminescent structure 20 (for example, the vertical side surface 231d illustrated in FIG. 3C) and the top surface 21 are simultaneously covered by the reflective structure 30 to form a side reflective surface and an upper reflective surface, respectively. Since the vertical side surfaces 231a to 231c are not covered by the reflective structure 30 and thus are exposed outside the reflective structure 30, the LED 3A has three side light-emitting surfaces.

In this way, after the primary light is emitted from the LED chip 10 and enters the photoluminescent structure 20, a portion of the light traveling toward the vertical side surface 231d or the top surface 21 will be reflected (or absorbed) by the reflective structure 30, and will be mixed together with another portion of light to form the light beam L and exit the photoluminescent structure 20 from either one of the vertical side surfaces 231a, 231b or 231c. Therefore, the viewing angle is constrained along the second horizontal direction D2 of the LED 3A. Compared with the LEDs 1A and 2A wherein light emits mainly from the top surface and some from the vertical side surfaces, the light beam L emitted from the light-emitting device 3A is mainly from the vertical side surface 231b and some from the vertical side surfaces 231a and 231c so that a large amount of laterally transmitted light can be emitted to form a side-view LED.

Since most of the light is transmitted from the vertical side surface 231b of the photoluminescent structure 20, the vertical side surface 231b is the primary light-emitting surface of the LED 3A. Because the primary light-emitting surface and the lower electrode surface of the LED chip 10 are substantially perpendicular to each other, the LED 3A is a side-view CSP LED. For ease of description, a length direction S1 and a width direction S2 perpendicular to each other are specified along the vertical side surface 231b (the primary light-emitting surface), and both the length direction S1 and the width direction S2 are substantially perpendicular to the second horizontal direction D2. Through the arrangement of the reflective structure 30 according to this embodiment, the light beam L can be solely or primarily emitted from the vertical side surfaces 231a, 231b and 231c (three side light-emitting surfaces). Therefore the LED 3A can have a larger viewing angle along the length direction S1. On the other hand, due to the fact that the top surface 21 of the photoluminescent structure 20 is covered by the reflective structure 30, the LED 3A has a smaller viewing angle along the width direction S2. Accordingly, the LED 3A can provide different viewing angles along the length direction S1 and along the width direction S2. Furthermore, the primary light-emitting surface of the LED 3A is perpendicular to the lower electrode surface of the LED chip 10, which is different from the orientation of the primary light-emitting surface of the LEDs 1A and 2A. Therefore, besides providing asymmetrical lighting applications, the LED 3A is a side-view LED.

FIG. 3E and FIG. 3F are two schematic cross-sectional views of an LED 3B according to another embodiment of the present disclosure, wherein, for the purpose of illustration, a photoluminescent structure 20 is used as an example embodiment of the optical structure 20. The LED 3B is different from the LED 3A at least in that the photoluminescent structure 20 of the light-emitting device 3B covers the edge surface 13 of the LED chip 10 (and does not cover the upper surface 11), and the reflective structure 30 covers both the upper surface 11 of the LED chip 10 and the top surface 21 of the photoluminescent structure 20.

Specifically, the photoluminescent structure 20 of the LED 3B covers the edge surface 13 of the LED chip 10, and desirably, the top surface 21 of the photoluminescent structure 20 is substantially flush or coplanar with the upper surface 11 of the LED chip 10. The reflective structure 30 is disposed to form an upper reflective surface to cover the upper surface 11 and the top surface 21 simultaneously. In addition, one of the vertical side surfaces 231b or 231d of the photoluminescent structure 20 (for example the vertical side surface 231d as illustrated in FIG. 3E) is covered by the reflective structure 30 to form a side reflective surface, so that the vertical side surfaces 231a, 231b, and 231c are not covered by the reflective structure 30. Therefore, these surfaces are exposed from the reflective structure 30 to form three side light-emitting surfaces.

Thus, a primary light solely or primarily escapes from the edge surface 13 of the LED chip 10 and enters the photoluminescent structure 20, wherein part of the light traveling toward the vertical side surface 231d will be reflected (or absorbed) by the reflective structure 30, and will be mixed together with another portion of the light beam L to exit the photoluminescent structure 20 from any of the vertical side surfaces 231a, 231b or 231c. Compared with the LED 3A, during the transmission of the light, multiple reflections could occur between the upper surface 11 of the LED chip 10 and the top surface 21 of the photoluminescent structure 20 to cause loss of light energy. Therefore, when the reflective structure 30 is formed directly covering the upper surface 11 of the LED chip 10, the light extraction efficiency of the LED 3B can be further improved by avoiding the energy loss caused by multiple reflections.

It should be noted that, in order to prevent unnecessary light energy from being dissipated due to multiple reflections, the width of the LED chip 10 of the LEDs 3A and 3B along the second horizontal direction D2 is desirably smaller than the length of the LED chip 10 along the first horizontal direction D1. When the dimension is smaller along the second horizontal direction D2 in the embodiment, the light traveling toward the vertical side surface 231d and being reflected back by the reflective structure 30 can experience a shorter optical path. Together with other radiated light, the light beam L is emitted from any of the vertical side surfaces 231a, 231b and 231c of the photoluminescent structure 20.

Next, as illustrated in FIGS. 4A to 4D, two perspective views and two cross-sectional views of an LED 4A are shown, according to another embodiment of the present disclosure, wherein, for the purpose of illustration, a photoluminescent structure 20 is used as an example embodiment of the optical structure 20. The LED 4A is different from the LED 3A at least in that the upper surface 11 of the LED chip 10 of the LED 4A and the four vertical edge surfaces 131a to 131d of the edge surface 13 are covered by the photoluminescent structure 20, and the top surface 21 and three vertical side surfaces of the side surface 23 of the photoluminescent structure 20 are all covered by the reflective structure 30.

Specifically, one of the vertical side surfaces 231b or 231d of the photoluminescent structure 20 (for example the vertical side surface 231d as illustrated in FIG. 4C), the vertical side surfaces 231a and 231c, and the top surface 21 are simultaneously covered by the reflective structure 30 to form three side reflective surfaces and an upper reflective surface, respectively. The vertical side surface 231b is not covered by the reflective structure 30, and thus is exposed from the reflective structure 30 to form a side light-emitting surface.

Specifically, after the primary light is emitted from the LED chip 10 and enters the photoluminescent structure 20, part of the light traveling toward the vertical side surfaces 231a, 231c, 231d and the top surface 21 will be reflected (or absorbed) by the reflective structure 30, and the light will be mixed along with other radiated light and will be emitted from the vertical side surface 231b out of the photoluminescent structure 20. Thus, the orientation of the primary light-emitting surface of the LED 4A is substantially perpendicular to the lower electrode surface of the LED chip 10, which is also different from the orientation of the primary light-emitting surface of the LEDs 1A and 2A.

Therefore, it can also be used as a side-view LED.

As illustrated in FIG. 4E and FIG. 4F, two schematic cross-sectional views of an LED 4B are shown according to another embodiment of the present disclosure, wherein, for the purpose of illustration, a photoluminescent structure 20 is used as an example embodiment of the optical structure 20. The LED 4B is different from the LED 4A at least in that the photoluminescent structure 20 of the LED 4B covers the edge surface 13 of the LED chip 10 (and does not cover the upper surface 11), and the reflective structure 30 simultaneously covers the upper surface 11 of the LED chip 10 and the top surface 21 of the photoluminescent structure 20 as well as the three vertical side surfaces 231a, 231c, and 231d of the photoluminescent structure 20.

Specifically, the photoluminescent structure 20 covers the edge surface 13 of the LED chip 10. Desirably, the top surface 21 of the photoluminescent structure 20 is substantially flush or coplanar with the upper surface 11 of the LED chip 10, and both the top surface 21 and the upper surface 11 are simultaneously covered by the reflective structure 30 to form an upper reflective surface. In addition, one of the vertical side surfaces 231b or 231d of the photoluminescent structure 20 (for example the vertical side surface 231d as illustrated in FIG. 4E) and the vertical side surfaces 231a and 231c and the top surface 21 are simultaneously covered by the reflective structure 30, wherein the vertical side surfaces 231a, 231c, and 231d are covered by the reflective structure 30 to form three side reflective surfaces, while the vertical side surface 231b is not covered by the reflective structure 30 and thus is exposed outside the reflective structure 30 to form a side light-emitting surface.

Therefore, the primary light solely or primarily exits from the edge surface 13 of the LED chip 10 and enters the photoluminescent structure 20, and part of the light traveling toward the three vertical side surfaces 231a, 231c, 231d or the top surface 21 will be reflected (or absorbed) by the reflective structure 30, and escape out the photoluminescent structure 20 from the vertical side surface 231b together with another portion of the light beam L. Similar to the advantages of the LED 3B, the reflective structure 30 directly covers the upper surface 11 of the LED chip 10 so that the light extraction efficiency of the LED 4B can be further improved by avoiding the energy loss caused by multiple reflections.

It should be noted that in order to prevent unnecessary light energy from being reflected due to multiple reflections, the width of the LED chip 10 of the LEDs 4A and 4B along the second horizontal direction D2 is preferably to be smaller than the length along the first horizontal direction D1 so that the light traveling toward the vertical side surfaces 231a, 231c, 231d or the top surface 21 and reflected by the reflective structure 30 will experience a shorter optical path before being mixed together with other light beam L and emitted from the vertical side surface 231b of the photoluminescent structure 20.

In summary, the LEDs 1A, 2A, 3A, 3B, 4A, and 4B can provide the following common advantages. All of them have a small-size form factor because they are all CSP LEDs. Desirably the length (or width) of the LED 1A, 2A, 3A, 3B, 4A, or 4B is not more than about 2.0 times, about 1.6 times or about 1.2 times the length (or width) of the LED chip 10. Therefore, it is suitable to be assembled and embedded inside other electronic devices.

Furthermore, since an asymmetrical radiation pattern can be generated without incorporating a primary optical lens or a secondary optical lens, the cost of the overall optical system can be reduced, and the space for an optical lens can be saved.

In addition, the asymmetrical optical radiation pattern of the LED according to embodiments of the present disclosure can make the final product have other design advantages. For example, it can replace the side-view PLCC-type LED as a light source of the edge-lit type backlight module for LCD televisions and mobile devices, and the asymmetrical radiation pattern can provide a larger viewing angle along the length direction of the backlight module, so the area of a dark area or spot can be reduced or the spacing distance between two adjacent LEDs can be increased to reduce the number of LEDs used in a light bar. Simultaneously, along the thickness direction of the backlight module, the asymmetrically shaped LED provides a smaller viewing angle, so that the light emitted by the LED can be efficiently transmitted to the light guide plate of the backlight module to reduce the loss of light energy.

In addition, the primary light-emitting surface and the lower electrode surface of the LED according to some embodiments of the present disclosure may be substantially perpendicular to each other to form a side-view CSP LED. When applied to an edge-lit backlight module, the LED may allow the application mounting board of the backlight module to omit a vertical surface (refer to the technical content of the backlight module 600 in FIG. 6 to be described below), thereby minimizing the overall thickness of the backlight module along the normal direction of the light-emitting surface, and reducing the difficulty in designing and manufacturing. In this way, a display using this backlight module can achieve a narrower bezel frame.

In addition, the light emitted by the LEDs 1A, 2A, 3A, 3B, 4A, and 4B may also be specified to be more asymmetrically shaped through incorporating additional secondary optical lenses for some applications that specify a more asymmetrically shaped radiation pattern.

In addition, it will be appreciated that the technical features disclosed in the foregoing LED 1A, for example a substantially transparent light-transmitting structure 20 as an embodiment of the optical structure 20, can also be applied to the LEDs 2A, 3A, 3B, 4A, and 4B to form a monochromatic light CSP LED having an asymmetrical radiation pattern. Other technical features disclosed according to the LED 1A, such as including a micro-structured lens layer or a submount substrate, can also be applied to the LEDs 2A, 3A, 3B, 4A, and 4B.

Figure 5:
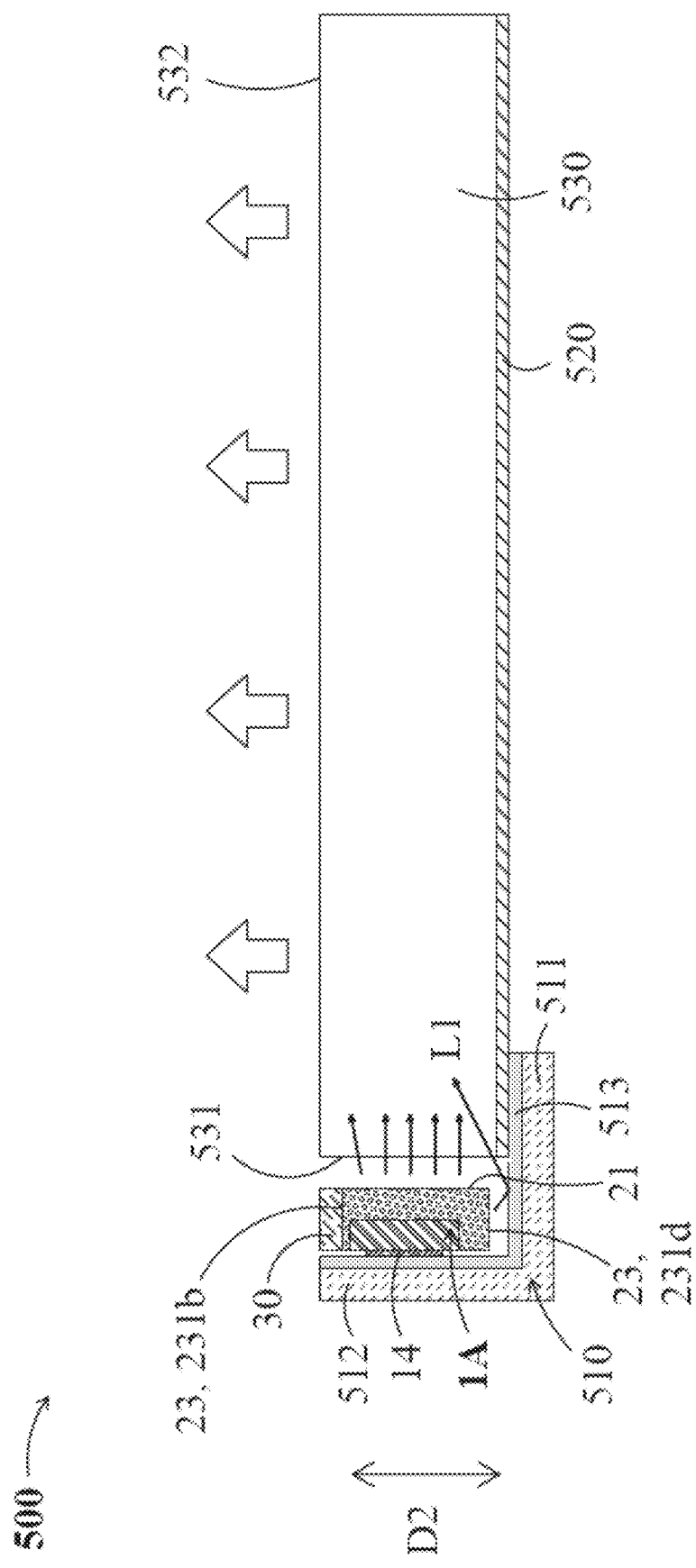
FIG. 5 is a schematic diagram of a backlight module including a top-view LED according to an embodiment of the present disclosure.

Next, a backlight module including any one of the LEDs described above will be described. FIGS. 5 and 6 respectively illustrate a backlight module with various aspects of configuration, wherein the former includes a plurality of LEDs 1A or a plurality of LEDs 2A that can emit light from the top surface 21, and the latter includes a plurality of LEDs 3A, 3B, 4A or 4B that emit light from a side light-emitting surface. The backlight modules further include an application mounting board, any one of the aforementioned LEDs (which may include a photoluminescent structure if white light is specified, or a light-transmitting structure if monochromatic light is specified), a reflective layer, and a light guide plate. The technical features of the components will be described in sequence as follows.

The backlight module 500 shown in FIG. 5 includes an application mounting board 510, an LED capable of emitting light from the top surface 21 (for example, the LED 1A), a reflective layer 520, and a light guide plate 530. The application mounting board 510 includes a horizontal portion 511 having a horizontal surface, a vertical portion 512 having a vertical surface, and a reflective layer 513. The horizontal portion 511 and the vertical portion 512 are substantially perpendicular to each other, and the reflective layer 513 covers at least the horizontal surface of the horizontal portion 511, or the vertical surface of the vertical portion 512 or both. For example, as illustrated in FIG. 5, both of the horizontal surface of the horizontal portion 511 and the vertical surface of the vertical portion 512 are covered by the reflective layer 513. The reflective layer 513 may be, for example, a metal thin film, a metal plate, or a high-reflectivity white paint. In addition, the application mounting board 510 may also be a flexible application mounting board.

As illustrated in FIG. 5, the LED 1A is disposed on the vertical surface of the vertical portion 512 of the application mounting board 510. The set of electrodes 14 of the LED chip 10 is electrically connected with the application mounting board 510. The LED 1A is disposed in such a configuration that, along the second horizontal direction D2, the vertical side surface 231*d* that is not covered by the reflective structure 30 faces the horizontal surface of the horizontal portion 511 of the application mounting board 510, and the vertical side surface 231*b* that is covered by the reflective structure 30 faces away from the horizontal portion 511.

The reflective layer 520 is disposed above the horizontal portion 511 of the application mounting board 510 (and may be disposed above the reflective layer 513) and extends away from the vertical portion 512 and away from the LED 1A. The reflective layer 520 may be, for example, a metal thin film, a metal plate or other structures. The light guide plate 530 is disposed on the reflective layer 520 and includes an incident-light side surface 531 and an exiting-light surface 532 substantially perpendicular to each other. The exiting-light surface 532 is connected to the incident-light side surface 531, and the exiting-light surface 532 is configured to be substantially parallel to but away from the reflective layer 520 (facing away from the reflective layer 520).

Accordingly, the top surface 21 of the LED 1A faces the incident-light side surface 531 of the light guide plate 530. Desirably, the length of the LED 1A along the second horizontal direction D2 is not greater than the thickness of the light guide plate 530 measured along a normal direction of the exiting-light surface 532. In other words, the dimension of the light-emitting surface of the LED 1A is desirably smaller than the dimension of the incident-light side surface 531. Therefore, the light emitted from the top surface 21 of the LED 1A can be effectively transmitted to the incident-light side surface 531 of the light guide plate 530. Because the vertical side surface 231*d* of the LED 1A is not covered by the reflective structure 30, light escaping from the vertical side surface 231*d* is largely emitted toward the reflective layer 513. Since the reflective layer 513 is readily fabricated using a high-reflectivity material, the reflectivity of the reflective layer 513 can be made higher than the reflectivity of the reflective structure 30. Therefore, after being reflected by the reflective layer 513, the light emitted toward the reflective layer 513 (for example the light beam L1 as illustrated in FIG. 5) can be guided to the incident-light side surface 531 more effectively. In this way, the loss of light energy can be reduced, so that the backlight module 500 can have higher efficiency of light energy utilization. The reflective layer 520 disposed underneath the light guide plate 530 can reflect light so that most of the light is transmitted out from the exiting-light surface 532.

As illustrated in FIG. 6, the backlight module 600 includes an application mounting board 610, a plurality of side-emitting LEDs (for example the LED 3A), a reflective layer 620, and a light guide plate 630. The application mounting board 610 includes a horizontal portion 611 including a horizontal surface, and a reflective layer 613 disposed above and covering the horizontal surface of the horizontal portion 611.

The LED 3A is disposed on the horizontal portion 611 of the application mounting board 610, and the set of electrodes 14 of the LED chip 10 is electrically connected with the application mounting board 610. The reflective layer 620 is also disposed above the horizontal portion 611 of the application mounting board 610 and extends away from the LED 3A. The light guide plate 630 is disposed above the reflective layer 620 and includes an incident-light side surface 631 and an exiting-light surface 632 substantially perpendicular to each other. The exiting-light surface 632 is connected to the incident-light side surface 631, and the exiting-light surface 632 is configured to be substantially parallel to but facing away from the reflective layer 620.

As illustrated in FIG. 6, the vertical side surface 231*b* of the LED 3A substantially perpendicular to the second horizontal direction D2 is not covered by the reflective structure 30 and is facing toward the incident-light side surface 631 of the light guide plate 630. On the other hand, the vertical side surface 231*d* is covered by the reflective structure 30 and is facing away from the incident-light side surface 631. In addition, a length of the LED 3A along a normal direction of the upper surface 11 of the LED chip 10 is desirably not greater than a thicknesses of the light guide plate 630 along a normal direction of the exiting-light surface 632.

In this way, under the guidance of the reflective structure 30 and the reflective layer 613, the LED 3A can emit light from the three vertical side surfaces 231*a*, 231*b* and 231*c* and can effectively be transmitted to the incident-light side surface 631 of the light guide plate 630. The reflective layer 620 under the light guide plate 630 can reflect light so that most of the light is transmitted out of the light guide plate 630 from the exiting-light surface 632. Compared with the backlight module 500, the application mounting board 610 of the backlight module 600 includes the horizontal portion 611 and does not include another vertical portion. Therefore, along the direction of its light-emitting surface (D2 direction shown in FIG. 6) of the light bar module (including the application mounting board 610 and the LEDs 3A), a space is included for accommodating the LED 3A without accommodating the application mounting board 610. Thus the light bar module can have a smaller dimension along the D2 direction, which is advantageous for the design and manufacture of an LCD panel with a narrower bezel frame.

Figure 7B:
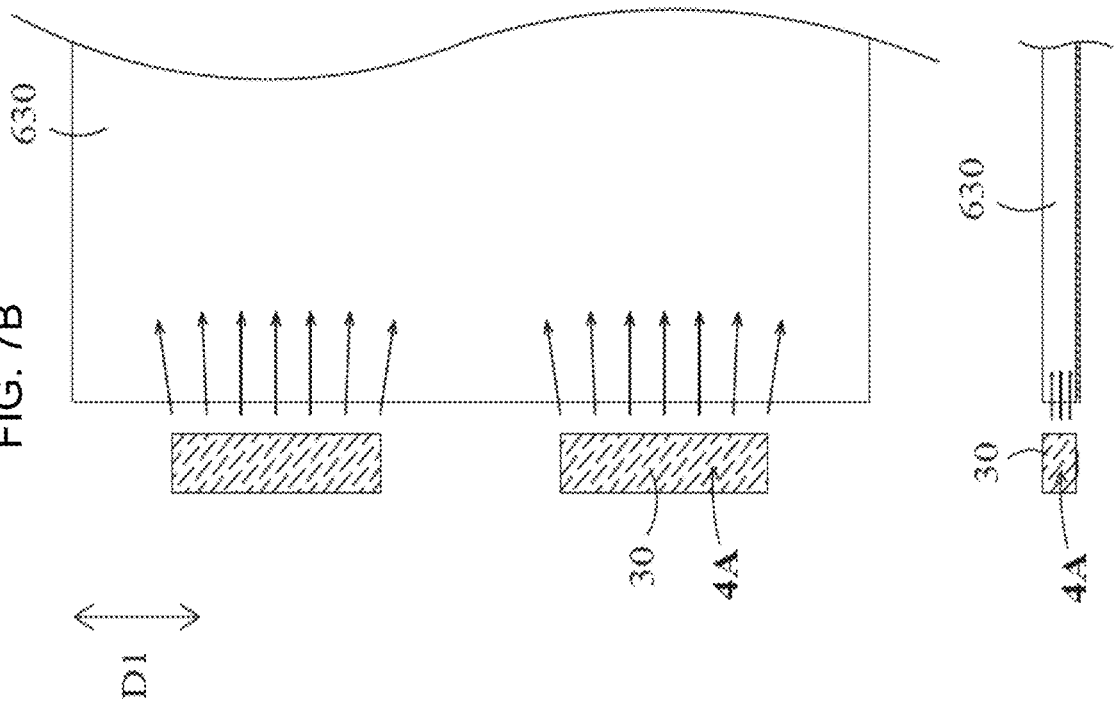
FIG. 7A and FIG. 7B illustrate a top view schematic diagram and a side view schematic diagram of the backlight module shown in FIG. 5 and FIG. 6, respectively.
Figure 7A:
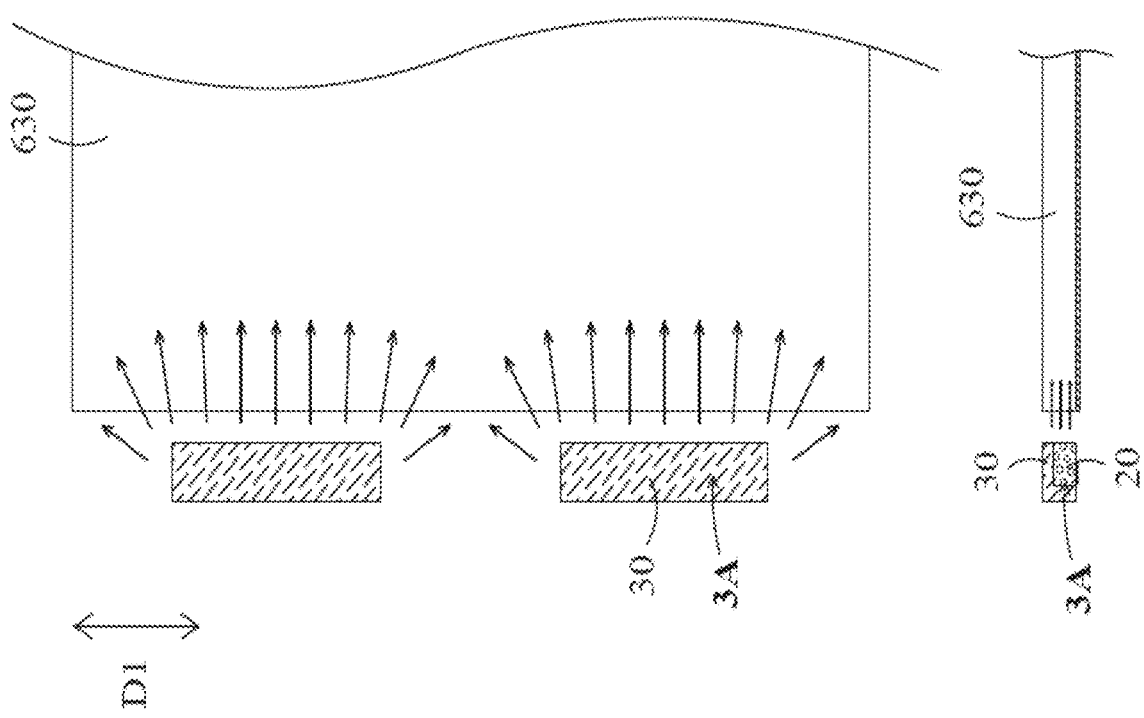

As illustrated in FIGS. 7A and 7B, a side view and a top view of a backlight module 600 are shown, respectively, including a plurality of LEDs 3A and 4A. Since the LED 3A can emit light from the three vertical side surfaces 231*a*, 231*b* and 231*c*, the viewing angle along the first horizontal direction D1 illustrated in FIG. 7A will be greater than the viewing angle of the LED 4A along the first horizontal direction D1 illustrated in FIG. 7B, thereby effectively reducing the dark area of the light guide plate 630 which may be caused in an area between adjacent LEDs 3A. Also, the distance between adjacent LEDs 3A may also be increased to reduce the number of LEDs 3A used in the backlight module 600, thereby reducing the overall module cost. In contrast, the LED 4A may have a technical feature that the radiated light is more concentrated toward the forward direction that is perpendicular to the first horizontal direction D1.

Next, a method for manufacturing an LED according to an embodiment of the present disclosure will be described. The method may include at least two process stages: firstly, providing a photoluminescent structure 20 (it may also be replaced by a light-transmitting structure, which will not be described in detail below) to cover an upper surface 11 and/or an edge surface 13 of an LED chip 10; and secondly, forming a reflective structure 30 to partially cover a side surface 23 of the photoluminescent structure 20 (or light-transmitting structure). Hereinafter, the LEDs 1A to 4B will be sequentially described as an example to further describe the technical details of the manufacturing method, which may be referred to the technical features of the embodiments of the LEDs 1A to 4B.

As illustrated from FIG. 8A to FIG. 12B, schematic diagrams of the process stages of the method to fabricate the LED 1A according to an embodiment of the present disclosure.

As shown in FIG. 8A, a plurality of LED chips 10 are first arranged with a specified pitch on a release material 80 to form an array of LED chips 10. Desirably, the LED chip 10 can be pressed against the release material 80 so that the set of electrodes 14 is embedded in the release material 80 without being exposed. In addition, the release material 80 may be a release film, an ultraviolet (UV) release tape, a thermal release tape, or the like. As shown in FIG. 8B, the photoluminescent structure 20 is disposed on the LED chips 10 and substantially completely covers the upper surface 11 and the edge surface 13 of each LED chip 10.

As illustrated from FIG. 9A to FIG. 9C, a portion of the photoluminescent structure 20 is then cut and removed along the first horizontal direction D1 to form a first trench 90, wherein the first trench 90 is cut along one vertical edge surface of the edge surface 13 of the LED chip 10 (such as the vertical edge surface 131b). After the first trench 90 is formed, the vertical side surface 231b is exposed and will be subsequently covered by a reflective structure 30.

Figure 10A:
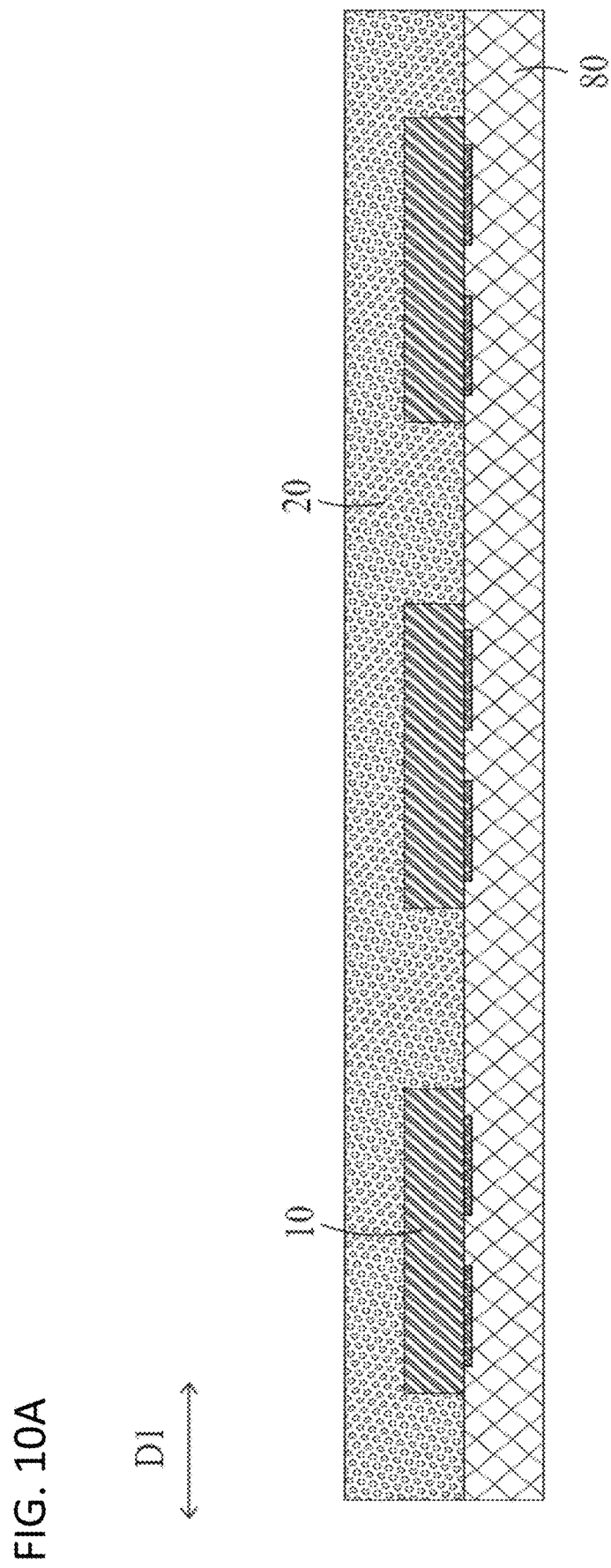
Figure 10B:
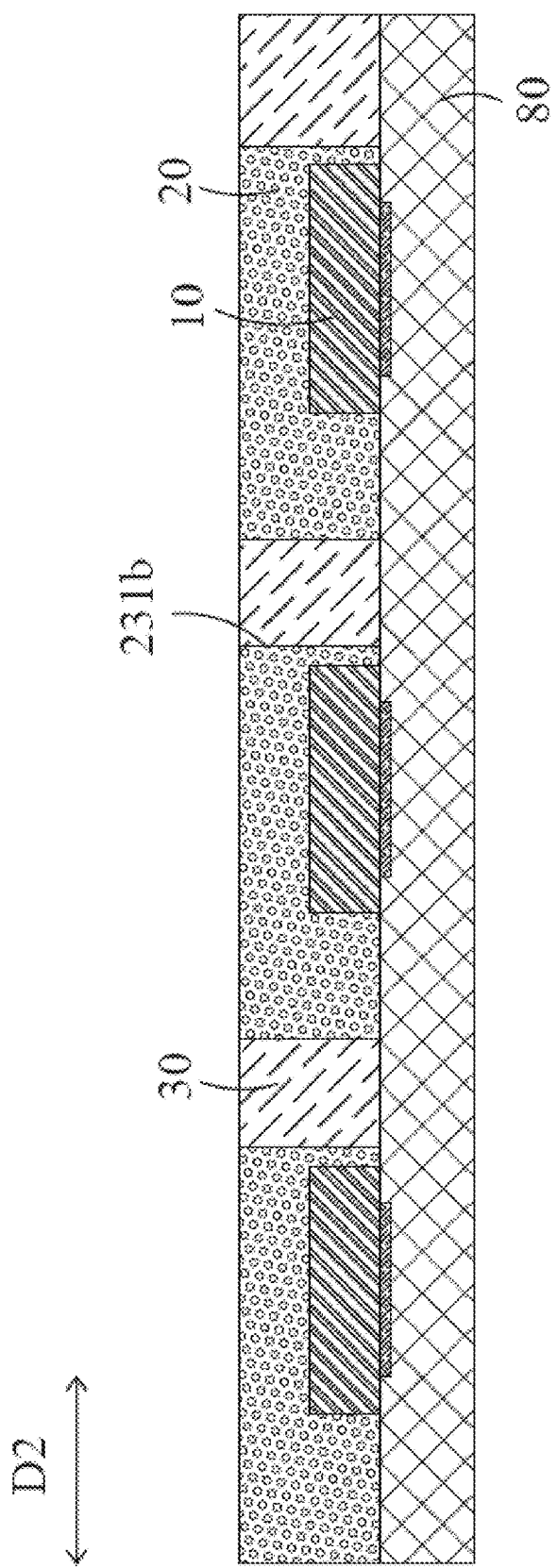

After the cutting is completed, as shown in FIGS. 10A and 10B, the reflective structure 30 is formed inside to fill the gap of the first trench 90 by molding or dispensing, wherein the reflective structure 30 substantially completely covers the vertical side surface 231b of the photoluminescent structure 20, and the top surface 31 of the reflective structure 30 may be substantially flush with the top surface 21 of the photoluminescent structure 20 so that the top surface 21 of the photoluminescent structure 20 is exposed from the reflective structure 30.

If a molding method is used to form the reflective structure 30, the photoluminescent structure 20, the LED chip 10 and the release material 80 are placed in a mold (not shown), and then the manufacturing material of the reflective structure 30 is injected into the mold so that the vertical side surface 231b of the photoluminescent structure 20 is covered. When the manufacturing material is cured and solidified, the reflective structure 30 can be formed. If a dispensing method is used to form the reflective structure 30, the above-mentioned mold may be omitted. Instead, the manufacturing material of the reflective structure 30 is directly dispensed onto the release material 80, and then the manufacturing material is gradually increased on the release material 80 to cover the vertical side surface 231b of the photoluminescent structure 20. In this case, the top surface 31 of the reflective structure 30 may also be designed to be slightly lower than the top surface 21 of the photoluminescent structure 20, so as to prevent the manufacturing material of the reflective structure 30 from spreading to the top surface 21 of the photoluminescent structure 20.

Figure 11B:
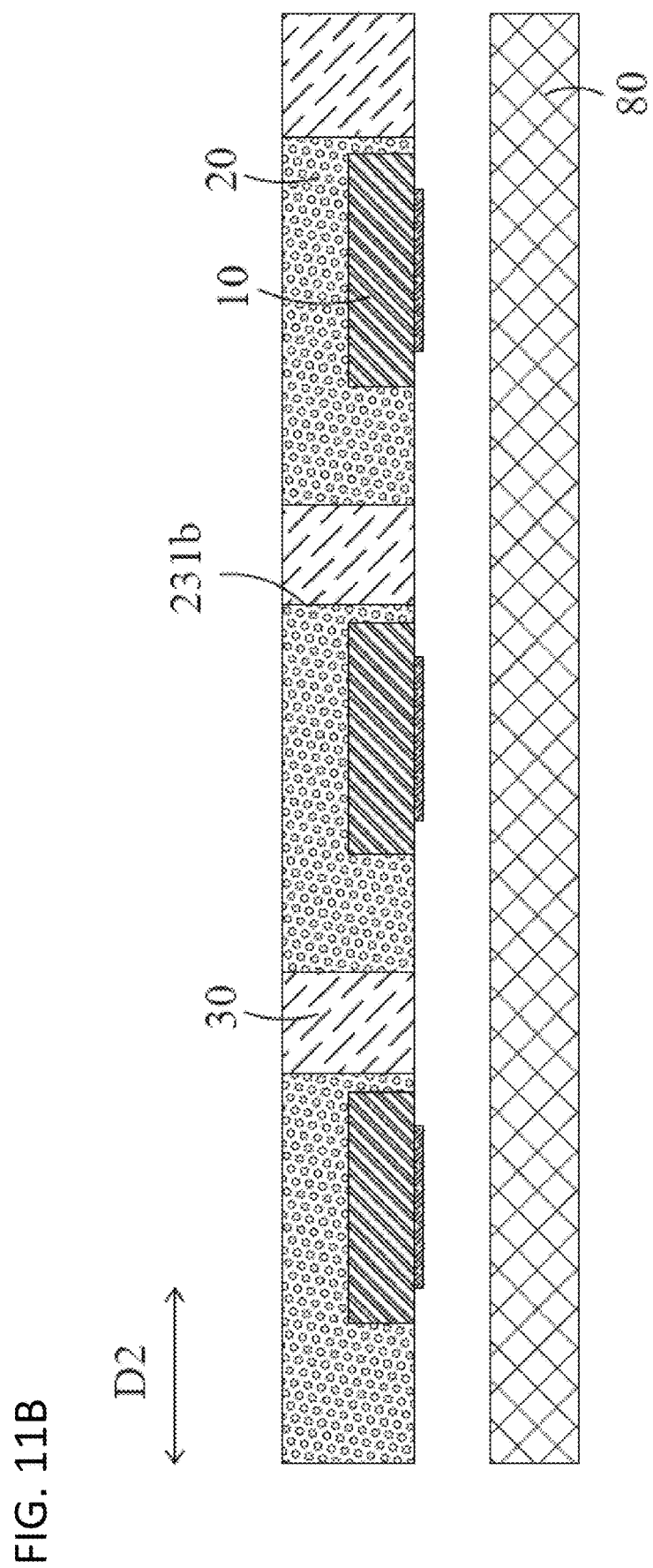
Figure 12A:
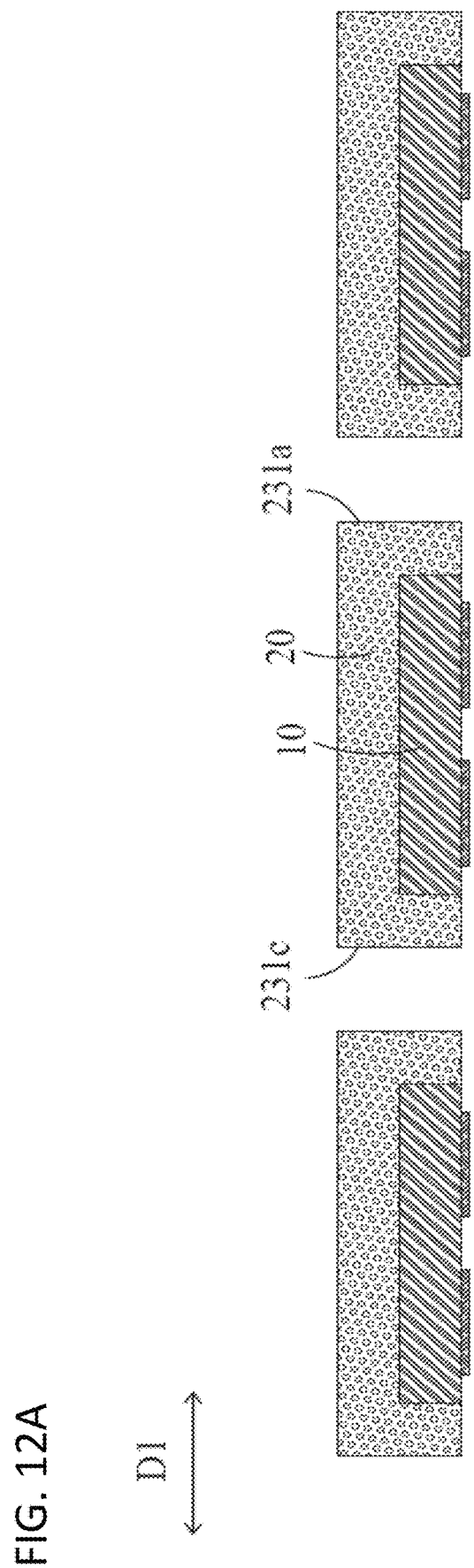

After the reflective structure 30 is formed, as shown in FIGS. 11A and 11B, the release material 80 may be removed to obtain an array of connected LEDs 1A. The reflective structures 30 of the LEDs 1A may be connected, so that a singulation process stage (as shown in FIGS. 12A and 12B) may be taken to cut the connected photoluminescent structures 20 and the reflective structure 30 along the second horizontal direction D2 to form the vertical side surfaces 231a and 231c that are not covered by the reflective structure 30. Similarly, another singulation procedure is performed to cut the connected photoluminescent structures 20 and the reflective structures 30 along the first horizontal direction D1 to form the vertical side surfaces 231d and the vertical side surface 231b, which are shielded by the reflective structure 30. In this way, a plurality of LEDs 1A that are separated from each other can be obtained, wherein the one vertical side surface 231b is shielded by the reflective structure 30.

The above is a description of the method of manufacturing the LED 1A. Next, the method of manufacturing the LED 2A will be described. Since the method of manufacturing the LED 2A is partially the same as or similar to the method of manufacturing the LED 1A, detailed description of similar process stages will be appropriately omitted.

FIGS. 13A to 17B are schematic diagrams of process stages of a manufacturing method to fabricate the LED 2A.

Figure 13A:
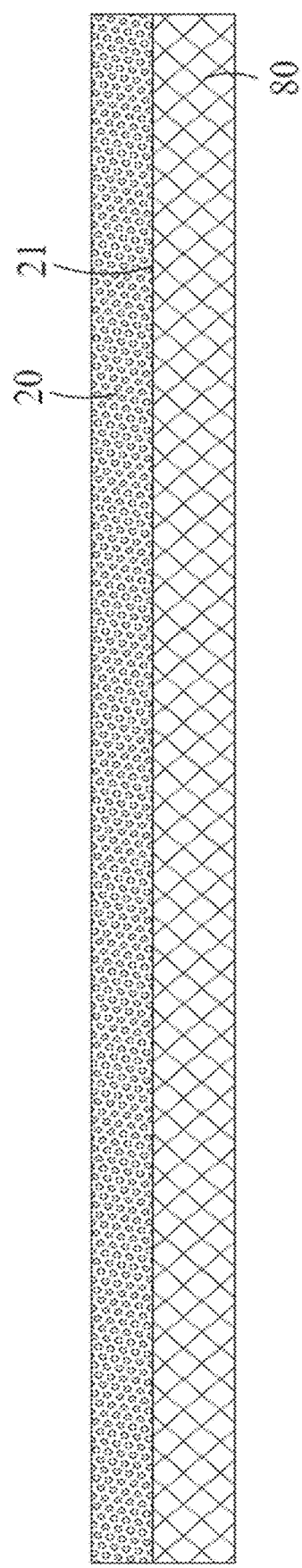

As shown in FIG. 13A, a release material 80 is first provided, and a photoluminescent structure 20 is formed on the release material 80 through a manufacturing process such as spray coating, printing, or molding. Alternatively, the photoluminescent structure 20 is completed first, and then the photoluminescent structure 20 is attached and placed on the release material 80 with the top surface 21 of photoluminescent structure 20 facing toward the release material 80.

Figure 13B:
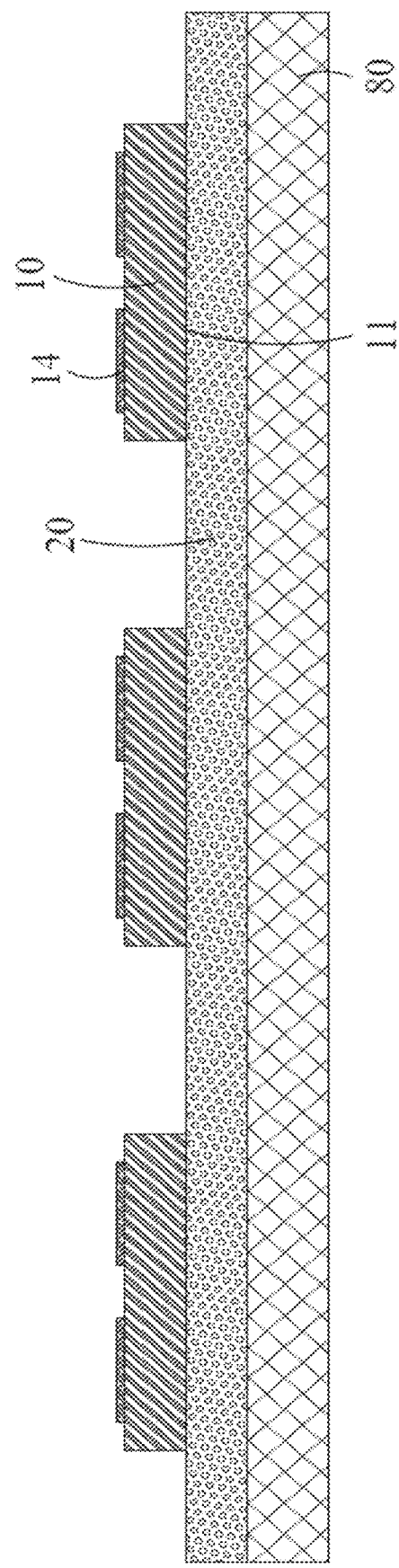

Next, as shown in FIG. 13B, a plurality of LED chips 10 are placed upside down on the photoluminescent structure 20 so that the upper surface 11 of the LED chip 10 faces downwards and is placed on the photoluminescent structure 20. At this time, the set of electrodes 14 of each LED chip 10 faces upwards and is exposed from the release material 80.

Figure 14B:
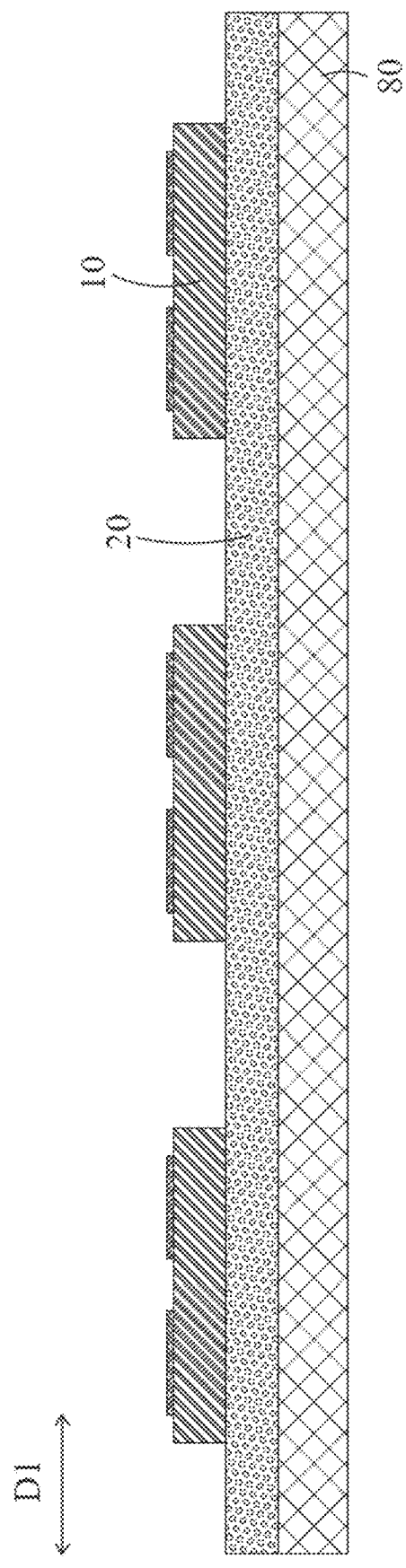
Figure 14C:
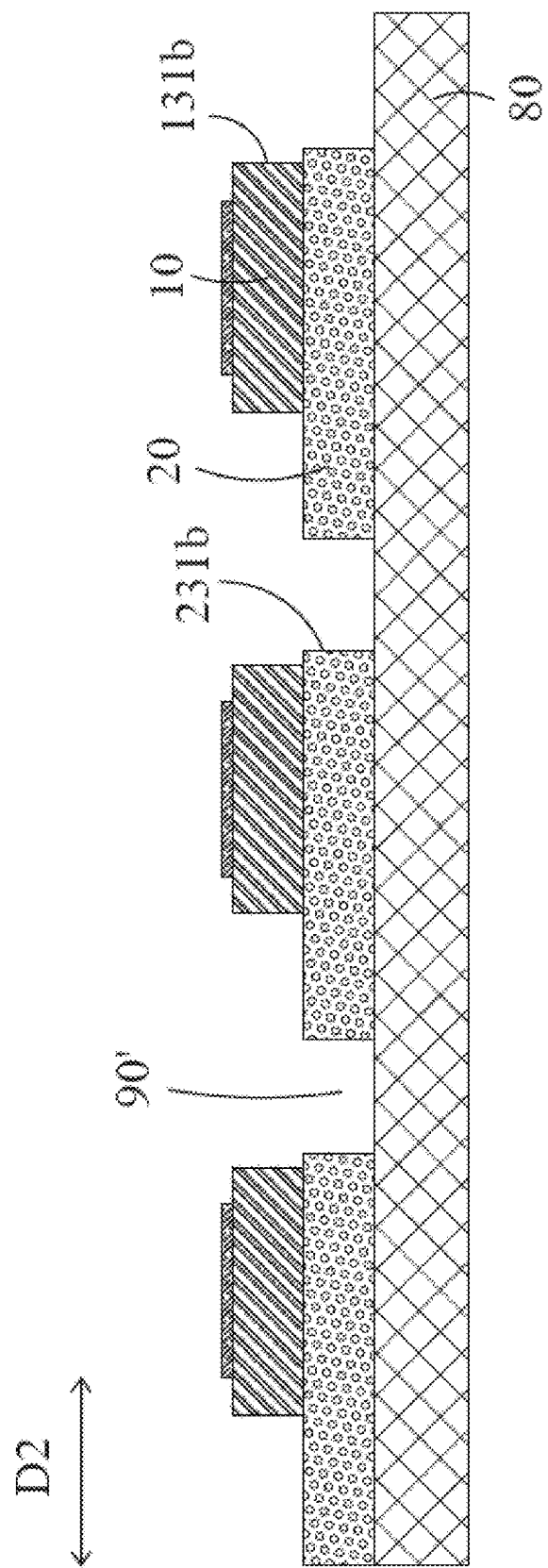

Then, as shown in FIGS. 14A to 14C, the photoluminescent structure 20 is cut along the first horizontal direction D1 so that a portion of the photoluminescent structure 20 is removed to form a first trench 90', which will be formed close to one specific edge portion of the LED chip 10 (for example, the vertical edge surface 131b). After the removal process of the first trench is completed, as shown in FIG. 14B, the photoluminescent structures 20 along the first horizontal direction D1 are still connected. Along the second horizontal direction D2, as shown in FIG. 14C, the photoluminescent structures 20 are separated by the first trenches 90' to expose the vertical side surface 231b, which will be covered by a reflective structure 30.

Figure 15A:
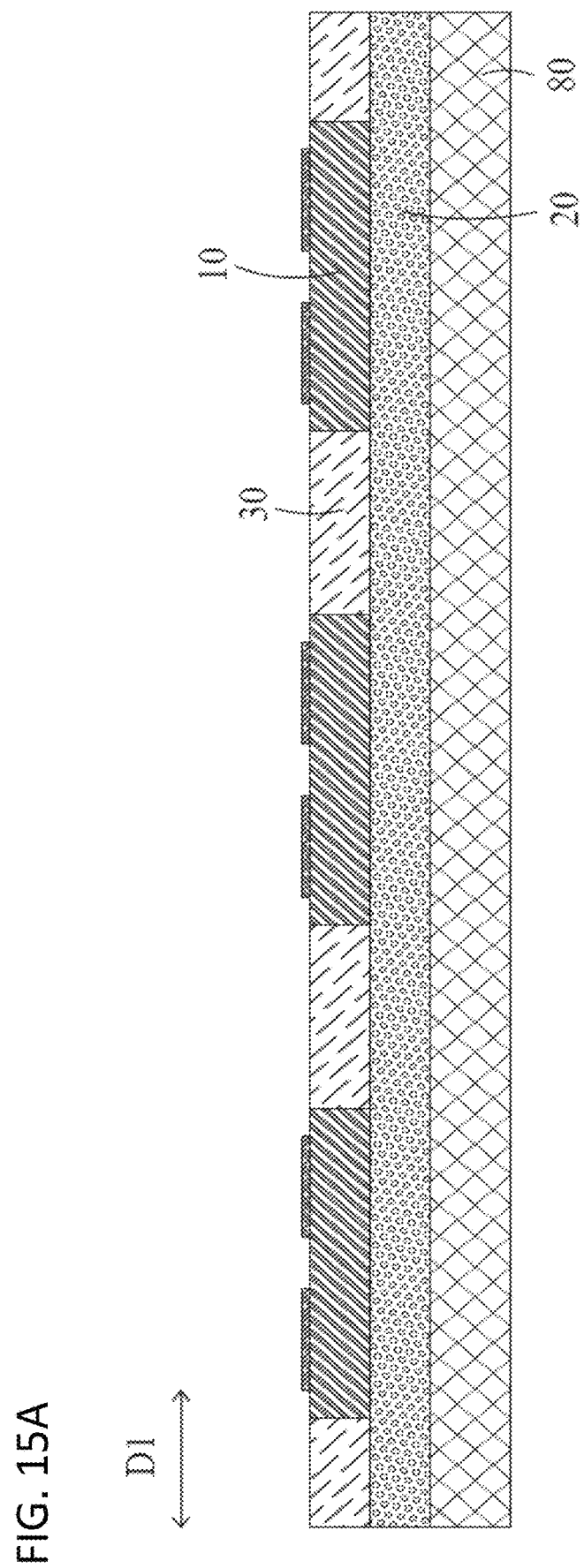
Figure 15B:
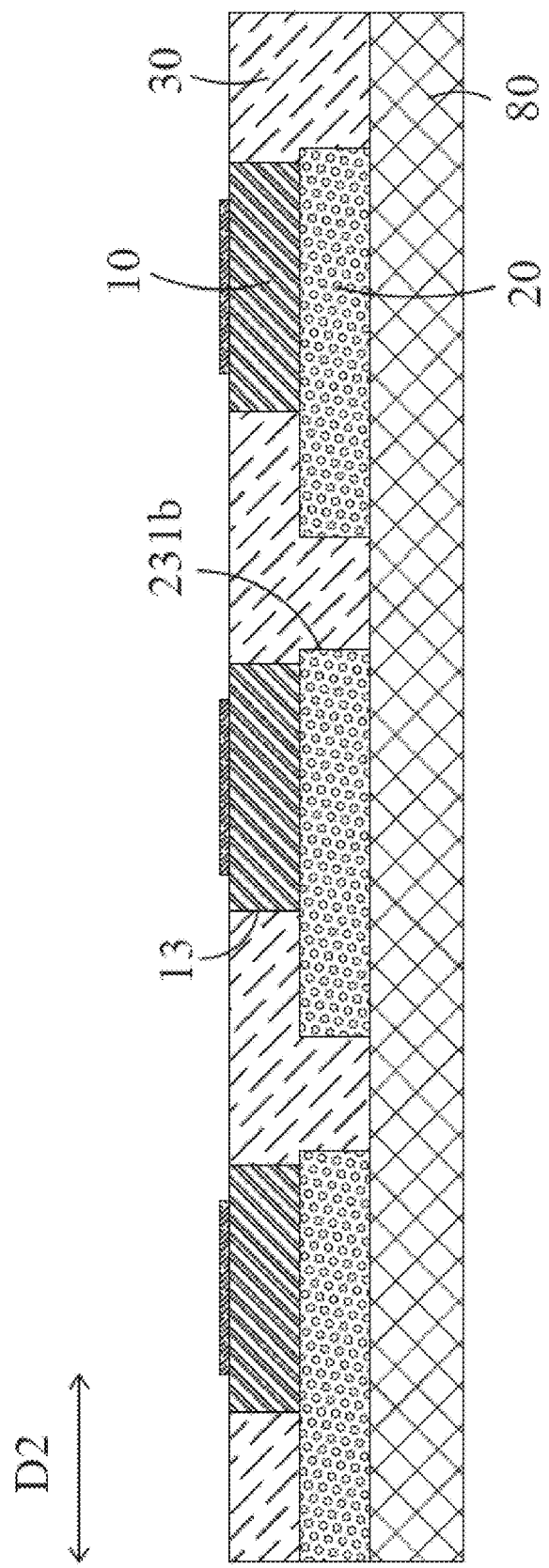

Next, as shown in FIGS. 15A and 15B, the reflective structure 30 is formed between the first trenches 90' to fill the gap of the first trenches 90' and the edge surface 13 of each LED chip 10, and substantially completely covers the edge surface 13 of the LED chip 10 and the vertical side surface 231b of the photoluminescent structure 20.

Figure 16B:
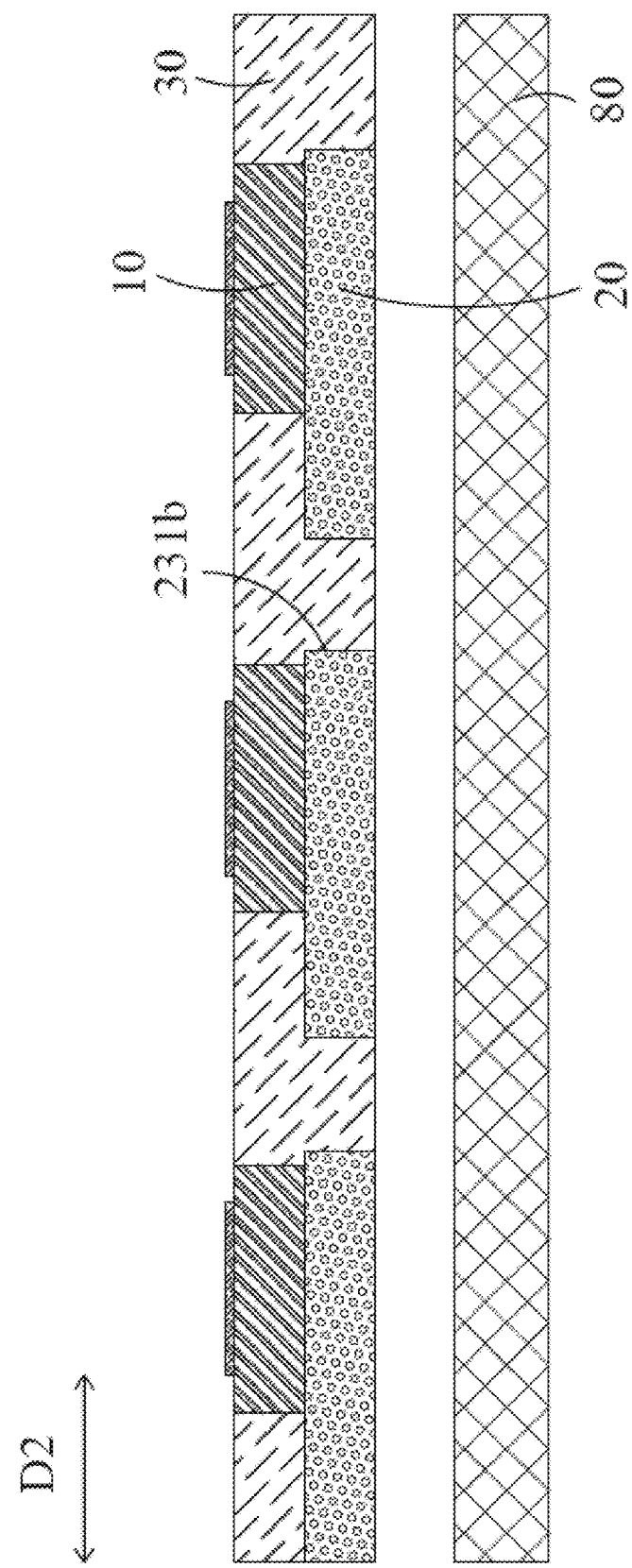
Figure 17A:
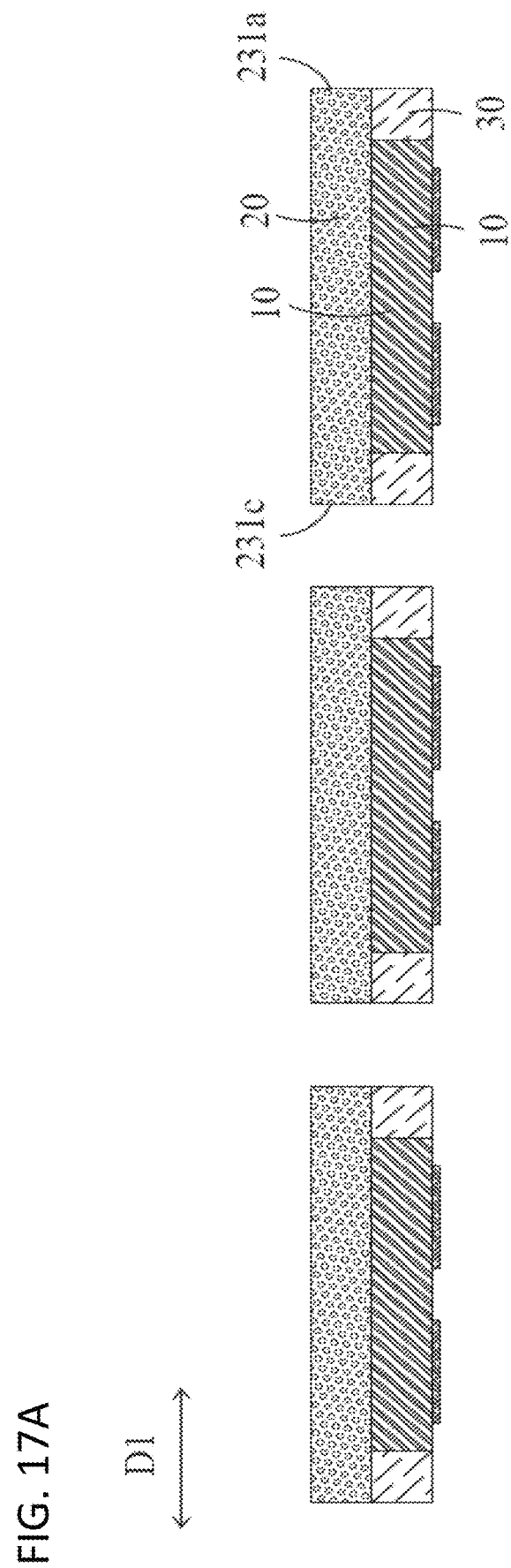
Figure 17B:
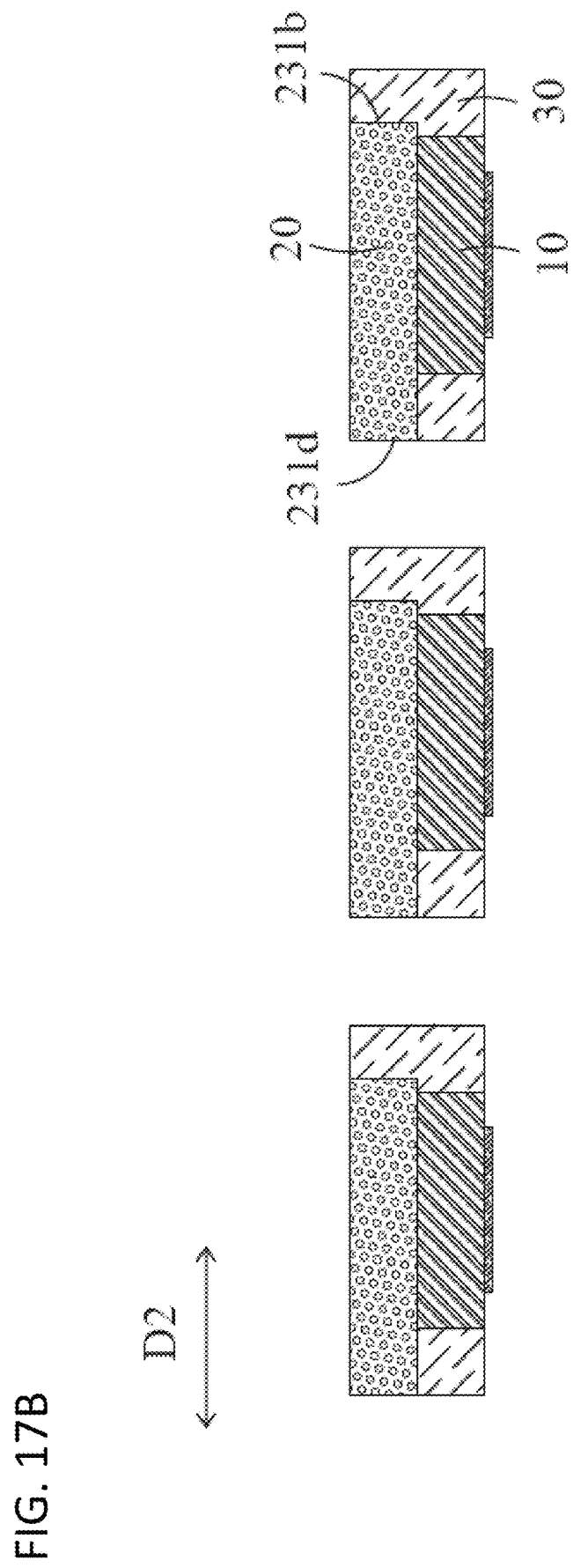

After the reflective structure 30 is formed, the release material 80 is removed (as shown in FIGS. 16A and 16B) to obtain a plurality of LEDs 2A. The photoluminescent structures 20 and the reflective structures 30 of the LEDs 2A may be connected, so a singulation process (as shown in FIGS. 17A and 17B) may be performed to disconnect the connected photoluminescent structures 20 and the reflective structures 30 so that the LEDs 2A separated from each other are obtained. Specifically, as shown in FIG. 17A, the connected photoluminescent structure 20 and the reflective structure 30 are cut along the second horizontal direction D2 to form the vertical side surfaces 231a and 231c that are exposed from the reflective structure 30. Similarly, as shown in FIG. 17B, the connected photoluminescent structures 20 and the reflective structures 30 are cut along the first horizontal direction D1 so that the vertical side surface 231b is still shielded by the reflective structure 30, whereas the vertical side surface 231d is exposed from the reflective structure 30.

The above is a description of the manufacturing method to fabricate the LED 2A. Next, a method of fabricating the LEDs 3A and 3B will be described. Detailed description of the same or similar fabrication stages as those of the manufacturing methods to fabricate the LEDs 1A and 2A will be appropriately omitted.

Figure 18A:
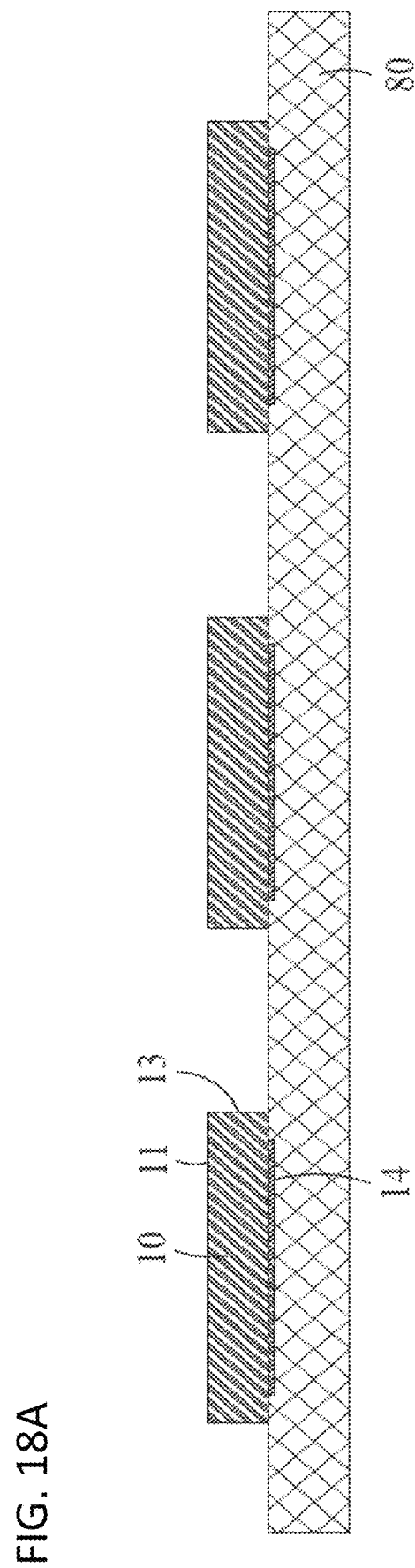
Figure 18B:
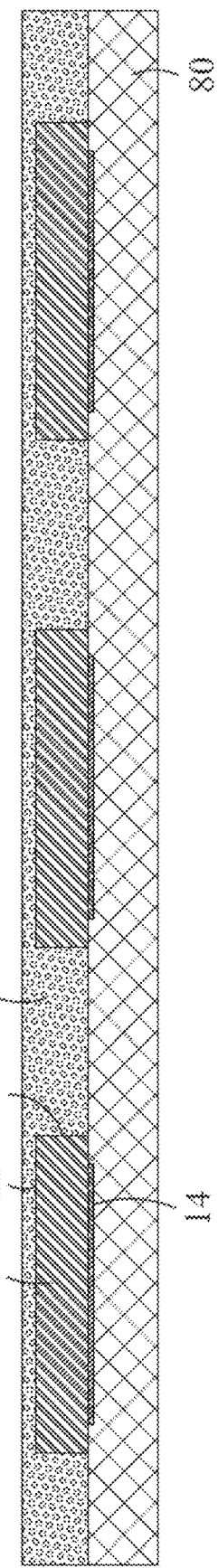
Figure 19A:
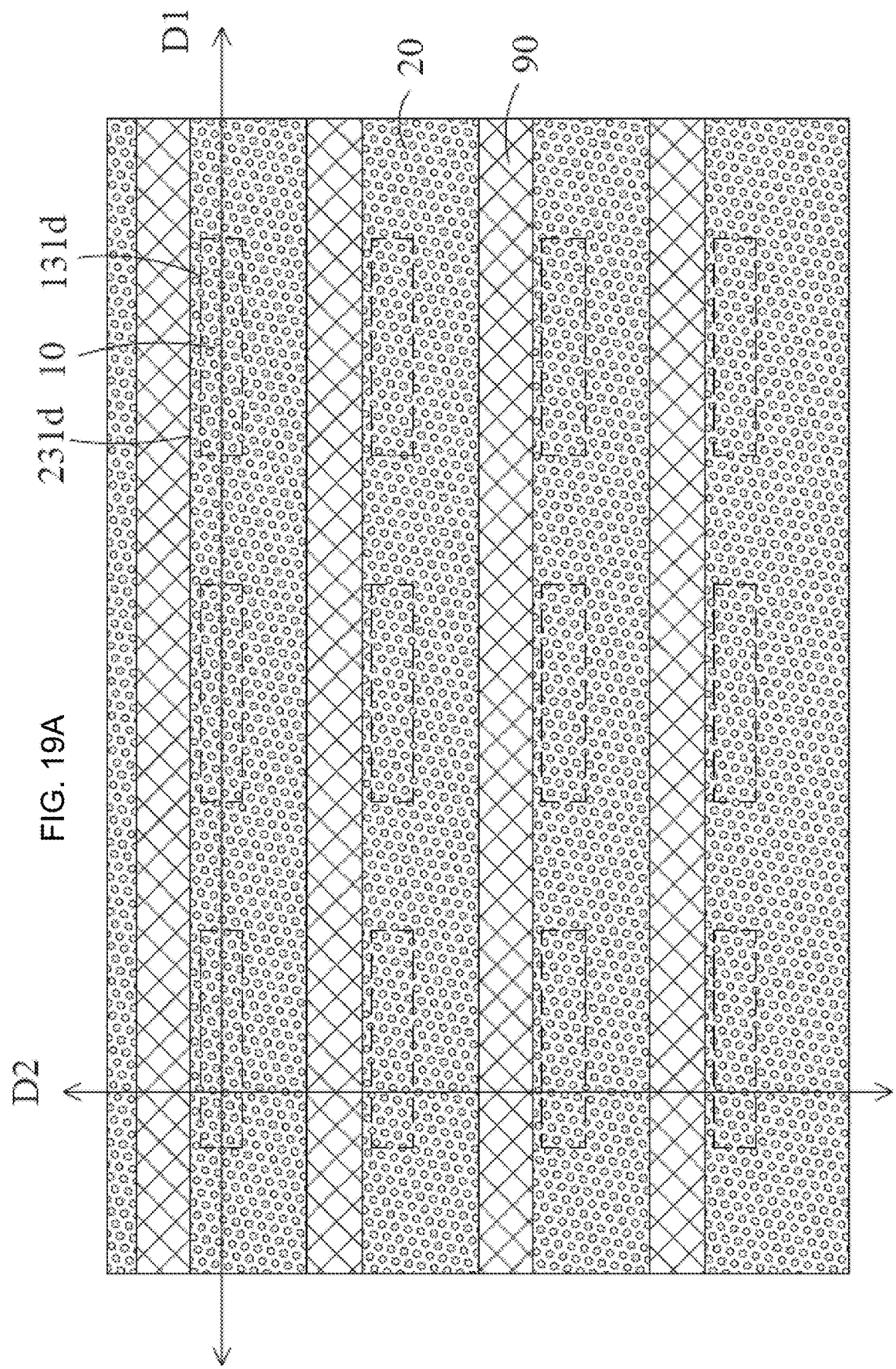

As shown in FIG. 18A, a plurality of LED chips 10 are first arranged with a specified pitch on a release material 80. Desirably, as illustrated in FIG. 19A, the width of the LED chips 10 along the second horizontal direction D2 is smaller than the length of the LED chips 10 along the first horizontal direction D1. Next, as shown in FIG. 18B, photoluminescent structures 20 are formed on the LED chips 10 and substantially completely cover the upper surface 11 and the edge surface 13 of each LED chip 10. However, in this specific embodiment, the thickness of the photoluminescent structure 20 covered on the upper surface 11 of the LED chips 10 may be smaller than that corresponding to the LED 3A.

Figure 19B:
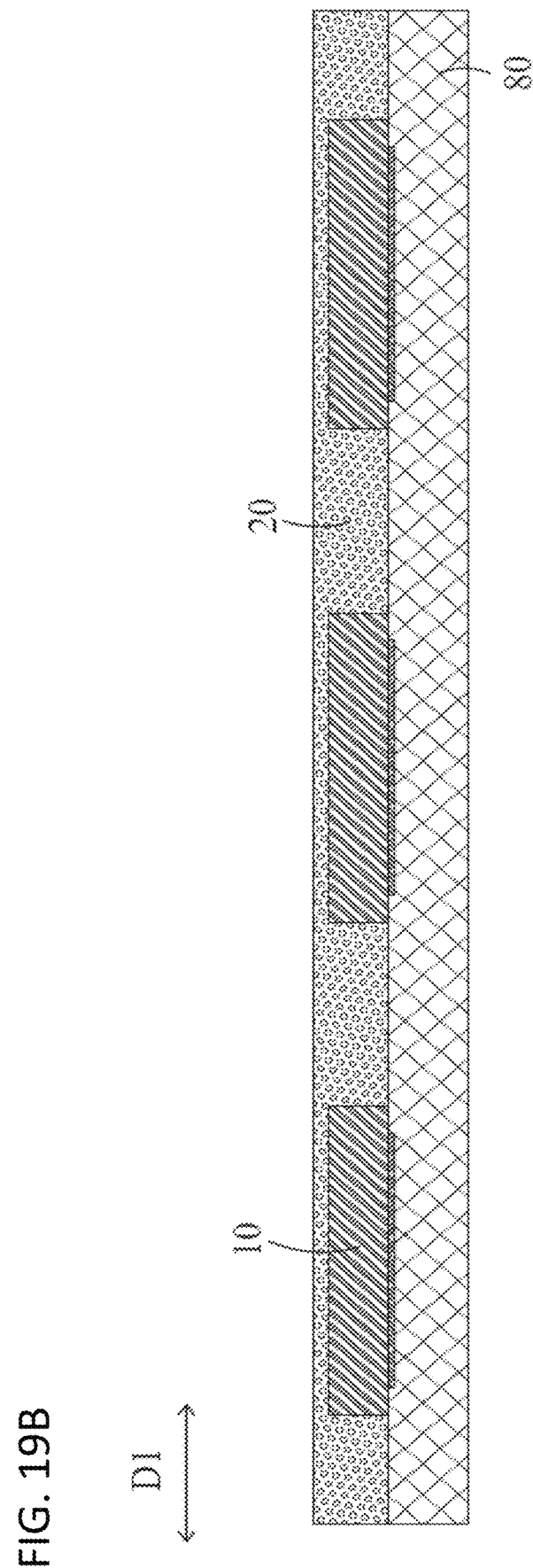
Figure 19C:
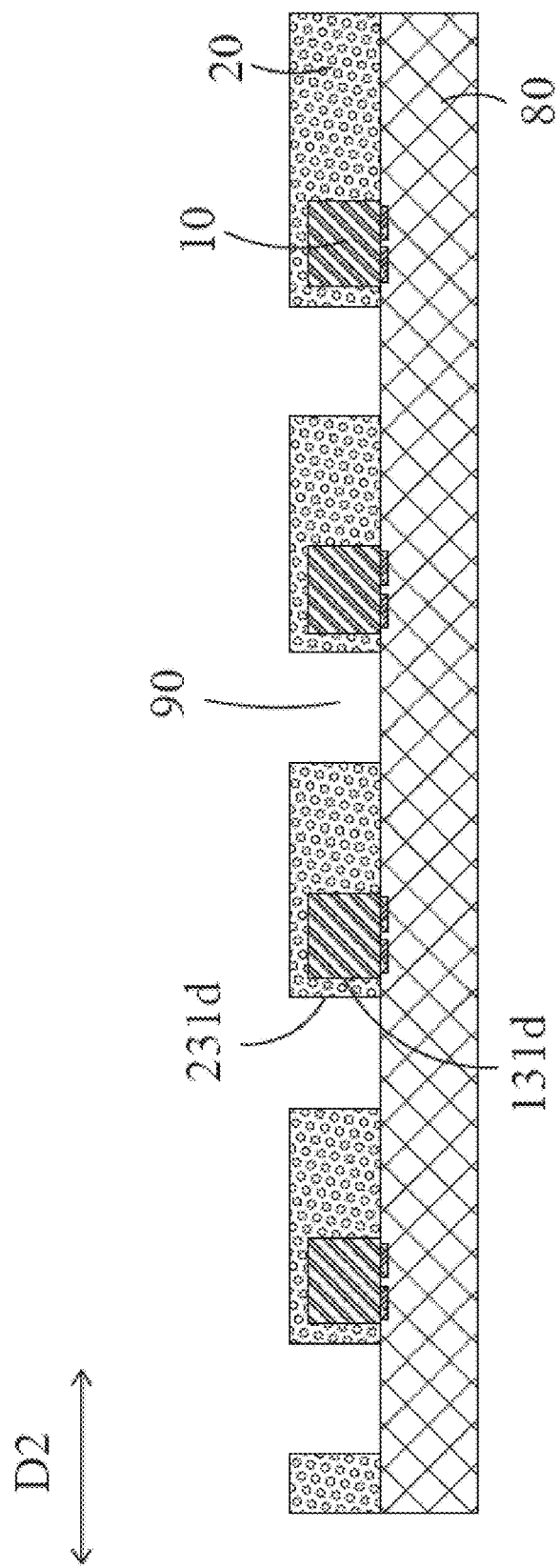

Referring to FIGS. 19A to 19C, the photoluminescent structure 20 is then cut along the first horizontal direction D1 to form a first trench 90. When cutting, the first trench 90 will be formed uniformly toward one specific edge surface (for example, a vertical edge surface 131d as illustrated in FIGS. 19A and 19C) of the chip 10 so as to expose the vertical side surface 231d of the photoluminescent structure 20, which will be covered by a reflective structure 30 in the next fabrication stage.

Figure 20A:
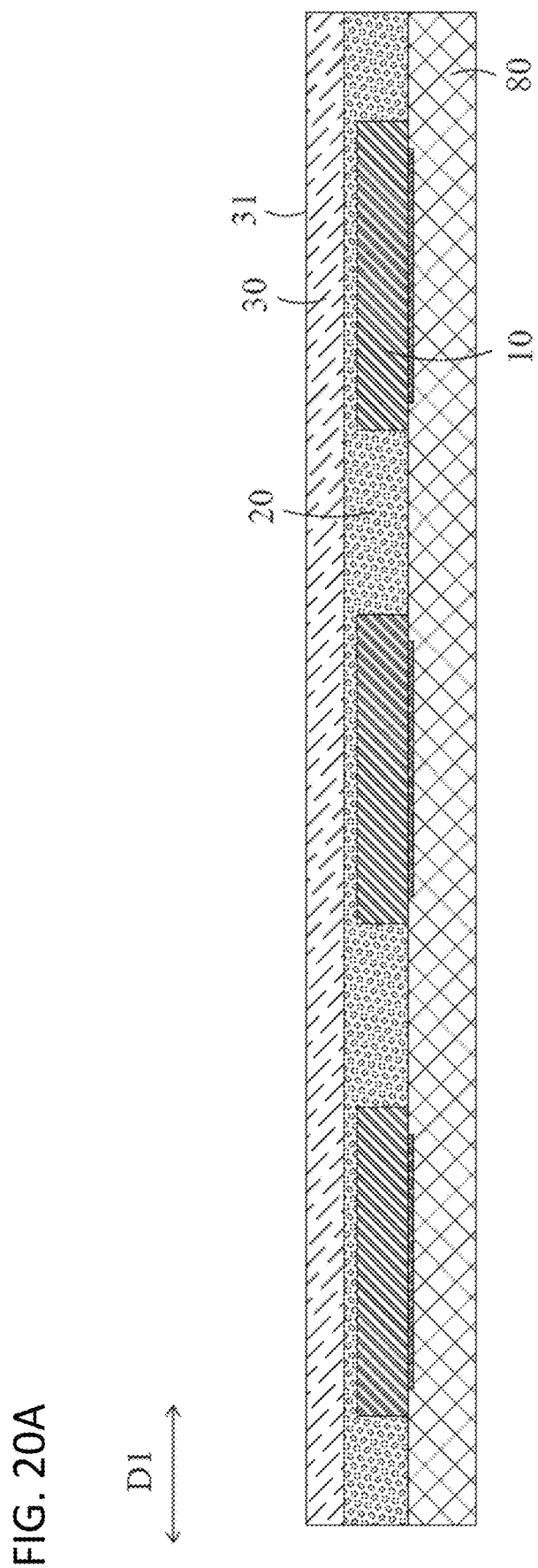
Figure 20B:
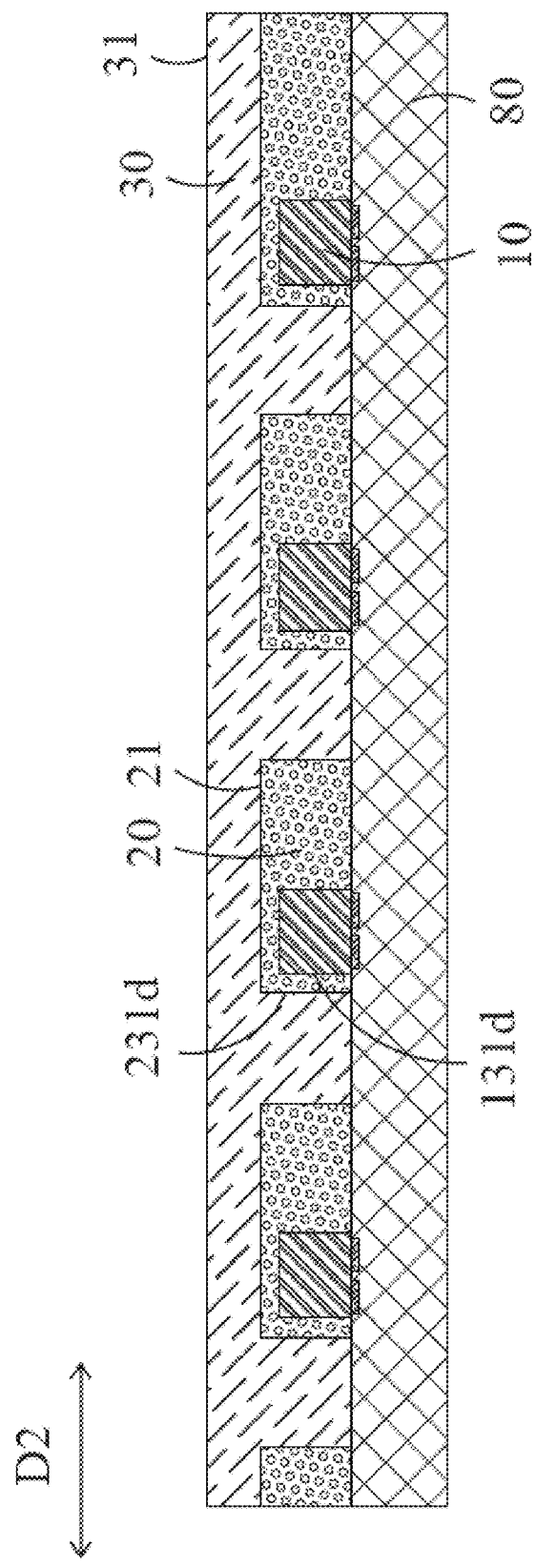

After the trench removal is completed, as shown in FIG. 20A and FIG. 20B, the reflective structure 30 is formed to fill the gap of the first trench 90. In contrast to fabricating the LED 1A, the reflective structure 30 substantially completely covers the vertical side surface 231d as well as the top surface 21 of the photoluminescent structure 20.

Figure 21A:
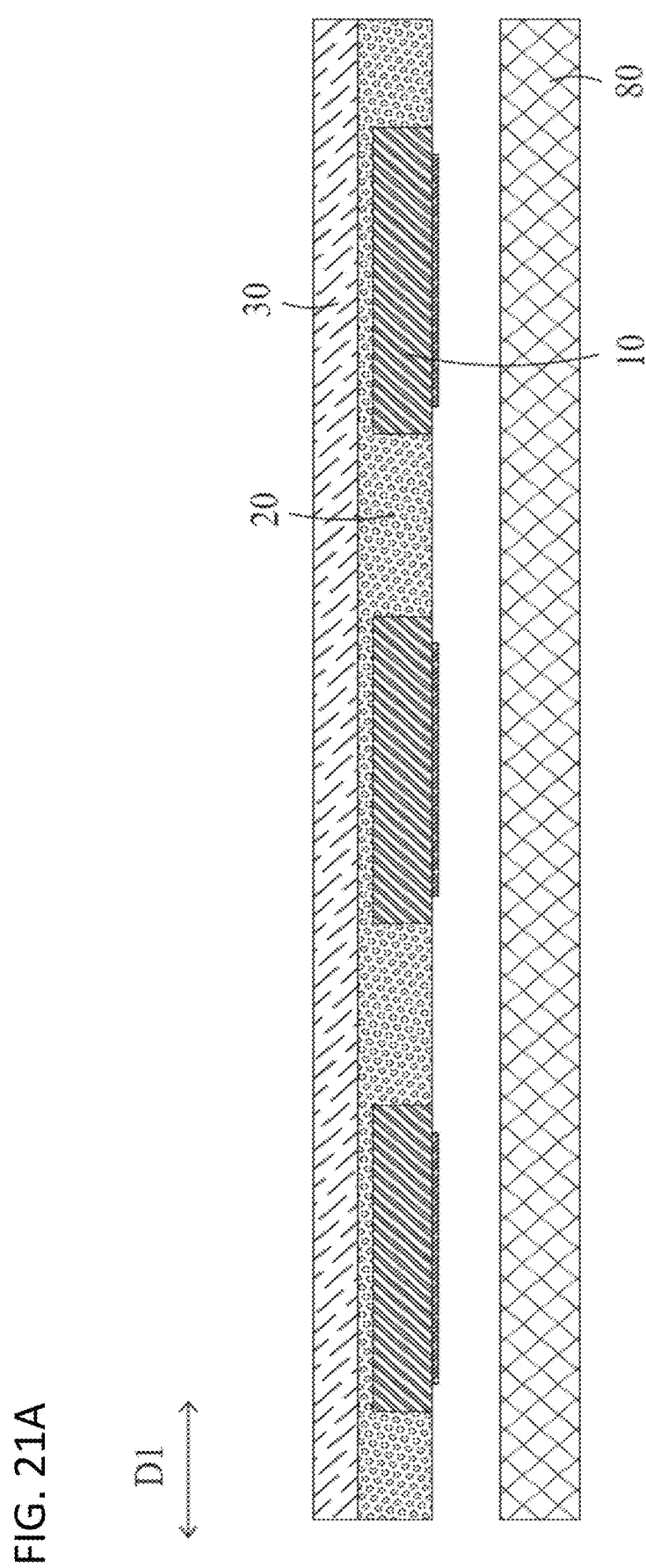
Figure 22B:
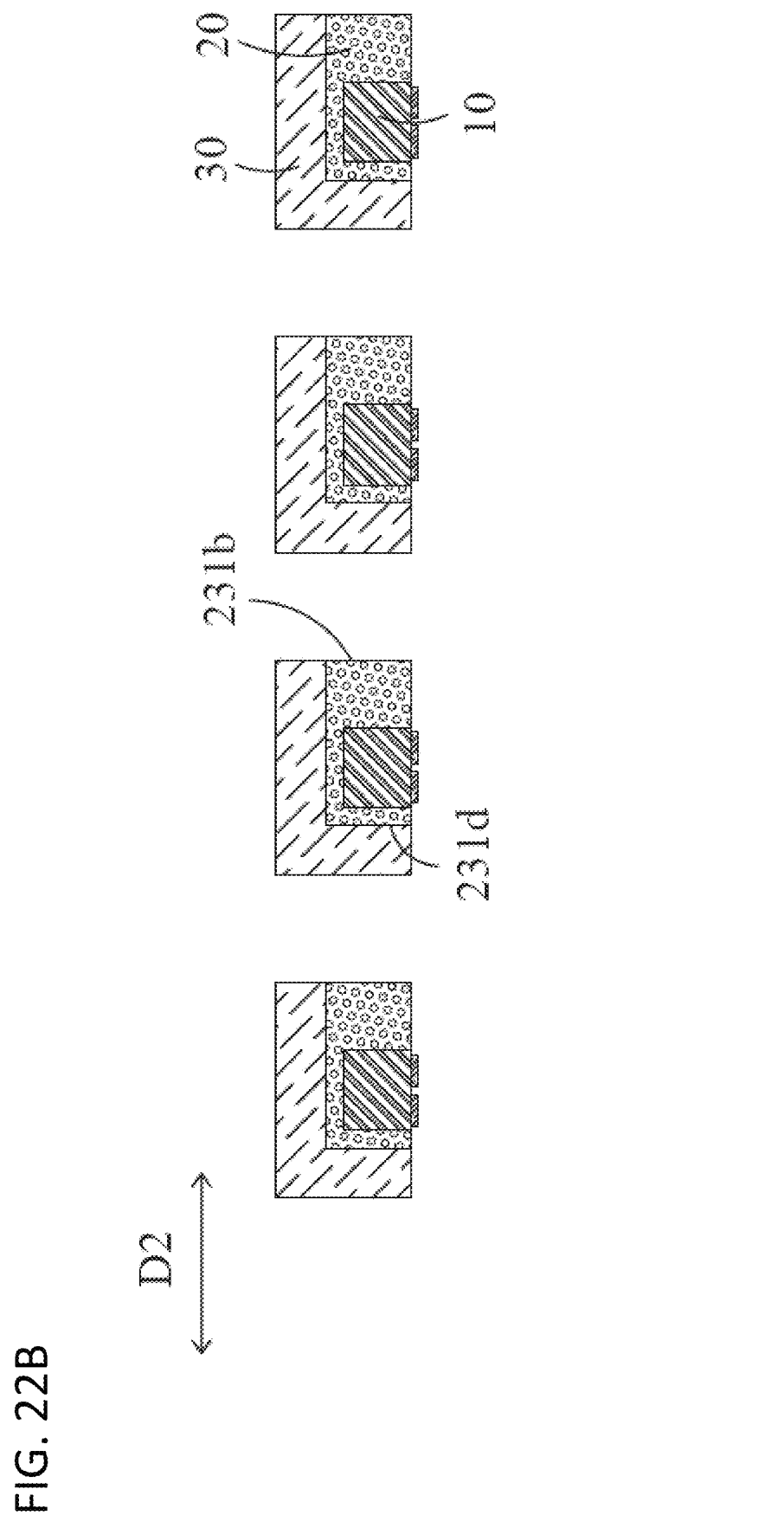

After the reflective structure 30 is formed, as shown in FIGS. 21A and 21B, the release material 80 can be removed to obtain a plurality of LEDs 3A. Then, as shown in FIGS. 22A and 22B, a singulation process can be performed to separate the connected photoluminescent structures 20 and the reflective structures 30 along the second horizontal direction D2 to expose the vertical side surfaces 231a and 231c, which are not covered by the reflective structure 30. Then another dicing process can be performed to separate the connected photoluminescent structures 20 and the reflective structures 30 along the first horizontal direction D1 to form the vertical side surface 231b. The vertical side surface 231d is still shielded by the reflective structure 30. In this way, a plurality of mutually separated LEDs 3A can be obtained.

The above manufacturing method may be performed to fabricate the LED 3B after slight modification. That is, referring to FIG. 18B in the fabrication stage to form the photoluminescent structure 20, the photoluminescent structure 20 is formed selectively between the edge surfaces 13 of the LED chips 10, but does not cover the upper surface 11 of the LED chip 10. Alternatively, the photoluminescent structure 20 may be formed to cover the upper surface 11 of the LED chip 10, and then the portion covering the upper surface 11 may be removed.

The above is a description of the method of fabricating the LEDs 3A and 3B. Next, a method of fabricating the LEDs 4A and 4B will be described. Detailed description of the same or similar fabrication processes as those of the LEDs 3A and 3B will be appropriately omitted.

As shown in FIG. 18A, first, a plurality of LED chips 10 are arranged with a specified pitch on a release material 80, and then, as shown in FIG. 18B, the photoluminescent structures 20 are disposed on the LED chips 10. Thereafter, as shown in FIGS. 19A to 19C, the photoluminescent structure 20 is cut along the first horizontal direction D1 to form a first trench 90 to expose the vertical side surface 231d, which will be covered by a reflective structure 30.

Figure 23A:
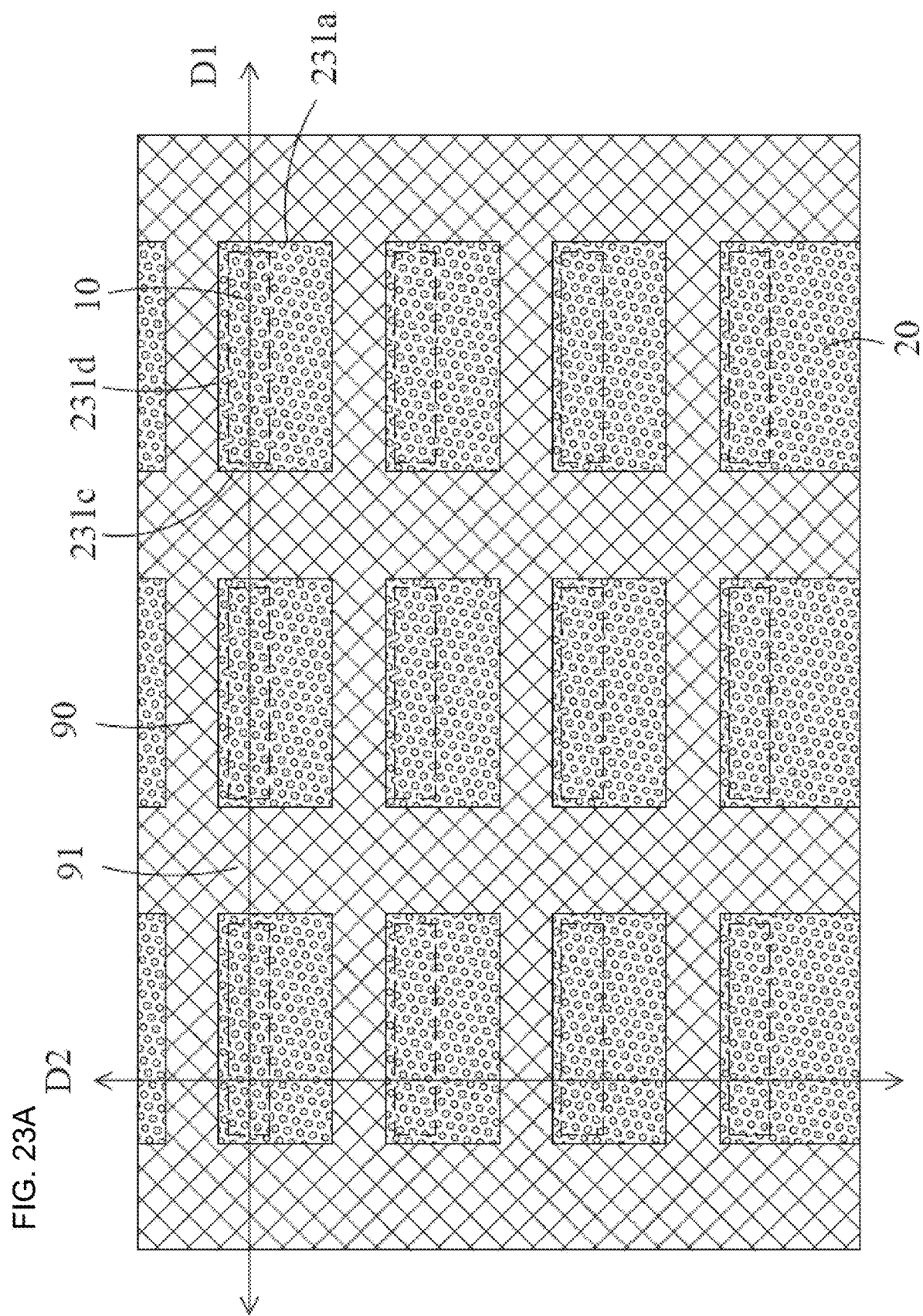
Figure 23C:
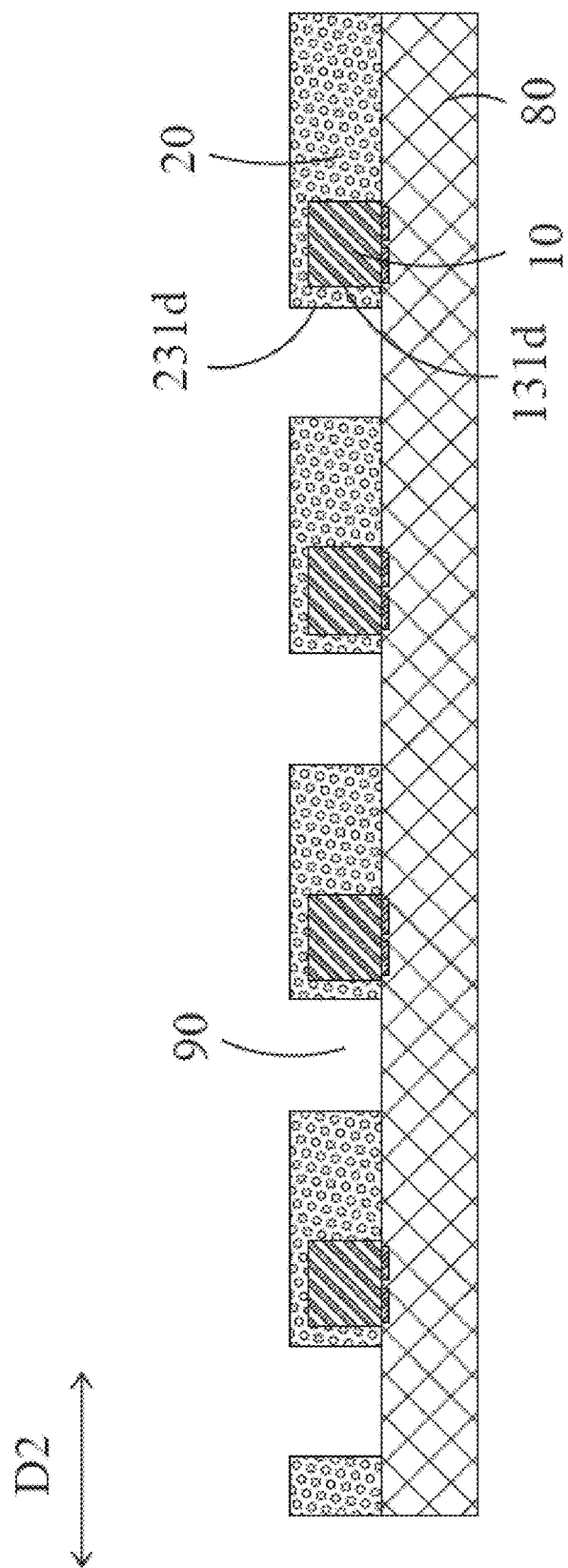

As illustrated from FIG. 23A to FIG. 23C, the fabrication process is different from the method to fabricate the LED 3A. After the first trench 90 is formed, another cutting process stage will be performed. That is, the photoluminescent structure 20 is cut along the second horizontal direction D2 to form a second trench 91, and to expose the two vertical side surfaces 231a and 231c disposed opposite to each other substantially perpendicular to the first horizontal direction D1.

After the two trench removal processes are completed, reflective structures 30 (not shown) are formed inside the first and second trenches 90 and 91 to cover the vertical side surfaces 231a, 231c, and 231d of the photoluminescent structure 20, and to fill the gap of the first and second trenches 90 and 91. Furthermore, the reflective structure 30 substantially completely covers the top surface 21 of the photoluminescent structure 20. After the reflective structure 30 is formed, the release material 80 can be removed to obtain a plurality of LEDs 4A or 4B. Then, a singulation process can be performed to obtain the plurality of LEDs 4A or 4B separated from each other.

In summary, the method for manufacturing an LED according to embodiments of the present disclosure can produce various LEDs that can effectively control the radiation pattern and the viewing angle along at least one specific horizontal direction, or form a CSP LED with a side-view light-emitting structure. Such LEDs can be manufactured in a batch manner.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light-emitting device comprising:
  a light-emitting chip comprising an upper surface, a lower surface opposite to the upper surface, an edge surface and a set of electrodes, wherein the edge surface extends between the upper surface and the lower surface, the set of electrodes is disposed on the lower surface, and the set of electrodes and the lower surface form a lower electrode surface;

an optical structure comprising a top surface, a bottom surface opposite to the top surface, and a side surface, wherein the side surface extends between the top surface and the bottom surface, and the optical structure covers the upper surface of the light-emitting chip, the edge surface of the light-emitting chip, or both, wherein the optical structure is a photoluminescent structure or a light-transmitting structure; and a reflective structure partially covering the side surface of the optical structure;

wherein:

a first horizontal direction and a second horizontal direction perpendicular to each other are specified along a length direction and a width direction on the upper surface of the light-emitting chip, respectively; and the side surface of the optical structure comprises four vertical side surfaces; wherein:
two vertical side surfaces of the four vertical side surfaces are oppositely disposed substantially perpendicular to the first horizontal direction; and
another two vertical side surfaces of the four vertical side surfaces are oppositely disposed substantially perpendicular to the second horizontal direction;
wherein:
the two vertical side surfaces substantially perpendicular to the first horizontal direction are not covered by the reflective structure to form two side light-emitting surfaces;
one of the vertical side surfaces substantially perpendicular to the second horizontal direction is covered by the reflective structure to form a side reflective surface;
another of the vertical side surfaces substantially perpendicular to the second horizontal direction is not covered by the reflective structure to form a side light-emitting surface; and
the side light-emitting surfaces of the light-emitting device and the lower electrode surface of the light-emitting chip are substantially perpendicular to each other;
wherein a distance between the side reflective surface and the edge surface of the light-emitting chip along the second horizontal direction is smaller than a distance between the side light-emitting surface and the edge surface of the light-emitting chip along the second horizontal direction.

2. The light-emitting device of claim 1, wherein:
the upper surface and the edge surface of the light-emitting chip are both covered by the optical structure;
the top surface of the optical structure is not covered by the reflective structure to form a top light-emitting surface; and
the top light-emitting surface of the light-emitting device and the lower electrode surface of the light-emitting chip are substantially parallel to each other.

3. The light-emitting device of claim 1, wherein:
the upper surface and the edge surface of the light-emitting chip are both covered by the optical structure; and
the top surface of the optical structure is covered by the reflective structure to form an upper reflective surface.

4. The light-emitting device of claim 1, wherein:
the edge surface of the light-emitting chip is covered by the optical structure; and
the upper surface of the light-emitting chip and the top surface of the optical structure are both covered by the reflective structure to form an upper reflective surface.

5. The light-emitting device of any one of claims 2 to 4, wherein the optical structure further comprises a microstructured lens layer.

6. The light-emitting device of any one of claims 2 to 4, further comprising a submount substrate, wherein the light-emitting device is electrically connected with the submount substrate.

7. The light-emitting device of any one of claims 2 to 4, wherein the optical structure further comprises at least one light-transmitting layer.

8. The light-emitting device of any one of claims 2 to 4, wherein the reflective structure comprises a light-transmitting resin material, and optical scattering particles dispersed in the light-transmitting resin material.

9. The light-emitting device of claim 8, wherein:
the light-transmitting resin material comprises polyphthalamide, polycyclohexylene-dimethylene terephthalate, epoxy molding compound, or silicone; and
the optical scattering particles comprise titanium dioxide, boron nitride, silicon dioxide, or aluminum oxide.

10. A backlight module comprising:
an application mounting board comprising a horizontal surface;
the light-emitting device of claim 1 disposed on the application mounting board;
a reflective layer disposed above the horizontal surface of the application mounting board; and
a light guide plate disposed above the reflective layer; wherein the light guide plate comprises an incident-light side surface and an exiting-light surface connected to the incident-light side surface and facing away from the reflective layer.

11. The backlight module of claim 10, wherein:
the application mounting board further comprises a vertical surface;
the light-emitting device is disposed on the vertical surface of the application mounting board;
the side light-emitting surface of the light-emitting device faces the horizontal surface of the application mounting board;
a top light-emitting surface of the light-emitting device faces toward the incident-light side surface of the light guide plate.

12. The backlight module of claim 11, wherein:
a length of the top light-emitting surface of the light-emitting device is specified along the second horizontal direction;
a thickness of the light guide plate is specified along a normal direction of the exiting-light surface; and
the length of the top light-emitting surface is not greater than the thickness of the light guide plate.

13. The backlight module of claim 11, wherein the application mounting board further comprises a reflective layer that covers the vertical surface, the horizontal surface, or both.

14. The backlight module of claim 11, wherein the application mounting board is a flexible application mounting board.

15. The backlight module of claim 10, wherein:
the light-emitting device is disposed on the horizontal surface of the application mounting board; and
the side light-emitting surface of the light-emitting device faces toward the incident-light side surface of the light guide plate.

16. The backlight module of claim 15, wherein:
- a length of the side light-emitting surface of the light-emitting device is specified along a normal direction of the upper surface of the light-emitting chip;
- a thickness of the light guide plate is specified along a normal direction of the exiting-light surface; and
- the length of the side light-emitting surface is not greater than the thickness of the light guide plate.

17. The backlight module of claim 15, wherein the application mounting board further comprises a reflective layer covering the horizontal surface.

18. A method of manufacturing a light-emitting device, comprising:
- disposing an optical structure to cover an upper surface of a light-emitting chip, an edge surface of the light-emitting chip, or both; and
- forming a reflective structure to partially cover a side surface of the optical structure;

wherein:
- a first horizontal direction and a second horizontal direction are specified along a length direction and a width direction on the upper surface of the light-emitting chip, respectively; and
- the side surface of the optical structure comprises four vertical side surfaces;

wherein:
- two vertical side surfaces of the four vertical side surfaces are oppositely disposed substantially perpendicular to the first horizontal direction; and
- another two vertical side surfaces of the four vertical side surfaces are oppositely disposed substantially perpendicular to the second horizontal direction;

wherein:
- the two vertical side surfaces substantially perpendicular to the first horizontal direction are not covered by the reflective structure to form two side light-emitting surfaces;
- one of the vertical side surfaces substantially perpendicular to the second horizontal direction is covered by the reflective structure to form a side reflective surface; and
- another of the vertical side surfaces substantially perpendicular to the second horizontal direction is not covered by the reflective structure to form a side light-emitting surface;

wherein a distance between the side reflective surface and the edge surface of a light-emitting chip along the second horizontal direction is smaller than a distance between the side light-emitting surface and the edge surface of a light-emitting chip along the second horizontal direction.

19. The method of claim 18, wherein, in disposing the optical structure, the method further comprises:
- forming the optical structure on the upper surface and the edge surface of the light-emitting chip; and
- cutting the optical structure along the first horizontal direction to form a first trench and exposing the side surface of the optical structure to be covered by the reflective structure; wherein, in forming the reflective structure, the reflective structure is formed to fill the first trench.

20. The method of claim 19, wherein, in forming the reflective structure, the reflective structure further covers a top surface of the optical structure.

21. The method of claim 18, wherein, in disposing the optical structure, the method further comprises:
- forming the optical structure to cover the edge surface of the light-emitting chip; and
- cutting the optical structure along the first horizontal direction to form a first trench, and exposing the side surface to be covered by the reflective structure;
- wherein, in forming the reflective structure, the reflective structure is formed to fill the first trench, and furthermore to cover a top surface of the optical structure and the upper surface of the light-emitting chip.

22. The method of claim 18, further comprising:
- cutting the optical structure along the first horizontal direction and then followed by cutting the optical structure along the second horizontal direction.

23. The method of claim 18, further comprising cutting the optical structure, and cutting the reflective structure, where cutting the reflective structure is concurrent with cutting the optical structure.

* * * * *